US012703713B2

(12) United States Patent
Hioki

(10) Patent No.: US 12,703,713 B2
(45) **Date of Patent: *Aug. 11, 2026**

(54) TIN COMPOUND AND RESIST SOLUTION USING THE SAME, PATTERN FORMING METHOD, THIN FILM, PATTERNED THIN FILM, AND METHOD FOR PRODUCING TIN COMPOUND

(71) Applicants: Mitsubishi Chemical Corporation, Tokyo (JP); Gelest, Inc., Morrisville, PA (US)

(72) Inventor: Yuta Hioki, Tokyo (JP)

(73) Assignees: MITSUBISHI CHEMICAL CORPORATION, Tokyo (JP); GELEST, INC., Morrisville, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/821,070

(22) Filed: Aug. 30, 2024

(65) Prior Publication Data

US 2025/0179100 A1 Jun. 5, 2025

(30) Foreign Application Priority Data

Dec. 1, 2023 (JP) ................................ 2023-204287

(51) Int. Cl.

*G03F 7/004* (2006.01)
*C07F 7/22* (2006.01)
*G03F 7/32* (2006.01)

(52) U.S. Cl.

CPC .......... *C07F 7/2224* (2013.01); *C07F 7/2284* (2013.01); *G03F 7/0042* (2013.01); *G03F 7/0048* (2013.01); *G03F 7/32* (2013.01)

(58) Field of Classification Search

CPC ..... G03F 7/0042; G03F 7/0043; C07F 7/2224
See application file for complete search history.

(56) References Cited

U.S. PATENT DOCUMENTS

| | | | |
|---|---|---|---|
| 2,592,926 | A | 4/1952 | Mack et al. |
| 2,602,651 | A | 7/1952 | Cannon |
| 3,417,116 | A | 12/1968 | Considine et al. |
| 3,470,220 | A | 9/1969 | Moedritzer et al. |
| 3,519,666 | A | 7/1970 | Pellegrini et al. |
| 3,590,060 | A | 6/1971 | Murch |
| 3,976,672 | A | 8/1976 | Strunk et al. |
| 4,370,028 | A | 1/1983 | Bernhardt |
| 4,556,725 | A | 12/1985 | Kanner et al. |
| 4,696,837 | A | 9/1987 | Lindner |
| 5,075,468 | A | 12/1991 | Frances et al. |
| 5,123,998 | A | 6/1992 | Kishimura |
| 5,274,149 | A | 12/1993 | Calbick et al. |
| 5,698,262 | A | 12/1997 | Soubeyrand et al. |
| 6,022,822 | A | 2/2000 | Noyori |
| 6,100,415 | A | 8/2000 | Takamatsu et al. |
| 6,162,756 | A | 12/2000 | Friebe et al. |
| 6,271,329 | B1 | 8/2001 | Kristen et al. |
| 6,861,544 | B1 | 3/2005 | Curran et al. |
| 6,984,591 | B1 | 1/2006 | Buchanan et al. |
| 7,045,451 | B2 | 5/2006 | Shenai-Khatkhate |
| 7,384,872 | B2 | 6/2008 | Hwang et al. |
| 7,413,776 | B2 | 8/2008 | Shenai-Khatkhate et al. |
| 7,683,004 | B2 | 3/2010 | Feldman et al. |
| 7,745,102 | B2 | 6/2010 | Fedynyshyn et al. |
| 7,767,840 | B2 | 8/2010 | Shenai-Khatkhate et al. |
| 7,919,423 | B2 | 4/2011 | Feldman et al. |
| 8,008,518 | B2 | 8/2011 | Shinohata et al. |
| 8,415,000 | B2 | 4/2013 | Stowers et al. |
| 8,454,928 | B2 | 6/2013 | Dussarrat |
| 8,563,231 | B2 | 10/2013 | Wang et al. |
| 8,901,335 | B2 | 12/2014 | Modtland et al. |
| 9,085,594 | B2 | 7/2015 | Modtland et al. |
| 9,310,684 | B2 | 4/2016 | Meyers et al. |
| 10,732,505 | B1 | 8/2020 | Meyers et al. |
| 10,787,466 | B2 | 9/2020 | Edson et al. |
| 10,862,199 | B1 | 12/2020 | Zhang et al. |
| 11,079,676 | B2 | 8/2021 | Asano et al. |
| 11,156,915 | B2 | 10/2021 | Tsubaki et al. |

(Continued)

FOREIGN PATENT DOCUMENTS

| | | | |
|---|---|---|---|
| CA | 3080934 | A1 | 10/2019 |
| CN | 102212079 | A | 10/2011 |
| CN | 103172653 | A | 6/2013 |
| CN | 113534609 | A | 10/2021 |
| CN | 115996934 | A | 4/2023 |
| EP | 1166900 | A2 | 1/2002 |
| EP | 1491492 | A1 | 12/2004 |
| EP | 1760085 | A1 | 3/2007 |
| EP | 1983073 | A1 | 10/2008 |
| JP | S61291592 | A | 12/1986 |
| JP | H03120290 | A | 5/1991 |
| JP | 2002-371084 | A | 12/2002 |
| JP | 2006-159090 | A | 6/2006 |
| JP | 2008-091215 | A | 4/2008 |
| JP | 2008181796 | A | 8/2008 |
| JP | 2012-203061 | A | 10/2012 |

(Continued)

OTHER PUBLICATIONS

Eychenne-Baron et al., "Reaction of Butyltin Hydroxide Oxide with p-Toluenesulfonic Acid: Synthesis, X-ray Crystal Analysis, and Multinuclear NMR Characterization of {(BuSn)12O14(OH)6}(4-CH3C6H4SO3)2," Organometallics, vol. 19, pp. 1940-1949 (2000).

(Continued)

*Primary Examiner* — Daborah Chacko-Davis
(74) *Attorney, Agent, or Firm* — Panitch Schwarze Belisario & Nadel LLP

(57) ABSTRACT

As a high-performance resist material that can have high purity and uniform solubility, the following tin compound is provided. The tin compound includes: a tin atom; an organic group R; and at least one of an oxo-ligand and a hydroxo-ligand, wherein the tin compound has a diffraction angle 2θ (°) of a peak with a strongest intensity between 5.00 to 15.00° in X-ray diffraction measurement, the strongest intensity peak has a half-value width of 1.00 to 4.00°, and the organic group R has 1 to 30 carbon atoms.

20 Claims, 3 Drawing Sheets

(56) References Cited

U.S. PATENT DOCUMENTS 11,300,876 B2 4/2022 Jiang et al.
11,459,656 B1 10/2022 Arkles et al.
11,500,284 B2 11/2022 Meyers et al.
11,697,660 B2 7/2023 Kuiper et al.
12,060,377 B2 8/2024 Yang et al.
2001/0001796 A1 5/2001 Lynch et al.
2003/0015249 A1 1/2003 Jursich
2004/0077892 A1 4/2004 Arkles et al.
2004/0202956 A1 10/2004 Takahashi et al.
2009/0155546 A1 6/2009 Yamashita et al.
2010/0270296 A1 10/2010 Rauleder et al.
2011/0070371 A1 3/2011 Gessert et al.
2011/0166268 A1 7/2011 Deelman et al.
2011/0171382 A1 7/2011 Gardiner et al.
2011/0212629 A1 9/2011 Ivanov et al.
2011/0251354 A1 10/2011 Marechal
2012/0070613 A1 3/2012 Stowers et al.
2012/0223418 A1 9/2012 Stowers et al.
2013/0066086 A1 3/2013 Rogers
2014/0073785 A1 3/2014 Burke et al.
2014/0119977 A1 5/2014 Gatineau et al.
2014/0353648 A1 12/2014 Abe et al.
2015/0056542 A1 2/2015 Meyers et al.
2015/0064839 A1 3/2015 Choi et al.
2015/0210430 A1 7/2015 Naito et al.
2015/0221519 A1 8/2015 Marks et al.
2015/0253667 A1 9/2015 Bristol et al.
2016/0116839 A1* 4/2016 Meyers ................. G03F 7/2004 430/326
2017/0102612 A1 4/2017 Meyers et al.
2019/0153001 A1 5/2019 Cardineau et al.
2019/0308998 A1 10/2019 Cardineau et al.
2019/0310552 A1 10/2019 Asano et al.
2019/0315781 A1 10/2019 Edson et al.
2019/0337969 A1 11/2019 Odedra et al.
2019/0354010 A1 11/2019 Minegishi et al.
2019/0391486 A1 12/2019 Jiang et al.
2020/0239498 A1 7/2020 Clark et al.
2020/0241413 A1 7/2020 Clark et al.
2020/0326627 A1 10/2020 Jiang et al.
2020/0348591 A1 11/2020 Kim et al.
2020/0356000 A9 11/2020 Minegishi et al.
2021/0013034 A1 1/2021 Wu et al.
2021/0214379 A1 7/2021 Odedra et al.
2021/0269461 A1* 9/2021 Kung ..................... G01N 27/04
2022/0002323 A1 1/2022 Ermert et al.
2022/0064192 A1 3/2022 Edson et al.
2022/0139864 A1 5/2022 Nitta et al.
2022/0153763 A1 5/2022 Ermert et al.
2022/0187705 A1 6/2022 Jiang et al.
2022/0242888 A1 8/2022 Kuiper et al.
2022/0306657 A1 9/2022 Fabulyak et al.
2022/0402945 A1 12/2022 Ermert et al.
2022/0402946 A1 12/2022 Sim et al.
2023/0095666 A1 3/2023 Arkles et al.
2023/0098280 A1 3/2023 Kuiper
2023/0126125 A1 4/2023 Ermert et al.
2023/0143592 A1 5/2023 Jiang et al.
2023/0203068 A1 6/2023 Pan et al.
2023/0279546 A1 9/2023 Arkles et al.
2023/0303596 A1 9/2023 Ermert et al.
2023/0374338 A1 11/2023 Jilek et al.
2023/0391803 A1 12/2023 Ermert et al.
2023/0391804 A1 12/2023 Yang et al.
2024/0002412 A1 1/2024 Ermert et al.
2024/0116957 A1 4/2024 Yang
2024/0124500 A1 4/2024 Yang
2024/0158422 A1 5/2024 Yang et al.
2024/0270764 A1 8/2024 Fukui
2024/0280176 A1 8/2024 Uehara et al.
2024/0336639 A1 10/2024 Fukui et al.
2024/0376134 A1 11/2024 Yang et al.
2025/0101051 A1 3/2025 Yang et al.
2025/0154178 A1 5/2025 Yang et al.
2025/0155798 A1 5/2025 Hioki et al.
2025/0179101 A1 6/2025 Tokumi et al.
2025/0222492 A1 7/2025 Ishii et al.
2025/0222496 A1 7/2025 Ishii et al.

FOREIGN PATENT DOCUMENTS

JP 2013-143527 A 7/2013
JP 2018502173 A 1/2018
JP 2019500490 A 1/2019
JP 2020-122959 A 8/2020
JP 2020-530199 A 10/2020
JP 2021021953 A 2/2021
JP 2021503482 A 2/2021
JP 2021519340 A 8/2021
JP 2021523403 A 9/2021
JP 2021-528536 A 10/2021
JP 2023027078 A 3/2023
JP 2023539735 A 9/2023
KR 20210103950 A 8/2021
TW 223619 B 5/1994
TW 201631377 A 9/2016
TW 201831570 A 9/2018
TW 202006168 A 2/2020
TW 202028215 A 8/2020
TW 202105087 A 2/2021
TW 202111044 A 3/2021
TW 1752308 B 1/2022
TW 202230049 A 8/2022
TW 202246293 A 12/2022
TW 202300499 A 1/2023
TW 202323261 A 6/2023
TW 202330997 A 8/2023
WO 8607615 A1 12/1986
WO 8705037 A1 8/1987
WO 0195690 A1 12/2001
WO 0214328 A1 2/2002
WO 2003091186 A2 11/2003
WO 2009138474 A1 11/2009
WO 2012012026 A2 1/2012
WO 2013143745 A1 10/2013
WO 2013172466 A1 11/2013
WO 2014025937 A1 2/2014
WO 2017066319 A2 4/2017
WO 2017156388 A1 9/2017
WO 2018031896 A1 2/2018
WO 2018123388 A1 7/2018
WO 2018139109 A1 8/2018
WO 2019023797 A1 2/2019
WO 2019199467 A1 10/2019
WO 2020102085 A1 5/2020
WO 2020132281 A1 6/2020
WO 2020264557 A1 12/2020
WO 2020264571 A1 12/2020
WO 2022046736 A1 3/2022
WO 2022165381 A1 8/2022
WO 2023006871 A1 2/2023
WO 2023114214 A 6/2023
WO 2023209506 A1 11/2023
WO 2023235534 A1 12/2023
WO 2023245047 A1 12/2023
WO 2024035914 A1 2/2024
WO 2024181551 A1 9/2024
WO 2025054307 A2 3/2025
WO 2025170981 A2 8/2025

OTHER PUBLICATIONS

Eychenne-Baron et al., "New synthesis of the nanobuilding block {(BuSn)12O14(OH)6}2+ and exchange properties of {(BuSn)12O14(OH)6}(O3SC6H4CH3)2", Journal of Organometallic Chemistry vol. 567, pp. 137-142 (1998).

Puff et al., "Zur Hydrolyse von Monoorganylzinn-trihalogeniden (III. Isolierung und Roentgenstrukturanalyse von Verbindungen mit dem neuartigen Kaefig-Ion[(i-PrSn)12O14(OH)6]2+", Journal of Organometallic Chemistry, vol. 373, pp. 173-184 (1989) (English Abstract Only).

(56) References Cited

OTHER PUBLICATIONS

Abel et al., "The Synthesis and Characterization of Some (Aminomethyl)Trialkyl- and (Aminomethyl)Triphenyl-Tins," Journal of Organometallic Chemistry, vol. 97, pp. 159-165 (1975).
Armarego, W.L.F., "Purification of Laboratory Chemicals," 6th Edition, Elsevier Inc., pp. xii-743 (2009).
Barreca et al., "MOCVD of SnO2 thin films from a new organometallic precursor," J. Phys. IV France, vol. 9, pp. Pr8-667-Pr8-673 (1999).
Brown et al., "Organoboranes for synthesis. 9. Rapid reaction of organoboranes with iodine under the influence of base. A convenient procedure for the conversion of alkenes into iodides via hydroboration," Tetrahedron, vol. 44, No. 10, pp. 2751-2762 (1988).
Cannon Instrument Company, "Cannon Catalog 2007-2008: Innovations in Viscosity Measurement," pp. 1-74.
Cardineau et al., "EUV Resists based on Tin-Oxo Clusters," Proc. of SPIE, Advances in Patterning Materials and Processes XXXI, vol. 9051, pp. 90511B-1-90511B-12 (2014).
Cardineau et al., "Photolithographic properties of tin-oxo clusters using extreme ultraviolet light (13.5 nm)," Microelectronic Engineering, vol. 127, pp. 44-50 (2014).
Chukhajian et al., "Synthesis of Mixed Secondary and Tertiary Amines," Russian Journal of Organic Chemistry, vol. 56, No. 2, pp. 353-355 (2020).
Cochran et al., "Kinetics of the Protodestannylation of Vinyltrialkyltins and Substituted Vinyltrialkyltins," Organometallics, vol. 1, No. 4, pp. 586-590 (1982).
Das et al., "Synthesis of Oxazolidinones by a Hypervalent lodine Mediated Cyclization of N-Allylcarbamates," Adv. Synth. Catal., vol. 363, pp. 1646-1650 (2021).
Davies, "Organotin Chemistry, 2nd, Completely Revised and Updated Edition," Wiley, pp. 266-267 (2003).
Del Re et al., "Low-LER Tin Carboxylate Photoresists using EUV," Extreme Ultraviolet (EUV) Lithography VI, Proc. of SPIE, vol. 9422 (2015).
Ding et al., "Radical-Induced Formation of Some Siloles and Diazasiloles," J. Org. Chem., vol. 67, No. 25, pp. 8906-8910 (2002).
Elhamzaoui et al., "A doubly folded spacer in a self-assembled hybrid material," Chem. Commun., pp. 1304-1306 (2006).
Eujen et al., "Preparation and Properties of Trifluoromethyl-Substituted Stannanes," J. Organomet. Chem., vol. 434, No. 2, pp. 159-168 (1992) (Abstract Only).
Fallica et al., "Absorption coefficient and exposure kinetics of photoresists at EUV," Proc. of SPIE, vol. 10143, pp. 101430A-1-101430A-11 (2017).
Furniss et al., "Vogel's Textbook of Practical Organic Chemistry: Experimental Techniques," John Wiley & Sons, Inc., New York, pp. 169-190 (1989).
Haaland "Covalent versus Dative Bonds to Main Group Metals a Useful Distinction," Angewandte Chemie Internation Edition English, 1989, vol. 28, pp. 992-1007.
Haitjema et al., "Extreme ultraviolet patterning of tin-oxo cages," Journal of Micro/Nanolithography, MEMS, and MOEMS, vol. 16, No. 3, pp. 033510-1-033510-8 (2017).
Hänssgen et al., "Synthese der ersten mono-t-butylzinn-elementverbindungen," Journal of Organometallic Chemistry, vol. 293, pp. 191-195 (1985).
International Preliminary Report on Patentability issued Mar. 5, 2024 in Int'l Application No. PCT/US2021/056936.
International Search Report and Written Opinion issued Jan. 16, 2024 in Int'l Application No. PCT/US2023/030045.
International Search Report and Written Opinion issued Feb. 5, 2024 in Int'l Application No. PCT/US2023/033801.
International Search Report and Written Opinion issued Jun. 10, 2022 in Int'l Application No. PCT/US2021/056936.
International Search Report and Written Opinion issued Oct. 5, 2023 in Int'l Application No. PCT/US2023/024227.
Jones et al., "Amino-derivatives of Metals and Metalloids. Part I. Preparation of Aminostannanes, Stannylamines, and Stannazanes," J. Chem. Soc., pp. 1944-1951 (1965).
Jousseaume et al., "General Routes to Functional Organotin Trichlorides and Trialkoxides Involving the Tricyclohexylstannyl Group," Organometallics, vol. 14, pp. 685-689 (1995).
Khrustalev et al., "New stable germylenes, stannylenes, and related compounds. 8. Amidogermanium(II) and -tin (II) chlorides R2N-E14-CI (E14 = Ge, R = Et; E14 = Sn, R = Me) revealing new structural motifs," Applied Organometallic Chemistry, vol. 21, pp. 551-556 (2007).
Lorberth et al., "Evidence For Sn—N pi-Bonding: Dipole Moments of Aminostannanes," Journal of Organometallic Chemistry, vol. 19, pp. 203-206 (1969).
Lorberth, J., "Spaltung der zinn-stickstoff-bindung: (dialkylamino)-stannane und ihre reaktionen mit alkylierungsmitteln," Journal of Organometallic Chemistry, vol. 16, No. 2, pp. 235-248 (1969).
Molloy, K. C., "Precursors for the formation of tin(IV) oxide and related materials," Journal of Chemical Research, pp. 549-554 (2008).
Notice of Allowance issued Jul. 24, 2024 in U.S. Appl. No. 18/373,404, by Yang.
Office Action issued Feb. 11, 2022 in U.S. Appl. No. 17/512,944, by Arkles.
Office Action issued Mar. 8, 2024 in U.S. Appl. No. 18/205,009 by Yang et al.
Office Action issued Mar. 15, 2023 in TW Application No. 110141022 (partial translation).
Office Action issued Mar. 26, 2024 in TW Application No. 112130357.
Office Action issued Apr. 8, 2024 in TW Application No. 112120747.
Office Action issued Oct. 26, 2023 in U.S. Appl. No. 18/232,945 by Yang et al.
Office Action issued Nov. 20, 2023 in U.S. Appl. No. 18/205,009 by Yang et al.
Office Action issued Dec. 1, 2023 in U.S. Appl. No. 18/373,404, by Yang.
Ossig et al., "Synthesis and X-ray Crystal Structure of a Stannaimine," Journal of the Chemical Society, Chemical Communications, pp. 497-499 (1993).
Pigarev et al., "The effect of substituents on the structure and reactivity of organogermanium anions," Journal of Organometallic Chemistry, vol. 369, pp. 29-41 (1989).
Pratihar et al., "Reactivity and Selectivity of Organotin Reagents in Allylation and Arylation: Nucleophilicity Parameter as a Guide," Organometallics, vol. 30, No. 12, pp. 3257-3269 (2011).
Sakai et al., "Progress in metal organic cluster EUV photoresists," J. Vac. Sci. Technol. B, vol. 36, No. 6, pp. 06J504-1-06J504-3 (2018).
Search Report issued Mar. 9, 2023 in TW Application No. 110141022.
Search Report issued Aug. 19, 2022 in TW Application No. 110141022.
Seyferth, D., "The Grignard Reagents," Organometallics, vol. 28, No. 6, pp. 1598-1605 (2009).
Stanley et al., "Atmospheric pressure chemical vapour deposition of fluorine-doped tin(IV) oxide from fluoroalkyltin precursors," Applied Organometallic Chemistry, vol. 19, pp. 644-657 (2005).
Tansjo, L., "N-Substituted Alkyltriaminosilanes," ACTA Chemica Scandinavica, vol. 11, No. 10, pp. 1613-1621 (1957).
Tuyen et al., "Nanomechanical and Material Properties of Fluorine-Doped Tin Oxide Thin Films Prepared by Ultrasonic Spray Pyrolysis: Effects of F-Doping," Materials, vol. 12, No. 10, 1665, pp. 1-12 (2019).
Van Den Berghe et al., "A study of the 1H and 119Sn NMR spectra of (CH3)4-nSn(NR2)n compounds (R=CH3, C2H5)," Journal of Organometallic Chemistry, vol. 61, pp. 197-205 (1973).
Van Mol, A.M.B., "Chemical vapour deposition of tin oxide thin films," Ph.D. Thesis, Eindhoven University of Technology, pp. 1-176(2003).
Warner E., "Atomic Layer Deposition of Tin Oxide and Zinc Tin Oxide: Understanding the Reactions of Alkyl Metal Precursors with Ozone," A Dissertation Submitted to the Faculty of University of Minnesota, pp. i-139 (2014).
Wiley-VCH Verlag Gmbh & Co. KGaA, "Distillates (petroleum)(, hydrotreated light," The MAK Collection for Occupational Health and Safety, pp. 1791-1803 (2016).

(56) References Cited

OTHER PUBLICATIONS

Yoder et al. "Amination and Transamination as Routes to Fourth Group Diamines" Journal of the American Chemical Society, 1966, vol. 88, No. 21, pp. 4831-4839.
Zhang et al., "The characterization of fluorine doped tin oxide films by Fourier Transformation Infrared spectrum," Materials Letters, vol. 64, pp. 2707-2709 (2010).
Zuiderweg, F.J., "Laboratory Manual of Batch Distillation," Interscience Publishers, Inc., pp. v-viii, 1 and 74-97 (1957).
Accession No. 1995:174817, Chemical Abstract Service, CAPLUS databse (published in 1995; retrieved on Jan. 25, 2025) (1995).
International Preliminary Report on Patentability issued Dec. 12, 2024 in Int'l Application No. PCT/US2023/024227.
Office Action issued Jan. 2, 2025 in U.S. Appl. No. 18/420,894, by Yang et al.
Office Action issued Jan. 30, 2025 in U.S. Appl. No. 18/243,318, by Yang et al.
Ribot et al., "Sol-Gel Synthesis of Hybrid Organic-Inorganic Tin Oxide Based Materials," Mat. Res. Soc. Symp. Proc., vol. 346, pp. 121-126 (1994).
Office Action issued Nov. 7, 2024 in U.S. Appl. No. 18/205,009 by Yang.
Graf, G., "Tin, Tin Alloys, and Tin Compounds," Ullmann's Encyclopedia of Industrial Chemistry, vol. 37, pp. 1-34 (2012).
Jaumier et al., "New route to monoorganotin oxides and alkoxides from trialkynylorganotins," Chem. Commun., vol. 3, pp. 369-370 (1998).
Jaumier et al., "Transmetalation of Tetraalkynyltin Compounds with Grignard Reagents: Access to Mono- and Dialkyltin Products," Angew. Chem. Int. Ed., vol. 38, No. 3, pp. 402-404 (1999).
Lappert et al., "Subvalent group 14 metal compounds; XI. Oxidative addition reactions of organic halides or acid anhydrides (including CH4-nCIn, PhBr, BrN(SiMe3)2, ButCOCI, or (CF3CO)2O) to some bivalent group 14 metal amides or alkyls," Journal of Organometallic Chemistry, vol. 330, pp. 31-46 (1987).
Mayo, J., "5 Reasons your Process Could Benefit from Glass-Lined Steel Equipment," De Dietrich Process Systems, pp. 1-7 (2013).
Office Action issued Nov. 29, 2024 in U.S. Appl. No. 18/389,294, by Yang et al.
Wilkins, T., "Four Key Advantages of Using Stainless Steel IBCs in the Industrial Chemical Industry," Metano Tote Talk Blog (2017).
International Search Report and Written Opinion issued Apr. 11, 2025 in International Application No. PCT/US2024/054069.
International Search Report and Written Opinion issued May 8, 2025 in International Application No. PCT/US2024/061753.
International Search Report and Written Opinion issued May 9, 2025 in International Application No. PCT/US2024/061775.
Notice of Allowance issued Dec. 25, 2024 in TW Application No. 112120747.
Office Action issued May 14, 2025 in U.S. Appl. No. 18/196,579, by Arkles.
Office Action issued May 21, 2025 in U.S. Appl. No. 18/821,200, by Hioki.
Partial International Search Report issued May 2, 2025 in International Application No. PCT/US2024/057488.
Agur et al., "Organic Derivatives of Tin: Part VIII—Some Insertion Reactions Across Sn—O Bond," Indian Journal of Chemistry, vol. 12, pp. 1193-1196 (1974).
Bonire, J. J., "Reaction of Phenyltin Chlorides with Silver Trifluoroacetate," Polyhedron, vol. 6, No. 3, pp. 397-400 (1987).
Courtenay et al., "Phosphinimido Complexes of Silicon, Tin, and Germanium," Organometallics, vol. 22, No. 4, pp. 818-825 (2003).
Decision issued Apr. 22, 2025 in TW Application No. 112130357.
Declaration of Dr. Drew Hood in IRP2025-00267 (*Entegris, Inc.* v. *Inpria Corp*, U.S. Pat. No. 11,673,903 )Dec. 10, 2024) (Year: 2024).
Fouquet et al., "Synthesis of monoorganotins and their use as versatile reagents for organic synthesis," Bulletin de la Societe Chimique de France, vol. 134, Nos. 10 & 11, 959-967 (1997).
Gaur et al., "Organic Derivatives of Tin; V Synthesis and Reactions of Alkyltin Trialkoxides," Journal of Organometallic Chemistry, vol. 63, pp. 221-231 (1973).
International Search Report and Written Opinion issued Jun. 25, 2025 in International Application No. PCT/US2024/057488.
International Search Report and Written Opinion issued Aug. 7, 2025 in International Application No. PCT/US2025/014559.
International Search Report and Written Opinion issued Nov. 19, 2024 in International Application No. PCT/JP2024/031129.
International Search Report and Written Opinion issued Nov. 19, 2024 in International Application No. PCT/JP2024/031130.
Lorberth et al., "Untersuchungen an Methylzinn-amiden," Chemische Berichte, vol. 98, No. 2, pp. 520-525 (1965).
Midha et al., "Some Alkyltin(IV) Trifluoroacetates," Indian Journal of Chemistry, vol. 22A, pp. 211-213 (1983).
Notice of Allowance issued Jun. 30, 2025 in U.S. Appl. No. 18/205,009, by Yang.
Office Action and Examination Search Report issued Jun. 3, 2025 in CA Application No. 3231519.
Office Action and Search Report issued Jul. 4, 2025 in TW Application No. 113141998, with English translation of Search Report.
Office Action issued May 28, 2025 in U.S. Appl. No. 18/420,894, by Yang.
Office Action issued Jun. 3, 2025 in JP Application No. 2024515872.
Office Action issued Jun. 12, 2025 in TW Patent Application No. 113132741.
Office Action issued Jun. 25, 2025 in TW Patent Application No. 113132740.
Ossig et al., "Reactions of a free stannaimine and of base-stabilized stannylenes," Chemische Berichte, vol. 126, No. 10, pp. 2247-2253 (1993) (with English Abstract).
Office Action issued Oct. 14, 2025 in JP Application No. 2024571027.
Office Action issued Apr. 15, 2026 in U.S. Appl. No. 18/821,200, by Hioki.
International Preliminary Report on Patentability issued Jun. 11, 2026 in International Application No. PCT/JP2024/031129.
Office Action and Search Report issued Mar. 20, 2026 in TW Patent Application No. 113132740.
Wrackmeyer et al., "Synthesis and Multinuclear Magnetic Resonance Studies (13C, 15N, 29Si, 119Sn) of Alkynyl (Dialkylamino)Tin Compounds," vol. 15, No. 2, pp. 89-99 (1992).

* cited by examiner

[FIG.1]
Example 3-1: XRD chart of H1A
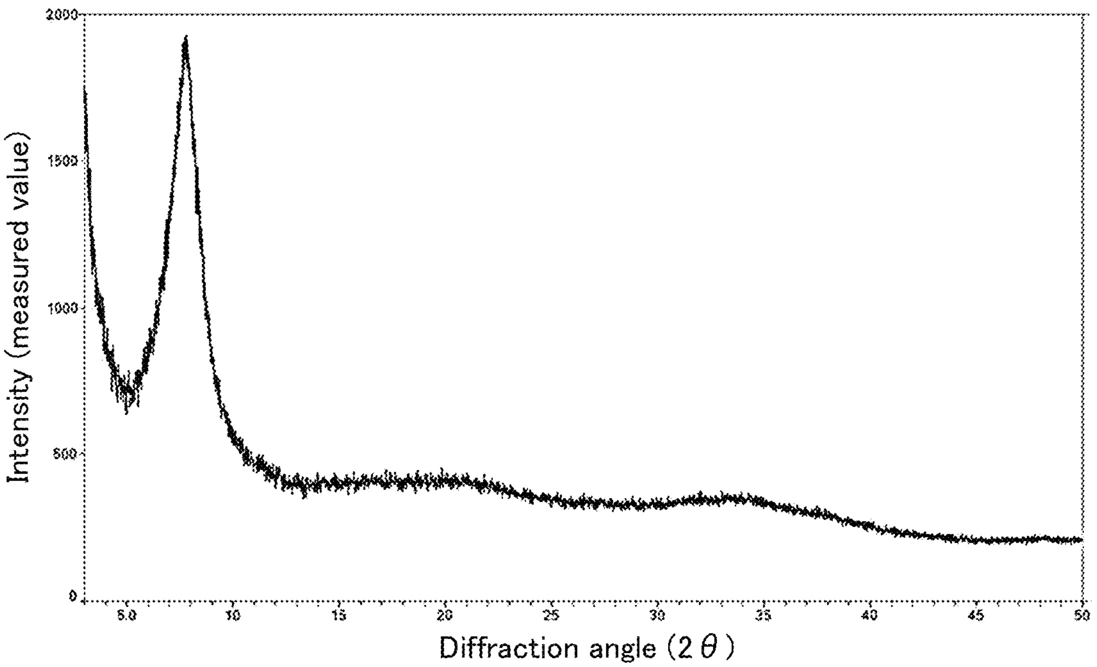
[FIG.2]
Comparative Example 3-1: XRD chart of H1C
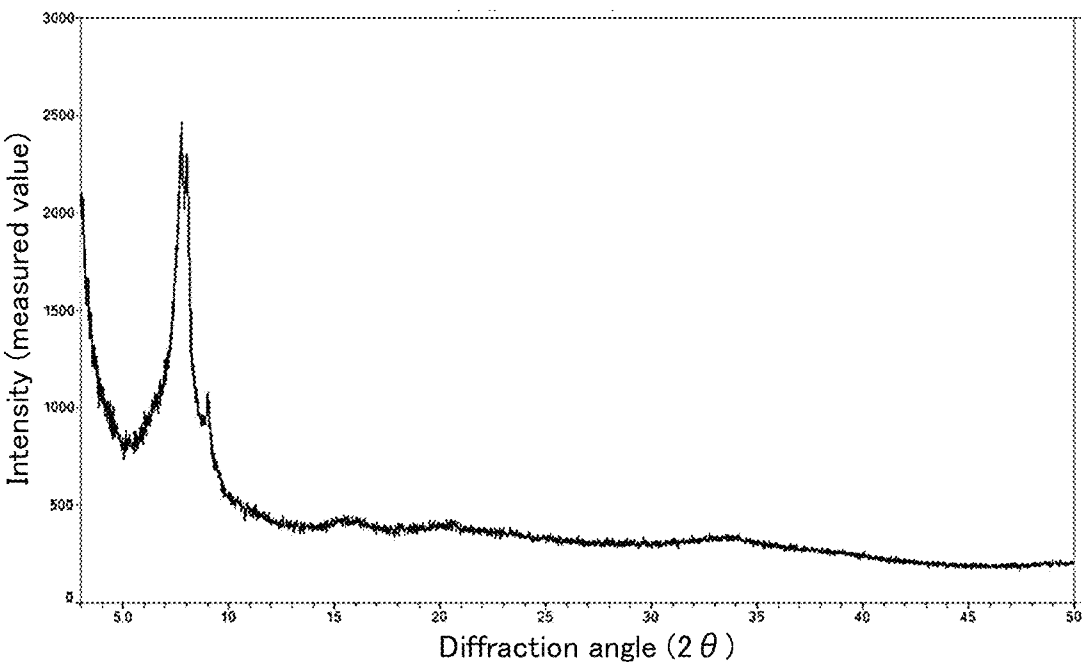

[FIG.3A]
H1A : $^{119}$Sn-NMR Broad
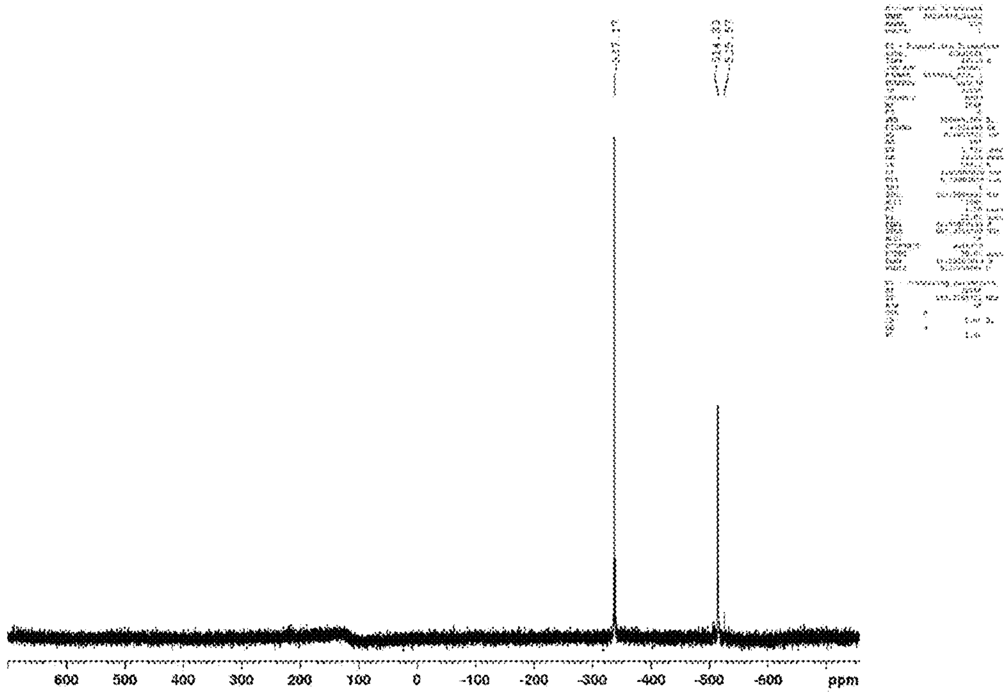
[FIG.3B]
H1A : $^{119}$Sn-NMR Detail
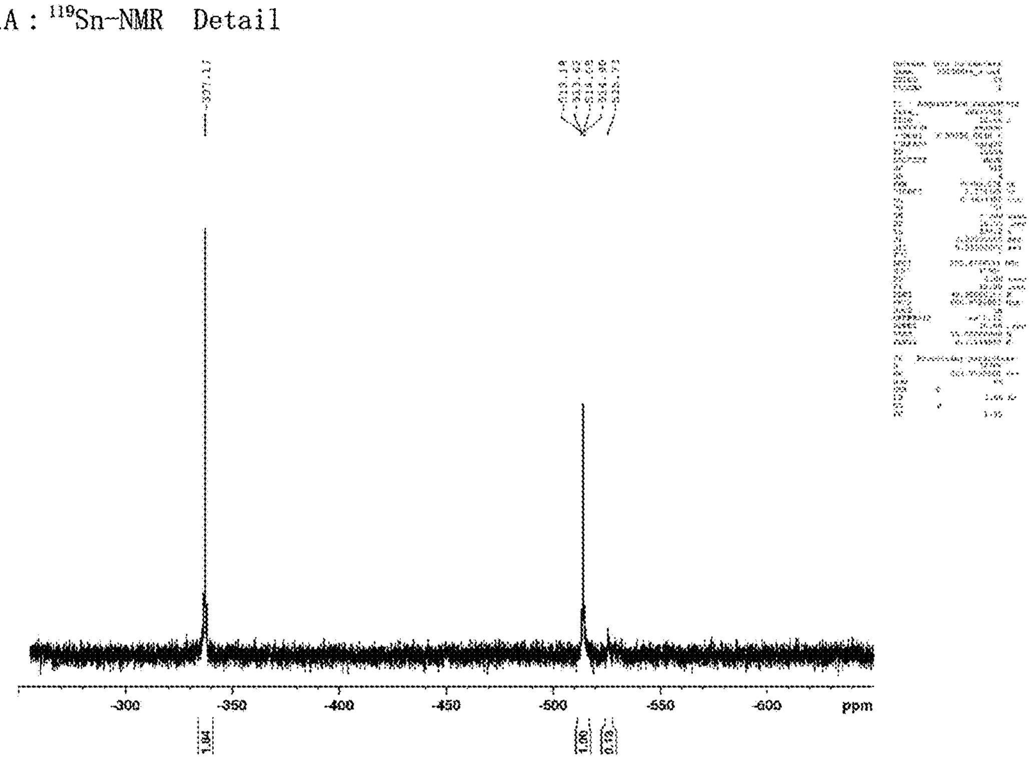

[FIG.3C]
H1A : $^1$H-NMR Detail
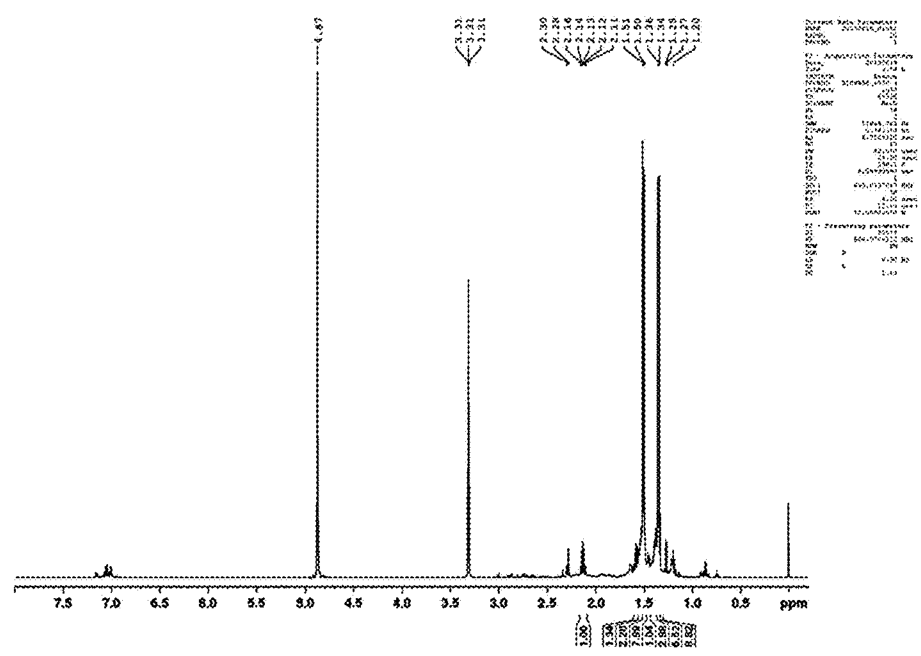
[FIG.3D]
H1A ESI-MS chart
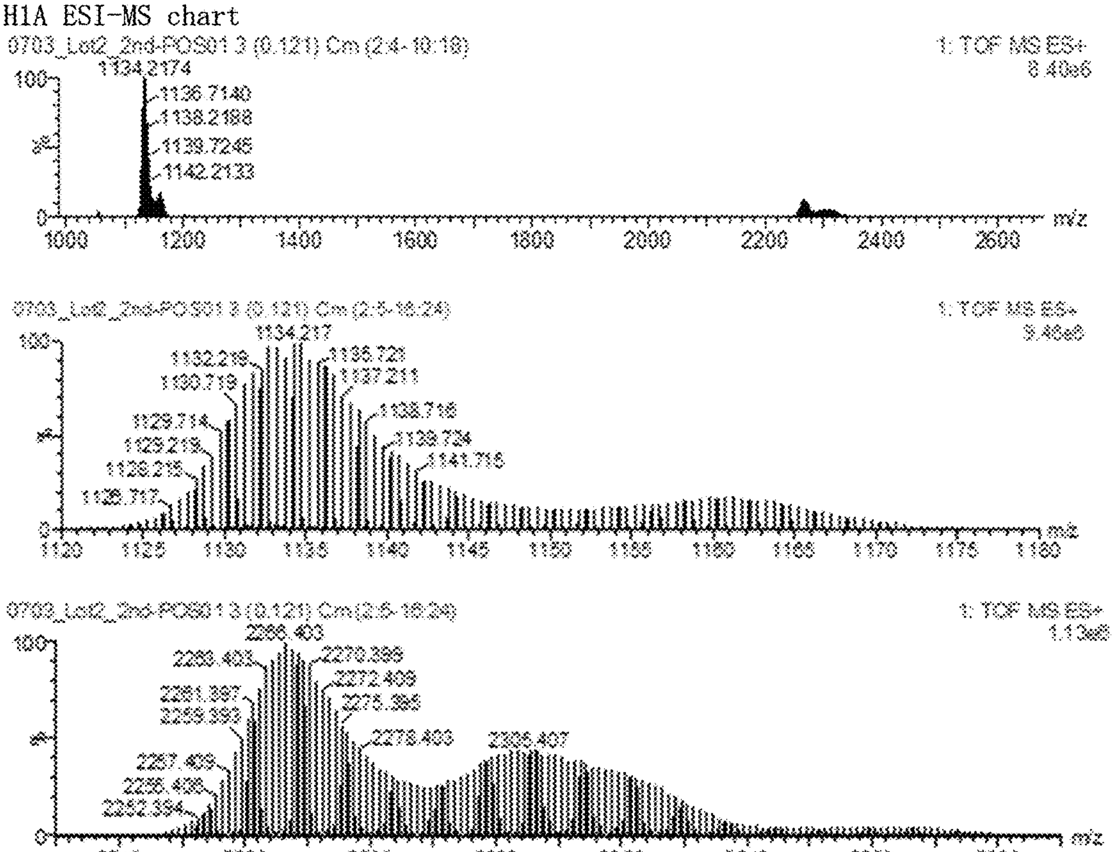

TIN COMPOUND AND RESIST SOLUTION USING THE SAME, PATTERN FORMING METHOD, THIN FILM, PATTERNED THIN FILM, AND METHOD FOR PRODUCING TIN COMPOUND

CROSS-REFERENCE TO RELATED APPLICATIONS

This application claims priority under 35 U.S.C. § 119 (b) to Japanese Application No. 2023-204287, filed Dec. 1, 2023, the disclosure of which is incorporated herein by reference in its entirety.

TECHNICAL FIELD

The present disclosure relates to a tin compound and a resist solution, a patterning method, a thin film, a patterned thin film using the same, and a method for producing a tin compound.

BACKGROUND ART

In recent years, there has been a need to handle a greater amount of information at higher speeds with higher precision against the backdrop of a paradigm shift to the advanced information society, and technologies related to semiconductor devices such as integrated circuits using semiconductors have been advancing noticeably day by day.

Evolution of semiconductor design requires formation of features that are finer than ever before on a semiconductor substrate material. Each feature is not greater than about 22 nanometers (nm), and possibly less than 10 nm in some cases. One challenge in production of a device with such fine features is the ability to form a photolithography mask having sufficient resolution securely and reproducibly. To achieve a feature size of smaller than the wavelength of light, it is necessary to use complicated resolution improvement technology, such as multiple patterning. Therefore, it is important to develop photolithography technology using shorter wavelength light, such as extreme ultraviolet radiation (EUV) having a wavelength of 10 nm to 15 nm (for example, 13.5 nm).

A conventional organic chemically amplifying resist (CAR) has a low adsorption coefficient particularly in the EUV region, and may cause a blur with diffusion of an optically active chemical species, large line width roughness (LWR), pattern collapse, etc., and thereby has a latent disadvantage for use in EUV lithography. Therefore, there remains a necessity for an improved EUV photoresist material having properties of higher sensitivity, lower line width roughness (LWR), and better etching resistance.

Accordingly, a metal material using an organotin compound has been used in recent years particularly as a resist applicable for EUV. Specifically, for example, it has been reported that an alkyltin oxo-hydroxo compound synthesized by hydrolysis of a highly pure monoalkyltin compound as a raw material is a resist material applicable for EUV, which can achieve extremely fine negative-type patterning with high resolution and low line width roughness (LWR). It is also reported that a branched alkyl group yields particularly excellent sensitivity as an alkyl group (PTL 1).

In addition, it is reported that use of a monoalkyltin compound containing a dialkyltin compound as an impurity at a low amount as a resist material yields excellent outgas reduction (PTL 2).

It is reported that an alkyltin oxo-hydroxo compound synthesized from a hydrolysable tin compound having a plurality of types of alkyl groups as a raw material can achieve both high sensitivity and low line width roughness (LWR) (PTL 3). In addition, reported is an example of synthesizing an alkyltin oxo-hydroxo compound by mixing organometallic compounds having a hydrolysable group having no alkyl group (PTL 4).

RELATED ART DOCUMENT

Patent Document

PTL 1: JP-A-2021-21953
PTL 2: JP-A-2021-519340
PTL 3: JP-A-2019-500490
PTL-4: JP-A-2023-27078

SUMMARY

The alkyltin oxo-hydroxo compounds that have been reported, however, are insufficient for satisfying performance as a resist material. Particularly, as a resist material, crystallinity of the tin composition that affects solubility (in a resist solvent and a developer solvent) involved with performance and quality has not been sufficiently investigated. Specifically, it has not been clarified how the range of the crystal structure, crystallinity, etc. of the alkyltin oxo-hydroxo compound are suitable for a resist material. For achievement of both objectives of controlling of the crystal structure and crystallinity and synthesis of a highly pure resist material, no solution has been proposed.

Under such background, the present disclosure provides a tin compound as a high-performance resist material that can have high purity and uniform solubility.

The present inventors have made earnest study to solve the above problem, and consequently found that an alkyltin oxo-hydroxo compound (encompassing a composition) having a specific crystal structure and crystallinity imparts excellent performance when used as a resist material.

In addition, use of a composition (precursor) containing a monoalkyltin compound with a specific structure and a combination of precursors with a specific composition can achieve both the high purity required for a resist material and control toward preferable crystallinity.

Specifically, the present disclosure has the following aspects.

[1] A tin compound, including:
- a tin atom;
- an organic group R; and
- at least one of an oxo-ligand and a hydroxo-ligand,
- wherein the tin compound has a diffraction angle 2θ (°) of a peak with a strongest intensity between 5.00 to 15.00° in X-ray diffraction measurement,
- wherein the strongest intensity peak has a half-value width of 1.00 to 4.00°, and
- wherein the organic group R has 1 to 30 carbon atoms.

[2] The tin compound according to [1], wherein the tin compound is represented by formula $RSnO_{(3/2-X/2)}(OH)x$, wherein $0 \le x \le 3$.

[3] The tin compound according to [1], wherein the tin compound is a compound including a cation represented by chemical formula $(RSn)_{12}O_{14}(OH)_6^{+2}$.

[4] The tin compound according to any one of [1] to [3], wherein the tin compound has a ratio [(k1+k2)/(k3)] of not less than 0.9, wherein the ratio is a total value (k1+k2) in $^{119}$Sn-NMR of a total (k1) of peak integration values of a pentavalent Sn (−250 to −350 ppm) and a total (k2) of peak integration values of a hexavalent Sn (−450 to −600 ppm) relative to a total value (k3) of all peak integration values (including k1 and k2) within a range of 1000 to −1000 ppm detected from the $^{119}$Sn-NMR.

[5] The tin compound according to any one of [1] to [4], wherein the tin compound has a ratio (k1/k2) of 0.5 to 2.5, the ratio being a total (k1) of peak integration values of a pentavalent Sn (−250 to −350 ppm) relative to a total (k2) of peak integration values of a hexavalent Sn (−450 to −600 ppm) in $^{119}$Sn-NMR.

[6] The tin compound according to any one of [1] to [5], wherein the half-value width of the strongest intensity peak is 1.43 to 4.00°.

[7] The tin compound according to any one of [1] to [6], wherein the organic group R has 3 to 10 carbon atoms.

[8] The tin compound according to any one of [1] to [7], wherein the organic group R is a hydrocarbon group.

[9] The tin compound according to any one of [1] to [7], wherein the organic group R is a hydrocarbon group, and not less than 50 mol % of substituents constituting the hydrocarbon group is a secondary hydrocarbon group $R^2$.

[10] A resist solution, including:
the tin compound according to any one of [1] to [9]; and
an organic solvent.

[11] A patterning method, including:
a step of applying the resist solution according to [10] on a substrate;
a step of exposing a thin film comprising the tin compound to radiation; and
a step of developing the thin film by using a developer liquid.

[12] A thin film on a substrate, the thin film including the tin compound according to any one of [1] to [9].

[13] A patterned thin film on a substrate, the patterned thin film including the tin compound according to any one of [1] to [9].

[14] A method for producing a patterned substrate, the method including the patterning method according to [11].

[15] A monoalkyltin compound represented by $RSnX_2Y$ (B1),
wherein the R represents an organic group having 1 to 30 carbon atoms,
wherein X and Y each represent a hydrolysable group with different chemical formulas,
X is selected from OR', $NR'_2$, and C≡CR',
Y is selected from $OR'^Y$, $NR'^Y_2$, and $C≡CR'^Y$,
R' and $R'^Y$ each represent an organic group having 1 to 10 carbon atoms,
in at least one of a case where the X is $NR'_2$ and a case where the Y is the $NR'^Y_2$, the R' and $R'^Y$ may be independently same as or different from each other, and
when a plurality of R' and $R'^Y$ are present in a molecule, the plurality of R' and $R'^Y$ may have a structure different from each other and may be bonded to each other to form a cyclic structure.

[16] The monoalkyltin compound according to [15], wherein the hydrolysable groups X and Y respectively represent $NR'_2$ and $NR'^Y_2$, and wherein the substituent $NR'_2$ of the X and the substituent $NR'^Y_2$ of the Y are represented by different chemical formulas.

[17] The monoalkyltin compound according to [15] or [16], wherein the hydrolysable groups X and Y respectively represent OR' and $OR'^Y$, and wherein the substituent OR' of the X and the substituent $OR'^Y$ of the Y are represented by different chemical formulas.

[18] The monoalkyltin compound according to any one of [15] to [17], wherein the hydrolysable group X represents the substituent $NR'_2$, and the hydrolysable group Y represents the substituent $OR'^Y$.

[19] The monoalkyltin compound according to any one of [15] to [18], wherein the hydrolysable group X represents the substituent OR', and the hydrolysable group Y represents the substituent $NR'^Y_2$.

[20] A monoalkyltin composition, including:
a monoalkyltin compound $RSnX_3$ (A1) at 50 to 99.99 mol %; and
a monoalkyltin compound $RSnX_2Y$ (B1) at not less than 0.01 mol % and less than 50 mol %,
wherein R represents an organic group having 1 to 30 carbon atoms,
X and Y each represent a hydrolysable group with different chemical formulae,
X is selected from OR', $NR'_2$, and C≡CR',
Y is selected from $OR'^Y$, $NR'^Y_2$, and $C≡CR'^Y$,
R' and $R'^Y$ each represent an organic group having 1 to 10 carbon atoms,
in at least one of a case where the X is $NR'_2$ and a case where the Y is the $NR'^Y_2$, the R' and $R'^Y$ may be independently same as or different from each other, and
when a plurality of R' and $R'^Y$ are present in a molecule, the plurality of R' and $R'^Y$ may have different structures from each other and may be bonded to each other to form a cyclic structure.

[21] A monoalkyltin composition, including:
a monoalkyltin compound $RSnX_3$ (A1) at not less than 0.01 mol % and less than 50 mol %; and
a monoalkyltin compound $RSnX_2Y$ (B1) at 50 mol % to 99.99 mol %,
wherein R represents an organic group having 1 to 30 carbon atoms,
X and Y each represent a hydrolysable group with different chemical formulas,
X is selected from OR', $NR'_2$, and C≡CR',
Y is selected from $OR'^Y$, $NR'^Y_2$, and $C≡CR'^Y$,
R' and $R'^Y$ each represent an organic group having 1 to 10 carbon atoms,
in at least one of a case where the X is $NR'_2$ and a case where the Y is the $NR'^Y_2$, the R' and $R'^Y$ may be independently same as or different from each other, and
when a plurality of R' and $R'^Y$ are present in a molecule, the plurality of R' and $R'^Y$ may have different structures from each other and may be bonded to each other to form a cyclic structure.

[22] The monoalkyltin composition according to [20] or [21], including:
the $RSnX_3$ (A1);
the $RSnX_2Y$ (B1); and
a monoalkyltin compound other than the $RSnX_3$ (A1) and the $RSnX_2Y$ (B1),
wherein the $RSnX_3$ (A1) and the $RSnX_2Y$ (B1) are contained at a total content of not less than 80 mol %.

[23] A method for producing a tin compound, including:
a tin atom,
an organic group R; and
at least one of an oxo-ligand and a hydroxo-ligand, wherein the tin compound has a diffraction angle 2θ (°) of a peak with a strongest intensity between 5.00 to 15.000 in X-ray diffraction measurement, wherein the strongest intensity peak has a half-value width of 1.00 to 4.00°, and wherein the organic group R has 1 to 30 carbon atoms, the method including step 1 and step 2, <step 1> using the monoalkyltin composition according to [20] or [21] as a raw material; and <step 2> contacting the raw material with at least one of water and water vapor.

[24] The method for producing a tin compound according to [23], wherein, in the step 2, a blend of the raw material and an organic solvent is contacted with liquid water.

[25] The method for producing a tin compound according to [23] or [24], wherein, in the step 2, not less than 100 parts by mass of an organic solvent is blended relative to 100 parts by mass of the raw material to prepare a composition.

[26] The method for producing a tin compound according to any one of [23] to [25], wherein the half-value width of the strongest intensity peak is 1.43 to 4.00°.

The tin compound of the present disclosure has high purity and uniform solubility to be useful as a high-performance resist material.

BRIEF DESCRIPTION OF DRAWINGS

FIG. 1 is an XRD spectrum of a tin hydrolysate H1A;

FIG. 2 is an XRD spectrum of a tin hydrolysate H1C;

FIG. 3A is a broad spectrum of $^{119}$Sn-NMR of the tin hydrolysate H1A;

FIG. 3B is a detailed spectrum of $^{119}$Sn-NMR of the tin hydrolysate H1A;

FIG. 3C is a detailed spectrum of $^{1}$H-NMR of the tin hydrolysate H1A; and FIG. 3D is a spectrum of electron-spray ionization mass spectrometry (ESI-MS) of the tin hydrolysate H1A.

EMBODIMENTS OF THE DISCLOSURE

Hereinafter, the present disclosure will be described based on examples of embodiment of the present disclosure. Note that the present disclosure is not limited to embodiments described as follows.

In the present disclosure, the expression "α to β," wherein α and β represent given numbers, encompasses "preferably greater than α" or "preferably less than β" in addition to "not less than α and not greater than β" unless otherwise mentioned.

In the present disclosure, the expression "not less than α," wherein α represents a given number, or the expression "not greater than β," wherein β represents a given number" encompasses "preferably greater than α" or "preferably less than β."

In the present disclosure, "at least one of γ and δ, wherein γ and δ represent a given constituent or component" means: only γ; only δ; and γ and δ.

In a numerical range stepwise described in the present disclosure, an upper limit value or a lower limit value in a numerical range on a certain step may be appropriately combined with an upper limit value or a lower limit value in a numerical range on another step. In a numerical range described in the present description, an upper limit value or a lower limit value within this numerical range may be replaced with values described in Examples.

In the present embodiment, "main component" means a component that significantly affects physical properties of an object, and a content of the component is typically not less than 50 mass %, preferably not less than 55 mass %, more preferably not less than 60 mass %, and further preferably not less than 70 mass %, or may be 100 mass % in the object.

Hereinafter, the tin compound according to one embodiment of the present disclosure will be described in detail.

<<The Present Tin Hydrolysate>>

The tin compound (P1) according to one embodiment of the present disclosure is a tin compound having a tin atom, an organic group R, and at least one of an oxo-ligand and a hydroxo-ligand, and the organic group R has 1 to 30 carbon atoms. Hereinafter, a substituent bonded to the tin atom may be referred to as a "ligand."

In X-ray diffraction measurement on this compound (P1), a diffraction angle 2θ (°) of a peak with a strongest intensity is present between 5.00 to 15.00°, and the strongest intensity peak has a half-value width of 1.00 to 4.00°.

An object of this aspect of the disclosure is to provide a high-performance resist material that can have particularly high purity and uniform solubility. For achieving this object, it has been found that intentionally adding a tin compound $RSnX_2Y$ having different hydrolysable groups as a precursor is effective in order to simultaneously control crystallinity and purity of the hydrolysate.

The tin compound (P1) of the present embodiment may be referred to as "the present tin hydrolysate" for convenience.

Specifically, the present tin hydrolysate (P1) is a tin compound having a tin atom, an organic group R, and at least one of an oxo-ligand and a hydroxo-ligand. In this aspect, each tin atom typically has a ligand (which may be referred to as "substituent") selected from an organic substituent R, an oxo-ligand (Sn—O structure or Sn═O structure), and a hydroxo-ligand (Sn—OH structure). The present tin hydrolysate (P1) may have two or more types of organic group R in one molecule, or one tin atom may have a plurality of types of organic group R. When the tin compound has an organic group R with only single chemical structure, the effect of the present disclosure tends to be more effectively obtained.

The present tin hydrolysate (P1) is typically formed with the above metal and ligand, but may have another metal atom and ligand (substituent) within a range not impairing the properties.

The present tin hydrolysate (P1) is synthesized by hydrolysis of, for example, $RSnX_3$ or $SnX_2Y$ (monoalkyltin compound, which may be referred to as "precursor") as a main raw material using a method disclosed in, for example, JP-A-2021-21953.

Note that X represents a hydrolysable group [substituent that can form an oxo-ligand (Sn—O structure) or a hydroxo-ligand (Sn—OH structure) via a hydrolysis reaction].

Specifically, a tin compound of a tin hydrolysate (P2) represented by the following formula is obtained via a reaction (hydrolysis, condensation, etc.) of $RSnX_3$ or $RSnX_2Y$ with water or another suitable reagent under appropriate conditions. The compound represented by this formula is a compound including RSnOOH and $RSn(OH)_3$, which are hydrolysates of $RSnX_3$ and $RSnX_2Y$, and condensates, and has a tin atom, an organic group, and at least one of an oxo-ligand and a hydroxo-ligand. For example, the tin hydrolysate (P2) includes a compound in which the tin atom having an organic group (and optionally having a hydroxo-ligand) forms a network structure via the oxo-ligand.

(P2)

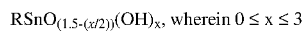

Reaction formulas to yield the tin hydrolysate (P2) are represented as follows. Examples of the reaction formulas using $RSnX_3$ and $RSnX_2Y$ will be respectively described.

(Reaction formula 1)

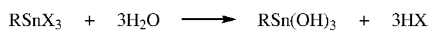

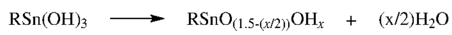

(Reaction formula 2)

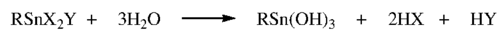

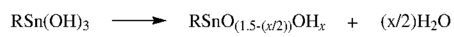

In these reaction formulas, when a precursor including a plurality of hydrolysable groups X and Y in one molecule, such as $RSnX_2Y$, is used, the hydrolysable groups X and Y each have a different rate of reaction with water. As a result, the composition, structure, crystallinity, purity, etc. of the tin hydrolysate generated via the above reaction may be affected. In particular, use of a precursor mixture containing $RSnX_3$ and $RSnX_2Y$ having similar structures can simultaneously perform (Reaction formula 1) and (Reaction formula 2) in the reaction system to form a tin hydrolysate having a more appropriate composition, crystallinity, and purity via a combination of the two reaction formulas.

Via the above reaction, byproducts of HX and HY are present after the hydrolysis, and when these are removed by processes (such as filtering, washing, heating, drying, and evaporating), no unnecessary impurity is left in the tin hydrolysate. Other tin compounds (for example, tin compounds such as $R_2SnX_2$ (A2) and $SnX_4$ (A3)) may similarly affect control of the crystallinity etc., and these tin compounds may change the skeleton, number, etc. of the alkyl group in the tin hydrolysate when incorporated in the obtained tin hydrolysate to cause problems as a resist material (such as impurity deterioration, foreign matter occurrence, increase in outgas, sensitivity deterioration, and increase in roughness). Therefore, $RSnX_2Y$ is preferably used in combination in terms of controlling the composition, structure, crystallinity, etc. of the tin hydrolysate without the aforementioned problems as a resist material.

Among the compounds represented in the present tin hydrolysate (P1), a tin compound having a specific structure and a specific number of tin atoms may be utilized as a high-performance resist material. For example, a compound having a tin dodecamer represented by the following chemical formula (tin hydrolysate (P3)) is a tin dodecamer cluster compound with a stable football shape, and useful as a resist material.

The chemical formula represents a cationic compound represented as follows,

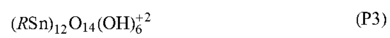 (P3)

wherein "+2" represents being a divalent cation.

The tin hydrolysate (P3), which is typically a divalent cationic compound, has a counter anion (Z) to be stabilized, and a salt combined with the monovalent counter anion (Z) is represented by the following chemical formula.

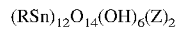

The counter anion (Z) is not particularly limited, and examples thereof include OH anion, $RCO_2$ anion, $HCO_2$ anion, F anion, and Cl anion.

As specific examples of the compound of the tin hydrolysate (P3), synthesis examples described in the following literature is known, for example.

Literature reporting the synthesis of

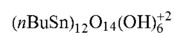

Eychenne-Baron et al., "New synthesis of the nanobuilding block $\{(BuSn)_{12}O_{14}(OH)_6\}^{2+}$ and exchange properties of $\{(BuSn)_{12}O_{14}(OH)_6\}(O_3SC_6H_4CH_3)_2$", *J. Organometallic Chemistry*, 1998, 567, 137-142.

Literature reporting the synthesis of

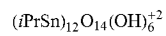

described in Puff et al., "Zur hydrolyse von monoorganylzinn-tri halogeniden (III. Isolierung und Roentgens trukturanalyse von Verbindungen mit dem nueartigen Kaefig-ion

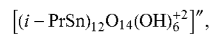

*J. Organometallic Chemistry* 1989, 373, 173-184. These compounds have been identified by NMR, single-crystal X-ray structure, etc., and the analysis results are incorporated in the Examples of the present disclosure as support.

Organic Group R

The tin hydrolysates (P1, P2, P3, the same applies hereinafter) have an organic group R connected to the Sn atom. The organic group R has 1 to 30 carbon atoms.

The number of carbon atoms in the organic group R is not greater than 30 as the upper limit considering the ease of elimination of the R group during EUV exposure and volatilization of the generated component containing the R group. The number is preferably not greater than 20, and more preferably not greater than 10. From the viewpoint of stability of the eliminating component, the lower limit is not less than 1, preferably not less than 2, and more preferably not less than 3.

Examples of the organic group R include a halogenated hydrocarbon group, a hydrocarbon group having a heteroatom such as an oxygen atom and a nitrogen atom, and a hydrocarbon group. These may be used singly or may be used in combination of two or more thereof. Particularly, outgas generated by elimination after exposure when used as a resist is a hydrocarbon, and the organic group R is preferably a hydrocarbon group in terms of a small effect on a semiconductor device. Meanwhile, the organic group R having a heteroatom has higher decomposability with EUV light, which may improve the resist performance, such as sensitivity.

When the organic group R is a hydrocarbon group, preferable specific examples of the hydrocarbon group are described as follows. Examples thereof include: primary alkyl groups such as a methyl group, an ethyl group, an n-propyl group, an n-butyl group, an n-pentyl group, and an n-hexyl group; secondary alkyl groups such as an isopropyl group, an isobutyl group, a sec-butyl group, and an isopentyl group; tertiary alkyl groups such as a t-butyl group, a t-amyl group, a cyclopentyl group, a cyclohexyl group, a methylcyclopentyl group, and a methylcyclohexyl group; aromatic hydrocarbon groups such as aryl groups such as a phenyl group, a tolyl group, a benzyl group, and a naphthyl group and aralkyl groups such as a phenethyl group, an α-methylbenzyl group, and a 2-phenyl-2-propyl group; alkenyl groups such as a vinyl group, a 1-propenyl group, an allyl group, and a 3-butenyl group; and alkyl groups substituted with a halogen atom such as a 2-fluoroethyl group and a 2-iodoethyl group.

Examples of the structure further include the following compounds, where $R^a$ and $R^b$ represent an organic group having 1 to 10 carbon atoms. Examples of the organic group R include a halogenated hydrocarbon group, a hydrocarbon group having a heteroatom such as an oxygen atom and a nitrogen atom, and a hydrocarbon group, and these may be used singly or in combination of two or more thereof. In terms of effectively exhibiting the effect of the present disclosure, only one type thereof is preferably used. Particularly, outgas generated by elimination after exposure when used as a resist is a hydrocarbon, and the organic group R is preferably a hydrocarbon group in terms of a small effect on a semiconductor device. The substituent A on the aromatic ring is a halogen atom or an organic group having 1 to 10 carbon atoms. Examples of such an organic group include a hydrocarbon group having a heteroatom such as a nitrogen atom, and a hydrocarbon group, and a hydrocarbon group is particularly preferable.

R =

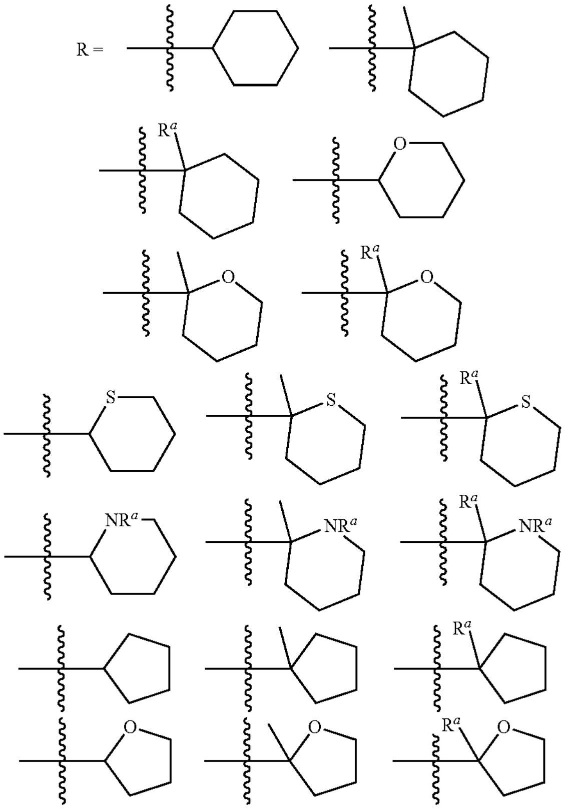

-continued

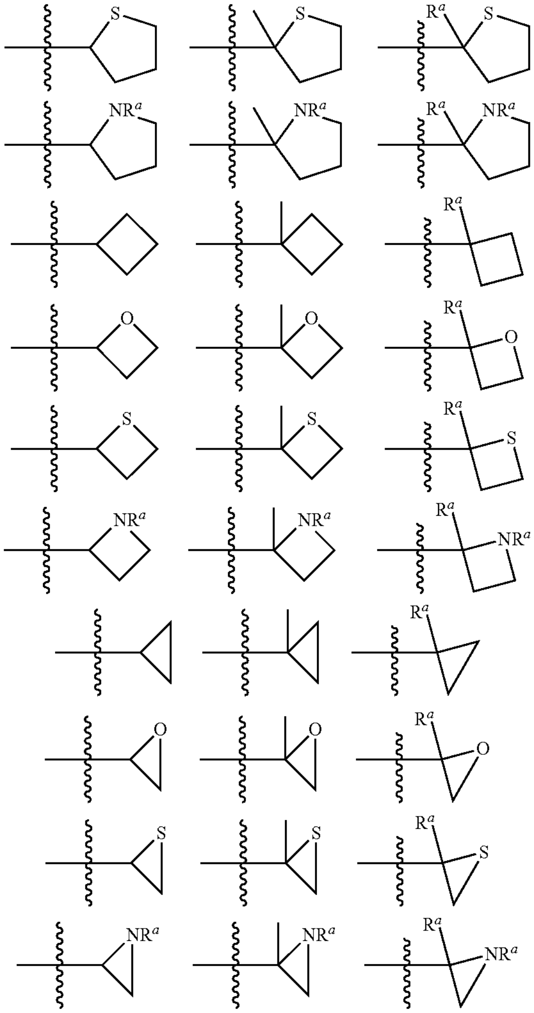

R =

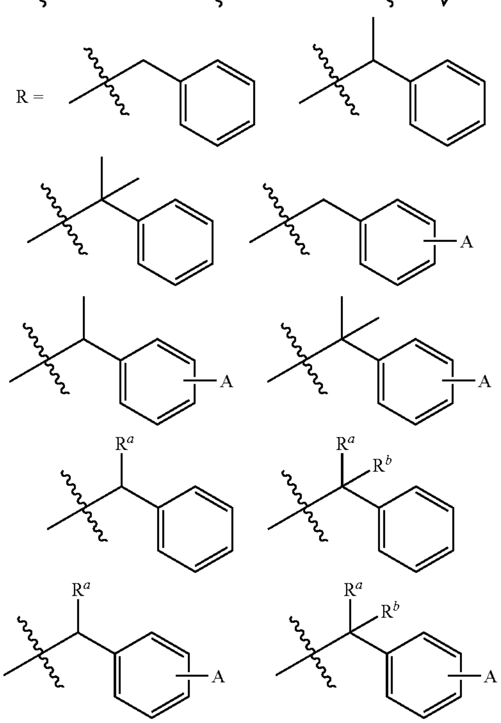

-continued

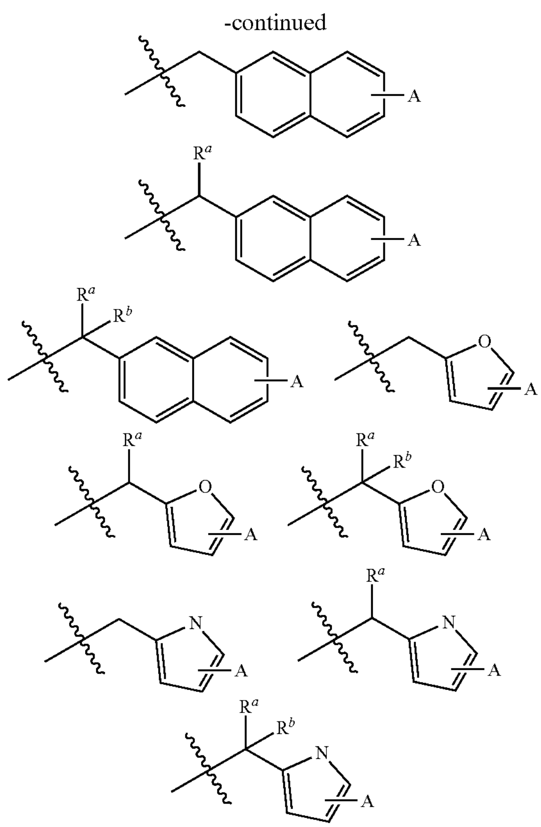

(Preferable Hydrocarbon Group)

The hydrocarbon groups described above are classified as primary hydrocarbon groups $R^1$, secondary hydrocarbon groups $R^2$, and tertiary hydrocarbon groups $R^3$, or classified as saturated hydrocarbon groups such as cyclic hydrocarbon groups $R^c$ and unsaturated hydrocarbon groups. These may exhibit different properties when used as a resist material. The hydrocarbon group is preferably a saturated hydrocarbon group from the viewpoint of sensitivity (light reactivity). In each classification, examples of a preferable substituent include primary hydrocarbon groups $R^1$, secondary hydrocarbon groups $R^2$, and tertiary hydrocarbon groups $R^3$. From the viewpoint of sensitivity (light reactivity) when used for an EUV resist, the secondary hydrocarbon groups $R^2$ and the tertiary hydrocarbon groups $R^3$, which are easily eliminated, are preferable, and the tertiary hydrocarbon groups $R^3$ are further preferable. The tertiary hydrocarbon groups $R^3$ can mostly increase hydrophobicity near the tin atom from the viewpoint of hydrophobicity, and thus the tertiary hydrocarbon groups $R^3$ are preferable from the viewpoint of controlling the solubility. If the hydrophobicity is excessively high, the secondary hydrocarbon groups $R^2$ are preferable in some cases.

Composition Analysis of The Present Tin Hydrolysate

As for the present tin hydrolysate, a composition of the contained substituent can be analyzed with analysis devices such as NMR ($^1$H-NMR, $^{13}$C-NMR, $^{119}$Sn-NMR, and correlation NMR thereof) and mass analysis (mass spectrometry). With NMR, the composition of the entire sample can be analyzed. For example, information on the ligand (substituent R etc.) of the tin atom, the number of coordinations per tin atom, etc. can be analyzed. In addition, the structure of the substituent R can be identified, and an average composition of the substituent R in the sample can be quantified.

A ratio (k1/k2) in $^{119}$Sn-NMR of the present tin hydrolysate, wherein a total value (k1) of peak integration values of a pentavalent Sn (−250 to −350 ppm) and a total value (k2) of peak integration values of a hexavalent Sn (−450 to −600 ppm), is preferably 0.5 to 2.5, more preferably 1.0 to 2.4, further preferably 1.2 to 2.3, and particularly preferably 1.3 to 2.2. In the present tin hydrolysate, the pentavalent Sn tends to have an OH group, and the hexavalent Sn tends to have only an Sn—O—Sn bond and no OH bond due to a larger number of coordinating portions. That is, it can be said that a higher value of k1/k2 indicates a larger amount of OH groups, and a lower value indicates a smaller amount of OH groups. The number of OH groups changes the polarity of the tin compound, which relates to solubility in the resist solvent, and parameters of hydrophobicity and hydrophilicity of the tin compound, which relate to the resist performance. From the viewpoint of controlling the performance balance, k1/k2 is preferably controlled within the above range.

From a molecular weight of an ion observed in mass spectrometry (MS), the molecular weight of the compound contained in the tin compound and its molecular formula can be determined. Specifically, electron-spray ionization method (ESI-mass) is preferable from the viewpoint of sensitivity and detection capability of an unstable compound by the soft ionization. That is, the average composition of the entire sample is observed by NMR, and in contrast, the composition of the organic group R observed by mass analysis represents the composition of organic group R contained in one molecule. In addition, the largest amount of the organic group R contained in one molecule can be detected by quantifying the intensity of each peak. Examples of these analysis will be exemplified in the section of Examples.

(Purity of The Present Tin Hydrolysate)

A calculation method of purity (of the tin hydrolysate) by NMR will be described below. Here, "mol %" representing the purity in terms of tin atom refers to a proportion of the number of tin atoms of the target compound among the number of tin atoms of all compounds having a tin atom (including an unidentified compound). Practically, the proportion is calculated by $^{119}$Sn-NMR with a total of integration values of all observed peaks as the denominator and an integration value of a peak of the target compound as the numerator. Note that the measurement range of $^{119}$Sn-NMR is a range of 1000 to −1000 ppm, which is a range that sufficiently measures the compound of this analysis target. For example, representing the purity of a tin hydrolysate containing pentavalent Sn and hexavalent Sn is a value of (k1+k2)/(k3) when a total value of the total integration value (k1) of peaks of pentavalent Sn (−250 to −350 ppm) in $^{119}$Sn-NMR and a total integration value (k2) of peaks of hexavalent Sn (−450 to −600 ppm) is (k1+k2), and a total value of all integration values of other peaks detected from $^{119}$Sn-NMR (within the range of 1000 to −1000 ppm, including k1 and k2) is (k3). A larger number of this ratio is preferable because of a low concentration of impurities other than the pentavalent Sn and the hexavalent Sn in the present tin hydrolysate. A lower limit thereof is preferably not less than 0.7, more preferably not less than 0.8, further preferably not less than 0.9, particularly preferably not less than 0.95, and most preferably not less than 0.99. From the viewpoint of measurement sensitivity of this method, a case where the corresponding peak other than k1 and k2 cannot be detected can be regarded as not less than 0.99. The upper limit is 1.

According to this calculation method, only the compound having a tin atom is the calculation target. For example, a case where the present tin hydrolysate is produced and then an additive or a solvent is added according to each use is within the scope of the present tin hydrolysate even when the present tin hydrolysate and a tin compound, which is another impurity, are contained as long as the present tin hydrolysate is contained.

For the analysis method of $^{119}$Sn-NMR, the present tin hydrolysate is dissolved at a high concentration (using a solvent to dissolve the present tin hydrolysate at a high concentration) in order to improve sensitivity, and the results are obtained by using a large number of scans (not less than 1000 times, preferably not less than 10000 times) for analysis, a sufficient relaxation time (not less than 1 second), reverse-gate decoupling, and an appropriate measurement range (1000 to −1000 ppm). As a result, the detection limit for a tin compound contained in a trace amount can reach 0.01 mol % by using these methods. In addition, even when the sensitivity of the measured peak is insufficient, use of a highly sensitive NMR (for example, use of 600-MHz NMR with a cryoprobe) can further improve the detection sensitivity to 0.001 mol %. Examples of these analysis will be exemplified in the section of Examples.

Crystallinity of The Present Tin Hydrolysate

The present tin hydrolysate is preferably a solid, particularly when used for forming a thin film as a resist material which has resistance against semiconductor processes (exposure, development, and etching) etc. Specifically, regulating properties of the solid, namely, granular shape, shape, crystallinity, and surface state, within specific ranges may be preferable when the tin hydrolysate is to be used as a resist material. The crystallinity is particularly important in terms of controlling solubility (which contributes to development performance, coating performance, ease of filtering process, and storage stability of a resist solution) and the surface state of the solid (which contributes to hydrophobicity and hydrophilicity, substrate adhesiveness, etc.) while retaining the properties derived from the chemical formula. In addition, the crystallinity also affects adhesiveness when applied on a substrate, roughness and tendency of pattern collapse after exposure, solubility during development, etc., and thereby the crystallinity needs to be appropriately regulated within a required range for desirable resist performance. Specifically, excessively high crystallinity causes difficulty in dissolution in the resist solvent, and causes problems in processes such as dissolution, filtration, and storage. In coating and drying, excessively high crystallinity may cause pattern cracking or collapse at an interface between the crystals or the surface of the crystal. In exposure or development, high crystallinity to increase crystal size may increase roughness of the pattern after development. Meanwhile, excessively low crystallinity causes poor adhesiveness to a substrate and low strength of a resist film, and thereby excessively low crystallinity may cause peeling of a resist film during coating, drying, exposure, development, etc., collapse of the pattern, and increase in roughness on the pattern after development, etc. As above, there is an appropriate range of crystallinity for a resist material having excellent solubility, adhesiveness, and roughness, and thereby the crystallinity needs to be regulated within a specific crystallinity range by appropriately regulating the ratio between the crystal component and an amorphous component.

As an analysis method of the crystallinity, analysis by X-ray diffraction measurement (XRD) may be performed, and may be applied for the cases of powder, formed article, thin film, patterned thin film after exposure, etc. of the present tin hydrolysate. Among values obtained from XRD, the value of a diffraction angle 2θ (°) at the strongest intensity peak, the value of a half-value width (°) of the strongest intensity peak, and the number of detected peak tops may be used as values indicating the crystallinity of the tin compound. The analysis precision described in the present Examples is effective up to a value with two decimal places, and in comparison between the diffraction angle 2θ (°) and the half-value width (°), a value of not less than 0.01 (°) can be regarded to be significant. A specific measurement method will be described in the Examples.

The diffraction angle 2θ (°) at the strongest intensity peak of the present tin hydrolysate is preferably 5.00 to 15.00°, and the upper limit is more preferably not greater than 13.00°, further preferably not greater than 11.00°, particularly preferably not greater than 10.00°, and especially preferably not greater than 9.00°. The lower limit is more preferably not less than 5.50°, more preferably not less than 5.80°, and particularly preferably not less than 6.00°. The diffraction angle 2θ (°) at the strongest intensity peak correlates to a lattice spacing of the crystal. In the present tin compound having a diffraction angle 2θ (°) within the above preferable range, the crystals are arranged with an appropriate lattice spacing, and the crystals have appropriate crystallinity and strength in patterning to achieve both inhibition of pattern collapse and reduction in roughness in fine patterning.

A range of the half-value width (°) of the strongest intensity peak is preferably 1.00 to 4.00°, and the upper limit is more preferably not greater than 3.50°, particularly preferably not greater than 3.00°, especially preferably not greater than 2.50°, and especially further preferably not greater than 2.00°. The lower limit is more preferably not less than 1.05°, further preferably not less than 1.10°, particularly preferably not less than 1.20°, particularly preferably not less than 1.43°, and especially preferably not less than 1.50°. The half-value width (°) of the strongest intensity peak strongly correlates specifically to the crystallinity of the tin compound. The half-value width (°) within the above preferable range may regulate parameters such as solubility (which contributes to development performance, coating performance, ease of filtering process, and storage stability of a resist solution) and the surface state of the solid (which contributes to hydrophobicity and hydrophilicity, substrate adhesiveness, etc.), which are required as the aforementioned resist material, within appropriate ranges.

In the diffraction angle 2θ (°), the number of peak tops detected within a range of 5.00 to 15.000 is preferably not greater than five, preferably not greater than three, preferably not greater than two, and particularly preferably not greater than one. The lower limit is preferably not less than one. Note that a number of zero indicates a situation when no peak top is detected by the above analysis method. As the present tin hydrolysate, a lower number of peak tops tends to indicate lower crystallinity, and zero peak tops indicates that completely no crystal structure is detected. That is, the number of the peak tops within the above preferable range exhibits appropriate crystallinity, and can regulate parameters such as solubility (which contributes to development performance, coating performance, ease of filtering process, and storage stability of a resist solution) and the surface state of the solid (which contributes to hydrophobicity and hydrophilicity, substrate adhesiveness, etc.), which is required as the resist material, within appropriate ranges.

Solubility of The Present Tin Hydrolysate

When used as a resist material, the present tin hydrolysate is dissolved in a resist solvent to form a resist solution in some cases. The solubility of the present tin hydrolysate refers to solubility for dissolution in an organic solvent used for preparing a resist solution. In a resist solution after dissolution, it is preferable that the present tin hydrolysate be completely dissolved without an insoluble material or cloudiness derived from the present tin hydrolysate. The insoluble material derived from the present tin hydrolysate causes performance deterioration and troubles when used as the resist material. Specific examples thereof include a defect to be formed in patterning to deteriorate performance as a resist material (leading to line width roughness (LWR), pattern collapse, and sensitivity deterioration), device contamination due to occurrence of an impurity and a foreign matter in etching, and clogging and productivity deterioration in filtering process.

(Resist Solvent)

The present tin hydrolysate is dissolved in a resist solvent, and examples of the resist solvent include organic solvents, for example, alcohols, esters, and a combination thereof. Specifically, examples of appropriate solvents include a mixture of aromatic compounds (for example, xylene and toluene), ethers (anisole and tetrahydrofuran), halogen solvents (dichloromethane and chloroform), esters (propylene glycol monomethyl ether acetate, ethyl acetate, and ethyl lactate), alcohols (for example, 4-methyl-2-pentanol, 4-methyl-2-propanol, 1-butanol, methanol, isopropyl alcohol, and 1-propanol), and ketones (for example, methyl ethyl ketone, cyclohexanone, and 2-heptanone). These may be used singly or in combination of two or more thereof. Among these, alcohol solvents are preferable for dissolving a tin hydrolysate having an OH group, and 4-methyl-2-pentanol is more preferable. From the viewpoints of toxicity, legal regulation, and volatility, 2-heptanone, 4-methyl-2-pentanol, and ethyl lactate are preferable solvents in a practical production process.

These resist solvents may be selected based on physical properties of the solvent itself such as a solubility parameter, degree of volatility, flammability, toxicity, and viscosity. Meanwhile, a resist solvent may be evaluated for stability (dissolution stability) in a state when the tin hydrolysate or other materials are dissolved in the resist solvent. That is, after dissolving and mixing the components of a resist solution, particularly from preparing the solution to forming a film, properties of the dissolved tin hydrolysate may change due to a result of partial interactions (reaction, condensation, solvation, coordination, etc.) between the tin hydrolysate and the solvent. The solution stability due to these interactions is evaluated as storage stability of the resist solution, described later. From the viewpoint of storage stability and from the viewpoint of stabilization with coordination with the OH group, alcohol solvents are preferable.

(Method for Evaluating Solubility)

The solubility of the present tin hydrolysate is evaluated by comparing turbidity (transparency) when the tin hydrolysate is dissolved in 4-methyl-2-pentanol at a certain concentration. The specific method, which is disclosed in JP-A-2019-500490, is as follows: preparing a mixed liquid of the tin hydrolysate in 4-methyl-2-pentanol equivalent to 2.0 mass %, and visually observing turbidity (transparency) of this liquid by comparison with a standard turbidity liquid to evaluate the solubility of the corresponding present tin hydrolysate. As the standard turbidity liquid, a kaoline-turbidity standard liquid described in JIS K0110 (0 degrees (transparent), 50 degrees, 100 degrees, 500 degrees, or 1000 degrees (white turbid)) is used, and a turbidity close to each of the standard turbidity liquids is evaluated as turbidity evaluation 1 to 5 as follows.

Turbidity evaluation 1: 0 degrees (transparent)

Turbidity evaluation 2: 50 degrees

Turbidity evaluation 3: 100 degrees

Turbidity evaluation 4: 500 degrees

Turbidity evaluation 5: 1000 degrees (white turbid)

Storage Stability of Resist Solution

A resist solution produced by dissolving the present tin hydrolysate is required to be stable without stirring, while no precipitation or sedimentation of solid occurs in a term of at least one week, preferably not less than two weeks, more preferably not less than one month, further preferably not less than three months, and particularly preferably not less than six months. As a specific method for evaluating the storage stability, the above solution sample is stored at 20° C., and turbidity is similarly evaluated after one week, two weeks, and one month after dissolution. As a stably storable resist solution, change in turbidity in this evaluation is preferably absent.

<<Raw Material of The Present Tin Hydrolysate>>

For producing the present tin hydrolysate as noted above, monoalkyltin compounds (A1) and (B1) described below are preferably used as a raw material (which may be referred to as "precursor"), but not particularly limited thereto. Hereinafter, the monoalkyltin compounds (A1) and (B1) usable as the precursor will be described.

<Monoalkyltin Compound (A1)>

The monoalkyltin compound (A1) is defined as follows. The monoalkyltin compound (A1) is a compound in which one organic group and three hydrolysable groups X that can undergo a reaction such as hydrolysis are bonded to tetravalent tin. Specifically, the monoalkyltin compound (A1) is represented by the following general formula (A1).

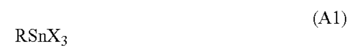

In the general formula (A1), R represents an organic group having 1 to 30 carbon atoms. X is selected from OR', $NR'_2$, and C≡CR'. R' represents an organic group having 1 to 10 carbon atoms. When a plurality of R' are present in the molecule, the plurality of R' may have structures different from each other and may be bonded to each other to form a cyclic structure.

Organic Group R

The organic group R has 1 to 30 carbon atoms. Examples of the organic group R include a halogenated hydrocarbon group, a hydrocarbon group having a heteroatom such as an oxygen atom and a nitrogen atom, and a hydrocarbon group. These may be used singly or may be used in combination of two or more thereof, and are preferably used singly in terms of effectively exhibiting the effect of the present disclosure. Particularly, outgas generated by elimination after exposure when used as a resist is a hydrocarbon, and the organic group R is preferably a hydrocarbon group in terms of a small effect on a semiconductor device. The organic group R having a heteroatom has higher decomposability with EUV light, which may improve resist performance such as sensitivity.

The number of carbon atoms in R is not greater than 30 as the upper limit when considering ease of elimination of the R group during EUV exposure and volatilization of a generated R-group component. The number is preferably not greater than 20, and more preferably not greater than 10. From the viewpoint of stability of the eliminating component, the lower limit is not less than 1, preferably not less than 2, and more preferably not less than 3.

Outgas generated from elimination after exposure when used as a resist is a hydrocarbon, and the organic group R is preferably a hydrocarbon group in terms of a small effect on a semiconductor device. Specific examples of the preferable hydrocarbon group include: alkyl groups such as a methyl group, an ethyl group, a propyl group, an isopropyl group, a butyl group, an isobutyl group, a sec-butyl group, a t-butyl group, a pentyl group, a hexyl group, a cyclopentyl group, and a cyclohexyl group; aromatic hydrocarbon groups such as aryl groups such as a phenyl group, a tolyl group, a benzyl group, and a naphthyl group and aralkyl groups such as a phenethyl group, an α-methylbenzyl group, and a 2-phenyl-2-propyl group; alkenyl groups such as a vinyl group, a 1-propenyl group, an allyl group, and a 3-butenyl group; and alkyl groups substituted with a halogen atom such as a 2-fluoroethyl group and a 2-iodoethyl group. These may be used singly, or in combination of two or more thereof.

Examples of the structure further include the following compounds. In the figures, $R^a$ and $R^b$ represent an organic group having 1 to 10 carbon atoms. Examples of such an organic group include a halogenated hydrocarbon group, a hydrocarbon group having a heteroatom such as an oxygen atom and a nitrogen atom, and a hydrocarbon group. The substituent A on the aromatic ring is a halogen atom or an organic group having 1 to 10 carbon atoms. Examples of such an organic group include a hydrocarbon group having a heteroatom such as an oxygen atom and a nitrogen atom, and a hydrocarbon group.

R =

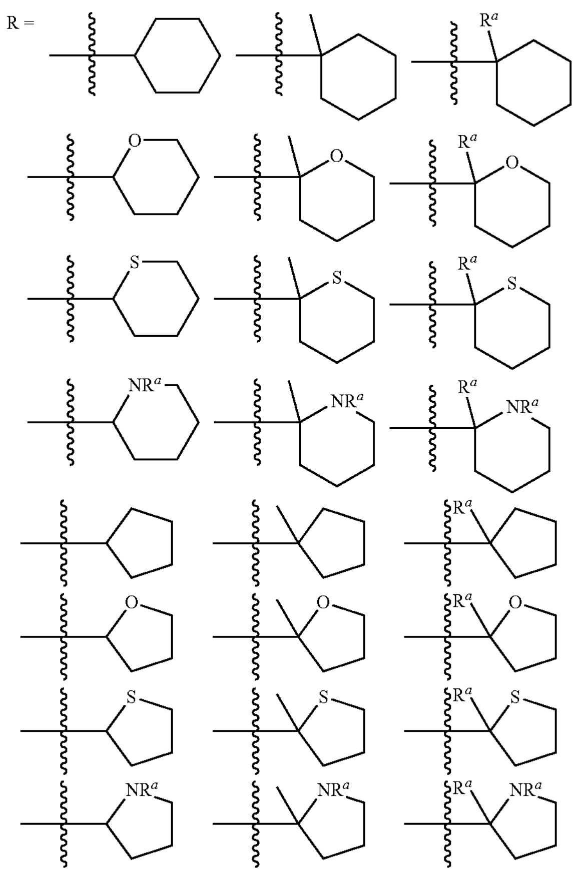

-continued

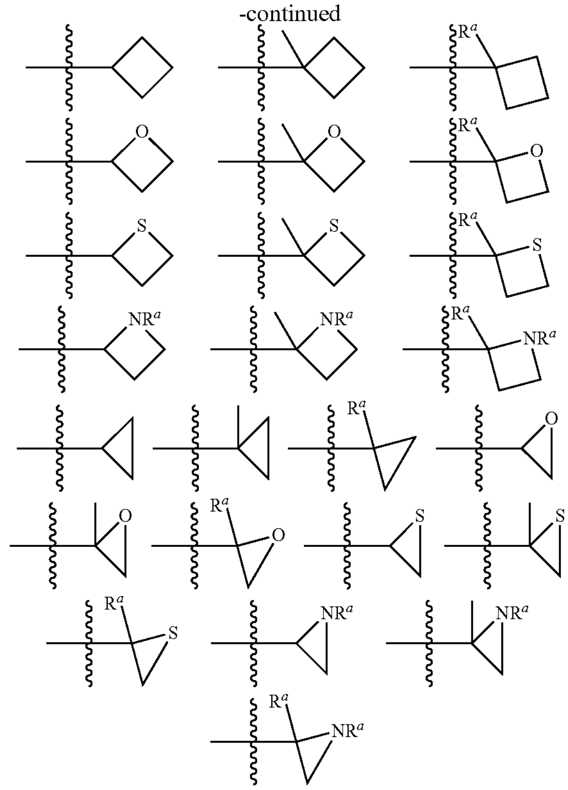

R =

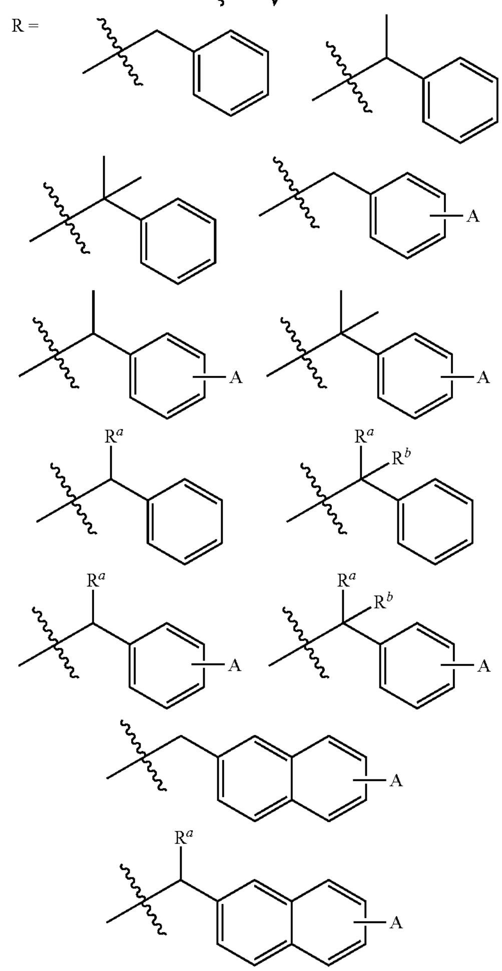

-continued

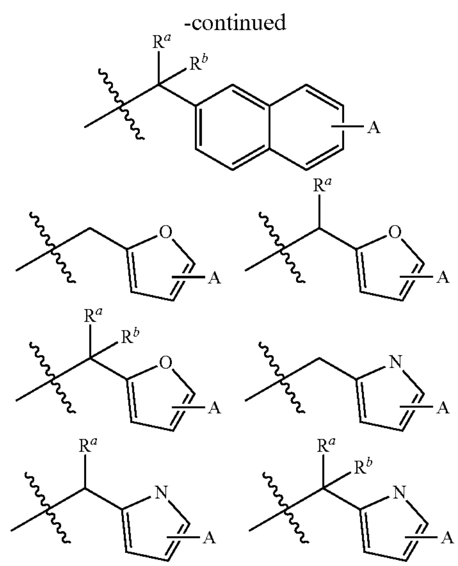

The hydrocarbon groups represented above are classified into primary hydrocarbon groups $R^1$, secondary hydrocarbon groups $R^2$, and tertiary hydrocarbon groups $R^3$, and are typically alkyl groups or aralkyl groups. Preferable examples of each classification include: primary hydrocarbon groups $R^1$: a methyl group, an ethyl group, an n-propyl group, an n-butyl group, an isobutyl group, a benzyl group, and a phenethyl group; secondary hydrocarbon groups $R^2$: an isopropyl group, a sec-butyl group, a cyclopentyl group, a cyclohexyl group, a cycloheptyl group, and an α-methylbenzyl group; and tertiary hydrocarbon groups $R^3$: a t-butyl group, a t-amyl group, a 1-methyl-cyclopentyl group, a 1-methyl-cyclohexyl group, and a 2-phenyl-2-propyl group. Each of the groups may exhibit a different property when used as a resist material. Hereinafter, the description will be made with the hydrocarbon groups as a representative example. From the viewpoint of sensitivity (light sensitivity) when using each as preferable EUV resists, secondary hydrocarbon groups $R^2$ and tertiary hydrocarbon groups $R^3$, which are easily eliminated, are preferable. Although tertiary hydrocarbon groups $R^3$ are preferable from the viewpoint of hydrophobicity and the viewpoint of controlling solubility due to the ability to mostly increase hydrophobicity near the tin atom, secondary hydrocarbon groups $R^2$ may be preferable if the hydrophobicity is excessively high. From the viewpoint of thermal stability that causes influence in distillation etc., primary hydrocarbon groups hardly cause disproportionation and may be easily purified. Meanwhile, secondary and tertiary hydrocarbon groups easily cause a disproportionation reaction, and secondary and tertiary hydrocarbon groups having a low number of carbon atoms (not greater than 6 carbon atoms) are unstable in distillation, and it is often difficult to perform distillation having high purification efficiency due to pyrolysis etc. Thus, it is more important to obtain a highly pure tin compound with a low content of byproducts having close boiling points in the reaction stage, which is prior to purification such as distillation.

Substituent X

The substituent X may have any structure as long as it is a hydrolysable group that can be subjected to a reaction such as hydrolysis. Specific example thereof preferably include OR', NR'$_2$, and C≡CR' in terms of high reactivity, and OR' and NR'$_2$ are more preferable from the viewpoint of the reactivity of hydrolysis. R' represents an organic group having 1 to 10 carbon atoms, and examples of the organic group include a halogenated hydrocarbon group, a hydrocarbon group having a heteroatom such as an oxygen atom and a nitrogen atom, and a hydrocarbon group. When a plurality of R' are present in the molecule, the plurality of R' may have different structures from each other, and may be bonded to each other to form a cyclic structure. Among these, OR' preferably represents an alkoxy group and NR'$_2$ preferably represents an alkylamino group in terms of balance between high reactivity of the hydrolysis and stability in synthesis.

Specific examples of the organic group R' include a methyl group, an ethyl group, a propyl group, an isopropyl group, a butyl group, an isobutyl group, a sec-butyl group, a t-butyl group, a t-amyl group, a 2-methyl-pentyl group, a trifluoroethyl group, and a trifluoromethyl group. Examples of NR'$_2$ include a 1-pyrrolidinyl group in which two substituents on nitrogen are bonded to form a five-membered ring.

The substituent X is preferably an alkyl group having no heteroatom or an alkyl group having fluorine from the viewpoints of low boiling point and stability as the organic group R'. The number of carbon atoms is preferably low from the viewpoint of low boiling point, and the number of carbon atoms is preferably high from the viewpoint of thermal stability and stability against moisture. Specific examples of the substituent X with an excellent balance of these properties include: OR': a t-butoxy group, a t-amyloxy group, a 4-methyl-2-pentaloxy group, a trifluoroethoxy group, and a trifluoromethoxy group; and NR'$_2$: a dimethylamino group, a diethylamino group, a methylethylamino group, and a pyrrolidyl group. Among these, OR' is preferable from the viewpoint of reactivity of the hydrolysis when used as a resist material, and specifically, a diethylamino group and a diethylamino group are most preferable. NR'$_2$ is preferable in terms of balance between stability and reactivity, and specifically a t-butoxy group, a t-amyloxy group, and a 4-methyl-2-pentaloxy group are most preferable.

R and the organic group contained in the substituent X in the molecule may be bonded to each other to form a cyclic structure. Examples of the cyclic structure in this case include compounds having a structure represented as follows.

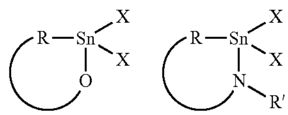

Structure of Monoalkyltin Compound (A1)

The monoalkyltin compound (A1) (hereinafter, which may be referred to as "tin compound (A1)" may have any structure and physical properties within the above range. When used as an EUV resist material, the tin compound (A1) may preferably have the following physical properties.

(Boiling Point)

The boiling point of the tin compound (A1) is preferably not higher than 300° C., more preferably not higher than 250° C., further preferably not higher than 200° C., and particularly preferably not higher than 150° C. at 1 torr. A lower limit of the boiling point at 1 torr is typically not lower than 0° C., preferably not lower than 10° C., and more preferably not lower than 20° C. The low boiling point enables distillation at low temperature, and is preferable from the viewpoint of ease of vapor deposition when used as a resist material. The boiling point of not less than the lower limit tends to facilitate processes with vapor deposition and reaction at high temperature when used as an EUV resist and tends to inhibit volatilization or scattering of components and outgas due to excellent thermal stability of the film to be formed.

(Molecular Weight)

The molecular weight of the tin compound (A1) is preferably not greater than 500, more preferably not greater than 400, and further preferably not greater than 350. The lower limit is preferably not less than 150, more preferably not less than 180, and further preferably not less than 200. An excessively high molecular weight causes excessively high boiling point, and it may be difficult to perform vapor deposition etc. when using it as an EUV resist. An excessively low molecular weight causes an excessively low boiling point, and it may be difficult to perform the process with vapor deposition and reaction at high temperature, and volatilization or scattering of components and outgas may be problematic due to insufficient thermal stability of the film to be formed.

(Difference in Molecular Weight of Organic Group R and Substituent X)

A difference between the molecular weights of the organic group R and the substituent X is not particularly limited, and is preferably not greater than 50, more preferably not greater than 30, further preferably not greater than 20, particularly preferably not greater than 10, and especially preferably not greater than 6. The lower limit is 0. Reducing the difference between the molecular weights of R and X reduces the difference in mass of outgases generated when using it as a resist, which tends to facilitate condition setting in the EUV process. To regulate EUV sensitivity and the boiling point of the tin compound, the substituent may be changed to regulate the differences between the molecular weights.

Meanwhile, as described later, a smaller difference between the molecular weights of R and X reduces the difference between the molecular weights of the tin compound (A1) and the impurity, which may cause more difficulty in purification.

<Tin Compound (B1)>

One aspect of the present disclosure is a tin compound (B1), $RSnX_2Y$ The tin compound (B1), $RSnX_2Y$, is defined as follows. The tin compound (B1) is a compound in which one organic group R, two hydrolysable groups X that can undergo a reaction such as hydrolysis, and one hydrolysable group Y are bonded to tetravalent tin. Specifically, the tin compound is represented by the following general formula (B1).

(B1)

In the general formula (B1), R represents an organic group having 1 to 30 carbon atoms. Examples of the organic group include a halogenated hydrocarbon group, a hydrocarbon group having a heteroatom such as an oxygen atom and a nitrogen atom, and a hydrocarbon group, and these may be used singly or in combination of two or more thereof. Particularly, outgas generated by elimination after exposure when used as a resist is a hydrocarbon, and the organic group is preferably a hydrocarbon group in terms of a small effect on a semiconductor device. X and Y represent hydrolysable groups having chemical formulas different from each other. X is selected from OR', $NR'_2$, and C≡CR', and Y is selected from OR', $NR'^{Y}_2$, and C≡CR'$^{Y}$. R' and R'$^{Y}$ represent an organic group having 1 to 10 carbon atoms. Examples of the organic group include a halogenated hydrocarbon group, a hydrocarbon group having a heteroatom such as an oxygen atom and a nitrogen atom, and a hydrocarbon group, and these may be used singly or in combination of two or more thereof. Among these, a hydrocarbon group is preferable. When X is $NR'_2$ and/or Y is the $NR'^{Y}_2$, R' and R'$^{Y}$ may be same as or different from each other. When a plurality of R' and R'$^{Y}$ are present in the molecule, they may be different from each other, and may be bonded to form a cyclic structure.

An object in the above aspect is to provide a high-performance resist material that can have particularly high purity and uniform solubility. To achieve this object, it has been found that, when $RSnX_3$ is used as a precursor, blending a tin compound $RSnX_2Y$ can inhibit crystallinity of the hydrolysate without deterioration of the precursor purity. In addition, it has been found that, when a tin compound $RSnX_2Y$ is blended, an amount of the tin compound $RSnX_2Y$ may be a trace amount or a blending amount. Further, it has been found that $RSnX_2Y$ itself is also useful as the precursor.

The preferable structure of the substituent Y is same as the structure described as the preferable substituent X, but a combination with a specific substituent X may be effective. Such a combination will be described below.

The tin compound (B1) is formed with two hydrolysable groups that can undergo a reaction such as hydrolysis and one hydrolysable group Y, and thereby the tin compound (B1) can undergo hydrolysis at an inequivalent rate. In addition, regulating a method for hydrolysis can control reaction of the specific substituent X and/or Y with priority. Examples of a preferable combination of the substituent X and the substituent Y include the following four.

(1) A case where the hydrolysable groups X and Y are respectively $NR'_2$ and $NR'^{Y}_2$,
  wherein the substituent $NR'_2$ of X and the substituent NR' 2 of Y are different chemical formulas.

(2) A case where the hydrolysable groups X and Y are respectively OR' and OR'$^{Y}$,
  wherein the substituent OR' of X and the substituent OR'$^{Y}$ of Y are different chemical formulas.

(3) A case where, as the substituents X and Y, X is the substituent $NR'_2$ and Y is the substituent OR'$^{Y}$.

(4) A case where, as the substituents X and Y, X is the substituent OR' and Y is the substituent $NR'^{Y}_2$.

As the tin compound of the (1), X is preferably $NR'_2$ and Y is preferably $NR'^{Y}_2$ from the viewpoints of extremely high reaction rate of hydrolysis and a small difference in the reaction rates of X and Y As a preferable structure, R' preferably represents a methyl group or an ethyl group, which is a small alkyl group, from the viewpoint of a reaction rate of hydrolysis. A case when R' in one substituent on N is same as R' contained in X, as shown in a case where X represents $NR'_2$ and Y represents N(R')(CHNR'$_2$), is preferable in terms of regulation of the difference in the reaction rates of X and Y in hydrolysis.

In addition, a structure N(R')($CH_2$NR'$_2$) is preferable because, after eliminating the tin atom by hydrolysis, the structure causes further hydrolysis and decomposition into an easily removable low molecule compound. A specific structure corresponding to the present tin compound is the following structure, for example.

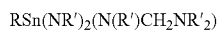

$RSn(NR')_2(N(R')CH_2NR'_2)$

Note that $iPrSn(NMe_2)_2(NMeCH_2NMe_2)$ has the following chemical shifts of a $^{119}Sn$-NMR spectrum and $^1H$-NMR, and can be identified and quantified.

$^{119}Sn$-NMR (223.8 MHz; C6D6):δ−82 ppm.

$^1H$-NMR (600 MHz; C6D6):δ 3.37 (s, 2H, $CH_2$), 2.89 (s, 3H, Sn—NMe), 2.86 (s, 12H, Sn—$(NMe_2)_2$), 2.15 (s, 6H, $NMe_2$), 1.68 (m, 1H, iPr), 1.33 (s, 6H, iPr).

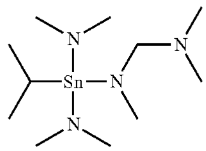 [SMILES: C[CH](C)[Sn]([N](C)C)([N](C)C)[N](C)CN(C)C]

When X represents a dialkylamino group ($NR'_2$) (here, $R'_2$ is selected from a methyl group, a primary alkyl group, or a secondary alkyl group), the mechanism of generating the aforementioned compound $RSn(NR')_2(N(R')CH_2NR'_2)$ is unclear but it is structurally presumed that a nitrogen radical ($NR'_2$) generated by eliminating one of three dialkylamino groups in the tin compound (A1) is inserted into a C—H bond adjacent to a nitrogen atom of another close compound (A1). That is, as specifically described in the Examples, the present compound can be produced by decomposition of the tin compound (A1) with heating or light.

The aforementioned compound $RSn(NR')_2(N(R')CH_2NR'_2)$ is represented with R' being a methyl group as a representative example. When R' represents, for example, a primary alkyl group such as an ethyl group (here, R' represents $CH_2R^1$), that is, when the compound (A1) is represented by $RSnN(CH_2R^1)_3$, a compound (A4) is represented by $RSn[N(CH_2R^1)_2]_2[N(CH_2R^1)CHR^1N(CH_2R^1)_2]$.

When R' represents a secondary alkyl group such as an isopropyl group (here, R' represents by $RCHR^2R^3$, that is, when the compound (A1) is represented by $[N(CHR^2R^3)_2]_3$, a compound (A4) is represented by $RSn[N(CHR^2R^3)_2]_2[N(CHR^2R^3)CR^2R^3N(CHR^2R^3)_2]$.

In the tin compound (2), the hydrolysable groups X and Y are respectively preferably OR' and $OR'^Y$ from the viewpoints of high stability and low reaction rate of hydrolysis compared with (1), and a small difference in the reaction rates of X and Y Particularly, each of OR' and $OR'^Y$ preferably represents a secondary alkoxy group (such as an isopropoxy group and a 4-methyl-2-pentanoxy group) or a tertiary alkoxy group (such as a t-butyl group and a t-amyl group) from the viewpoint of stability of the tin compound. Further, OR' and $OR'^Y$ are further preferably a combination of secondary and tertiary alkoxy groups because of an appropriate difference in the hydrolysis rate.

In the tin compound (3), X is preferably a substituent $NR'_2$ and Y is preferably substituent a $OR'^Y$ from the viewpoints of high reaction rate of hydrolysis and a large difference in the reaction rates of X and Y From the viewpoint of improvement of a hydrolysable property of $NR'_2$, R' preferably represents a methyl group or an ethyl group, which is a small alkyl group. $OR'^Y$ preferably represents a secondary alkoxy group (such as an isopropoxy group and a 4-methyl-2-pentanoxy group) or a tertiary alkoxy group (such as a t-butyl group and a t-amyl group) from the viewpoint of stability of the tin compound. In addition, combining these preferable structures of X and Y may broaden the difference between the reaction rates of X and Y.

In the tin compound (4), X is preferably a substituent $OR'_2$ and Y is preferably a substituent $NR'^Y_2$ from the viewpoints of high stability and a low reaction rate of hydrolysis compared with (1), and a large difference in the reaction rates of X and Y. OR' preferably represents a secondary alkoxy group (such as an isopropoxy group and a 4-methyl-2-pentanoxy group) or a tertiary alkoxy group (such as a t-butyl group and a t-amyl group) from the viewpoint of stability of the tin compound. From the viewpoint of improvement of the hydrolysis property of NR' 2, $R'^Y$ preferably represents a methyl group or an ethyl group, which is a small alkyl group. In addition, combining these preferable structures of X and Y may broaden the difference between the reaction rates of X and Y.

[Monoalkyltin Composition Containing Tin Compounds (A1) and (B1)]

Although each of $RSnX_3$ and $RSnX_2Y$ can singly form the tin hydrolysate via hydrolysis, a mixture containing tin compound (A1) and tin compound (B1) is preferably used particularly in order to control the crystallinity without a decrease in the purity of the obtained tin hydrolysate. That is, it is an important point that the tin compound (A1) and the tin compound (B1) have the same organic group R and that the organic group R remaining in the tin hydrolysate after hydrolysis is basically equivalent, which differs from impurities (such as $R_2SnX_2$ (A2) and $SnX_4$ (A3)) contained in a monoalkyltin compound having structure different from the tin compound (B1). That is, when an organic group R with only one single chemical structure is contained in the tin compound, the effect of the present disclosure tends to be obtained more effectively.

The composition containing the tin compounds (A1) and (B1) will be referred to as "monoalkyltin composition (A1B1)."

The specific composition of the monoalkyltin composition (A1B1) containing tin compounds (A1) and (B1) corresponds to the compositions of the tin compounds (A1) and (B1) in the tin hydrolysate.

The composition of tin compounds (A1) and (B1) in the monoalkyltin composition (A1B1) is not particularly limited, but it is preferable that the tin compound (A1) with high purity is a main component, and the tin compound (B1) be further contained from the viewpoint of obtaining a tin hydrolysate with high purity. That is, this composition can achieve control of both the purity and control of the crystallinity of the tin hydrolysate.

Specifically, a content (purity) of the tin compound (A1) in the monoalkyltin composition (A1B1) is preferably 50 to 99.99 mol %, the lower limit is more preferably not less than 55 mol %, further preferably not less than 60 mol %, particularly preferably not less than 65 mol %, and especially preferably not less than 70 mol %. The upper limit is more preferably not greater than 99 mol %, further preferably not greater than 97 mol %, particularly preferably not greater than 95 mol %, and especially preferably not greater than 90 mol %.

Meanwhile, a content (purity) of the tin compound (B1) in the monoalkyltin composition (A1B1) is not less than 0.01 mol % and less than 50 mol %, the lower limit is more preferably not less than 0.1 mol %, further preferably not less than 0.5 mol %, particularly preferably not less than 1 mol %, especially preferably not less than 3 mol %, and further especially preferably not less than 5 mol %. The upper limit is more preferably not greater than 30 mol %, further preferably not greater than 25 mol %, particularly preferably not greater than 20 mol %, and especially preferably not greater than 15 mol %.

From the viewpoint of obtaining a tin hydrolysate having more reduced crystallinity and further higher solubility, it is preferable that the tin compound (B1) is a main component, and the monoalkyltin composition (A1B1) further contains tin compound (A1). Specifically, a content (purity) of the tin compound (B1) in the monoalkyltin composition (A1B1) is preferably 50 to 99.99 mol %, the lower limit is more preferably not less than 55 mol %, more preferably not less than 60 mol %, particularly preferably not less than 65 mol %, and especially preferably not less than 70 mol %.

The upper limit is more preferably not greater than 99 mol %, further preferably not greater than 97 mol %, particularly preferably not greater than 95 mol %, and especially preferably not greater than 90 mol %.

Meanwhile, a content (purity) of the tin compound (A1) in the monoalkyltin composition (A1B1) is preferably not less than 0.01 mol % and less than 50 mol %, the lower limit is more preferably not less than 0.1 mol %, further preferably not less than 0.5 mol %, particularly preferably not less than 1 mol %, especially preferably not less than 3 mol %, and further especially preferably not less than 5 mol %. The upper limit is more preferably not greater than 30 mol %, further preferably not greater than 25 mol %, particularly preferably not greater than 20 mol %, and especially preferably not greater than 15 mol %.

The total value of the contents of the tin compounds (A1) and (B1) in the composition of the monoalkyltin composition (A1B1) is preferably not less than 80 mol %, more preferably not less than 85 mol %, and further preferably not less than 90 mol %. The upper limit is 100 mol %. A sufficiently high total value of the contents of the tin compounds (A1) and (B1) yields the tin hydrolysate with high purity.

<Impurity>

Tin Compounds being Impurities

The monoalkyltin composition (A1B1) according to one embodiment of the present disclosure may contain impurities. Tin compounds, other than tin compounds (A1) and (B1), being impurities are not particularly limited, and examples of tin compounds being representative impurities include the following tin compounds (A2) and (A3). The tin compounds (A2) and (A3) are compounds that are difficult to separate in terms of difficulty in separation with distillation due to structure and boiling point close to those of the tin compound (A1) and in terms of generation due to decomposition of the tin compound (A1) in the reaction, heating, etc.

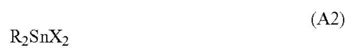

$R_2SnX_2$ (A2)

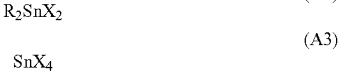

$SnX_4$ (A3)

Particularly when the tin compound (A1) described below and the tin compound (A2) or (A3) have close boiling points, it tends to be difficult to separate with distillation, and inhibition of the reaction and after-treatment is important. When the tin compounds (A2) and (A3) are impurities having close boiling points, it is preferable to reduce the contents of the tin compounds (A2) and (A3) after the reaction. The amount of the tin compounds (A2) and (A3) contained in a synthesized tin compound (crude product) after the reaction is preferably not greater than 3 mol %, more preferably not greater than 2 mol %, further preferably not greater than 1 mol %, particularly preferably not greater than 0.5 mol %, especially preferably not greater than 0.3 mol %, further especially preferably not greater than 0.1 mol %, not greater than 0.05 mol %, or not greater than 0.03 mol %.

(Boiling Point of Impurity)

The boiling point here refers to a boiling point compared at the same pressure, not particularly limited to a normal pressure, specifically at a pressure of performing distillation. A case when a difference between the boiling points are close refers to the difference between the boiling points of the tin compounds (A1) and (A2) being typically not greater than 50° C., preferably not greater than 30° C., more preferably not greater than 10° C., and further preferably not greater than 5° C. The lower limit is 0° C.

When R and X have close molecular weights, the difference between the boiling points may be close or intermolecular interaction may be large, and thereby they may be difficult to separate. A case when R and X have close molecular weights refers to a case of the difference being typically not greater than 30, preferably not greater than 20, more preferably not greater than 10, and further preferably not greater than 5. The lower limit is 0.

As an example, a difference between the molecular weights of $iPrSn(NMe_2)_3$ (A1-1) and $iPr_2Sn(NM_2)_2$ (A2-1) is small (the molecular weights are respectively 294 g/mol and 293 g/mol). The difference is as small as 1 g/mol, and since the isopropyl group and the dimethylamino group have extremely similar polarity, a difference in boiling points between the tin compounds (A1-1) and (A2-1) is extremely small. The boiling points of these compounds were measured, and the difference in boiling points of the two compounds was within 2° C. in a pressure range of 0.7 to 10 torr. That is, distillation having high separation ability is required to obtain the highly pure tin compound (A1-1).

The tin compounds (A1) and a tin compound being a raw material therefor (hereinafter, which may be referred to as "raw material tin compound") (E1) cause a problem of decomposition due to side reactions in the reaction and the subsequent after-treatment step. For example, a disproportionation reaction between the tin compounds (A1) and (E1) as in the following formula may occur, and this reaction is accelerated or inhibited with various reaction conditions.

A decomposition reaction due to light may occur, or the decomposition reaction may be accelerated by light and heat. In addition, the decomposition may be enhanced due to the presence of a slight amount of air, moisture, etc.

(Decomposition of Tin Compound)

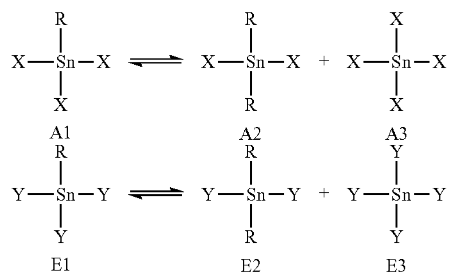

Further, a divalent tin compound, $SnX_2$ (A8), may be contained. When the tin compound (A1) is $RSn(NR_2)_3$, examples thereof include the following tin compound (A8-1).

(A8-1)

$Sn(NR'_2)_2$

A content of the tin compound (A8) is preferably not greater than 1.0 mol %, more preferably not greater than 0.5 mol %, further preferably not greater than 0.1 mol %, and particularly preferably not greater than 0.01 mol % in terms of tin atom content relative to the synthesized tin compound from the viewpoint of a highly pure resist material. The lower limit is 0 mol %.

With some raw materials and producing methods used, impurities such as $R_3SnX$ and $R_4Sn$, which are tin compounds having a larger number of hydrocarbon groups, may be mixed as the impurity.

As an aspect of the present disclosure, the tin compounds may be obtained by using two or more types of monoalkyltin compound and/or by typically hydrolyzing a monoalkyltin compound having two or more types of the organic group R in one molecule as the raw material.

(Mixing Plurality of Types of Organic Group R)

The present tin hydrolysate has an organic group R, and this organic group R may have a plurality of types. For example, the present tin hydrolysate may have two different substituents $R^A$ and $R^B$ as substituents accounting for a major proportion in the organic group R (note that the organic group R in a largest proportion is $R^A$, the organic group in a second largest proportion is $R^B$, and a substituent other than the substituents $R^A$ and $R^B$ may be contained). The organic group R is preferably a hydrocarbon group. The structure of the substituents $R^A$ and $R^B$ is selected within the range of the R, and not particularly limited as long as the structure of $R^A$ and $R^B$ are different. As selection with the range of primary hydrocarbon group $R^1$, secondary hydrocarbon group $R^2$, and tertiary hydrocarbon group $R^3$, the structure of $R^A$ and $R^B$ is preferably selected with each different range in order to optimize balance of sensitivity and stability. As a particularly preferable combination, "$R^A$: primary hydrocarbon group/$R^B$: tertiary hydrocarbon group $R^3$" or "$R^A$: secondary hydrocarbon group/$R^B$: tertiary hydrocarbon group $R^3$" is preferable, and "$R^A$: secondary hydrocarbon group/$R^B$: tertiary hydrocarbon group $R^3$" is particularly preferable to achieve balance between sensitivity and hydrophobicity. In addition, a combination of "$R^A$: secondary hydrocarbon group/$R^B$: tertiary hydrocarbon group $R^3$" is particularly preferable in terms of performance balance as a resist material.

(Cyclic Hydrocarbon Group)

As for the hydrocarbon group, containing a cyclic hydrocarbon group $R^c$ improves reactivity during exposure due to the strain of the cyclic skeleton, which may be preferable from the viewpoint of resist sensitivity. Examples of a cyclic skeleton contained in a preferable $R^c$ include cyclopropyl, cyclobutyl, cyclopentyl, cyclohexyl, and cycloheptyl. Among these, a cyclic skeleton having an alkyl group such as a methyl group at the 1-position (carbon bonded to Sn) may be preferable because a tertiary hydrocarbon group is formed, and for example, 1-methyl-cyclopropyl, 1-methyl-cyclobutyl, 1-methyl-cyclopentyl, 1-methyl-cyclohexyl, 1-methyl-cycloheptyl, etc. are preferable. A proportion of the cyclic hydrocarbon group $R^c$ in the hydrocarbon group is not particularly limited, and the upper limit is preferably not greater than 50 mol %, more preferably not greater than 40 mol %, further preferably not greater than 35 mol %, and particularly preferably not greater than 30 mol %. The lower limit is preferably not less than 1 mol %, more preferably not less than 5 mol %, further preferably not less than 10 mol %, and particularly preferably not less than 15 mol %.

(Hydrocarbon Group Having Unsaturated Bond)

As for the hydrocarbon group, containing a hydrocarbon group $R^u$ having an unsaturated bond allows the unsaturated bond to undergo reaction or polymerization during exposure to change the structure, which may be preferable from the viewpoint of resist sensitivity. Examples of a skeleton having an unsaturated bond contained in the hydrocarbon group $R^u$ having an unsaturated bond include alkene, alkyne, diene, triene, and benzene; alkene is preferable from the viewpoints of reactivity and stability, and a terminal alkene is specifically preferable from the viewpoint of reactivity. Specific preferable examples thereof include a vinyl group, a 1-propenyl group, an allyl group, a 3-butenyl group, and a 4-pentenyl group. From the viewpoint of resist sensitivity, a vinyl group, a 1-propenyl group, and an allyl group in which the alkene is close to the Sn atom are preferable. From the viewpoint of stability, it is preferable that the unsaturated bond be distanced from the Sn atom by not less than two carbon atoms. In terms of the balance thereof, an allyl group, a 3-butenyl group, etc. are preferable. A proportion of the cyclic hydrocarbon group $R^c$ in the hydrocarbon group is not particularly limited, and the upper limit is preferably not greater than 50 mol %, more preferably not greater than 40 mol %, further preferably not greater than 35 mol %, and particularly preferably not greater than 30 mol %. The lower limit is preferably not less than 1 mol %, more preferably not less than 5 mol %, further preferably not less than 10 mol %, and particularly preferably not less than 15 mol %.

(Preferable Composition Ratio of $R^A$ and $R^B$)

As for a preferable composition ratio of $R^A$ and $R^B$, when a largest number of hydrocarbon groups is $R^A$ and a second largest number of hydrocarbon groups is $R^B$, a content of $R^A$ is preferably not less than 50 mol %, more preferably not less than 60 mol %, and further preferably not less than 70 mol % of substituents constituting the hydrocarbon groups. The upper limit is preferably not greater than 99 mol %, more preferably not greater than 95 mol %, and further preferably not greater than 90 mol %. When the hydrocarbon group $R^A$ accounting for a major proportion in the hydrocarbon groups is within the above range, crystal formation during hydrolysis is appropriately regulated, which may yield a tin compound having appropriate crystallinity, without impairing the performance of $R^A$ as a resist material. A preferable content of $R^B$ is preferably not greater than 50 mol %, more preferably not greater than 40 mol %, further preferably not greater than 35 mol %, and particularly preferably not greater than 30 mol %. The lower limit is preferably not less than 1 mol %, more preferably not less than 5 mol %, further preferably not less than 10 mol %, and particularly preferably not less than 15 mol %. A composition of $R^B$ within the above range may impart properties of $R^B$ without impairing the performance of $R^A$ and may yield a tin compound having appropriate crystallinity.

$R^A$ is preferably a secondary hydrocarbon group $R^2$, and specifically preferably an isopropyl group. $R^B$ is preferably any one of a tertiary hydrocarbon group $R^3$, a cyclic hydrocarbon group $R^c$, and a hydrocarbon group $R^u$ having an unsaturated bond, and preferably a t-butyl group among the tertiary hydrocarbon group $R^3$. Among the cyclic hydrocarbon group $R^c$, a methylcyclopentyl group is preferable. Among the hydrocarbon group $R^u$ having an unsaturated bond, a butenyl group is preferable.

<Method for Producing Tin Compound (A1)>

A method for producing the tin compound (A1) is not particularly limited, and the tin compound (A1) may be produced by a conventionally known method. Specific examples of the method for producing a tin compound containing the tin compound (A1) as a main component for a purpose of obtaining the tin compound (A1) include the following producing methods.

(Producing Method 1)

An example of the method for producing the tin compound (A1) is a method of obtaining the tin compound (A1) by reacting a raw material tin compound (E1) and a reaction reagent ((M1) or (M2)) in an organic solvent (S1) under a specific condition. The details will be described below, and a typical reaction formula of this producing method is as follows.

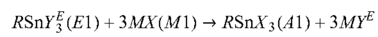

This producing method 1 is preferable in terms of obtaining highly pure $RSnX_3$ (A1) because purity of the tin compound

being used as the raw material can be increased by purification. From the viewpoint of using a tin compound in which the organic group R is introduced in advance as the raw material, tin compounds A2, A3, A4, etc. as impurities may be reduced by another method to reduce impurities that are difficult to remove by distillation.

Hereinafter, material components etc. used for the method for producing the tin compound (A1) will be described.

Raw Material Tin Compound (E1)

The raw material tin compound (E1) is represented by the following formula.

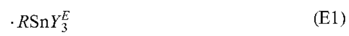

In the general formula (E1), R represents an organic group having 1 to 30 carbon atoms. Examples of this organic group include a halogenated hydrocarbon group, a hydrocarbon group having a heteroatom such as an oxygen atom and a nitrogen atom, and a hydrocarbon group. $Y^E$ is selected from a halogen atom, OR', and $NR'_2$. Each R' may be same as or different from each other, and represent an organic group having 1 to 10 carbon atoms and optionally having halogen. When a plurality of R' are present in the molecule, the structures may be different from each other, and may be bonded to each other to form a cyclic structure.)

The organic group $Y^E$ in the reaction formula may have any structure as long as the organic group is substituted by a reaction with the reaction reagent (M1). Specific preferable examples thereof include a halogen atom and an organic group selected from OR' and $NR'_2$, and a halogen atom is specifically preferable due to the high reactivity. Among these, a Cl atom is preferable because of good balance between stability and reactivity, ease of purification by distillation etc., and ease of preparing the raw material tin compound (E1) with higher purity. Among these, a monoalkyltin chloride is most preferable.

The purity of the raw material tin compound

can be increased by purification, and a method of using highly pure $RSnY^E_3$ as the raw material is preferable in terms of a low amount of remained impurity which increases the purity of the highly pure tin compound (A1). Specifically, the purity is typically not less than 95 mol %, preferably not less than 97 mol %, more preferably not less than 99 mol %, further preferably not less than 99.5 mol %, and particularly preferably not less than 99.9 mol % in terms of tin atom. The upper limit is 100 mol %.

Meanwhile, a tin compound as an impurity or moisture may contribute to stabilization, such as prevention of crystallizing the target product, or may affect the reaction of synthesizing tin compound (A1). The tin compound to be the impurity may be preferably contained at not less than 0.1 mol %, more preferably not less than 0.2 mol %, and further preferably not less than 0.3 mol %.

Specifically, each of the contents of

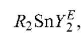

$R_3SnY^E$, and $R_4Sn$ is preferably not greater than 3 mol %, more preferably not greater than 2 mol %, further preferably not greater than 1 mol %, and particularly preferably not greater than 0.1 mol % in terms of tin atom. Meanwhile, from the viewpoint of contribution to stabilization such as prevention of crystallizing the target product, each of

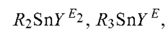

$R_3SnY^E$, and $R_4Sn$ may be contained at preferably not less than 0.01 mol %, and more preferably not less than 0.1 mol %.

Reaction Reagent (M1)

The reaction reagent (M1) is one that can provide a substitution reaction with the organic group $Y^E$ of the tin compound (E1)

being the raw material and that can generate the tin compound (A1) ($RSnX_3$) being the target product. Examples of preferable structures of the reaction reagent (M1) include MX, MX2, and MX3. For example, the reaction reagent (M1) being MX provides the following theoretical reaction:

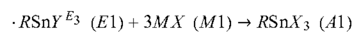

In the reaction, M represents a metal atom of group 1, group 2, group 12, or group 13. When M is group 1, the reaction reagent (M1) may be represented by "MX." When M is group 2 or group 12, the reaction reagent (M1) may be represented by "MX2." When M is group 13, the reaction reagent (M1) may be represented by "MX3." The plurality of X in the molecule may be different. X is as described in the above section. Specifically, when X is OR', examples thereof include LiOR', NaOR', KOR', $MgOR'_2$, and $ZnOR'_2$. LiOR', NaOR', and KOR' are preferable from the viewpoint of high reactivity. When X is $NR'_2$, examples thereof include $LiNR'_2$, $NaNR'_2$, $KNR'_2$, $Mg(NR'_2)_2$, and $Zn(NR'_2)_2$. $LiNR'_2$, $NaNR'_2$, and $KNR'_2$ are preferable from the viewpoint of high reactivity, and $Mg(NR'_2)_2$ and $Zn(NR'_2)_2$ are preferable from the viewpoint of stability. Among these, $LiNR'_2$ (lithium amides: such as lithium dimethylamide and lithium diethylamide) is most preferable in terms of ease of preparing a highly pure reagent.

Reaction Reagent (M2)

The reaction reagent (M2) refers to a compound selected form reaction reagent (M1) or a compound represented by a chemical formula HX. H represents a hydrogen atom, and X is same as that contained in the tin compound (A1). Examples of the compound corresponding to HX include HOR' (such as methanol, ethanol, t-butanol, and 4-methyl-2-pentanol) and $HNR'_2$ (such as dimethylamine, diethylamine, and morpholine). Among the options for the reaction reagent (M2), a reaction reagent (M1) is preferable because of high reactivity. From the viewpoint of no contamination with metal after the reaction, a compound corresponding to HX, namely, HOR' (such as methanol, ethanol, t-butanol, and 4-methyl-2-pentanol) and $HNR'_2$ (such as dimethylamine, diethylamine, and morpholine) are preferable. Particularly, when $Y^E$ of the raw material tin compound (E1)

is highly reactive $NR'_2$, use of the compound corresponding to HX may yield the highly pure product without contamination with metal.

(Amount of Reaction Reagents (M1) and (M2))

The lower limit is preferably not greater than 3.00 eq, further preferably not less than 3.03 eq, and most preferably not less than 3.06 eq relative to the raw material tin compound (E1) in terms of mole equivalent.

The upper limit is preferably not greater than 10.00 eq, more preferably not greater than 8.00 eq, and further preferably not greater than 7.00 eq. A plurality of the reaction reagents (M1) and (M2) may be used in combination, and in this case, the total amount of the mole equivalent of the reaction reagents preferably meets this range.

(Method for Preparing Reaction Reagent (M1))

As for the temperature of a step of preparing the reaction reagent (M1), a lower limit temperature is preferably not lower than about −78° C., more preferably not lower than about −40° C., further preferably not lower than about −20° C., particularly preferably not lower than about −10° C., and especially preferably not lower than about −5° C. The upper limit temperature is preferably not higher than about 40° C., more preferably not higher than about 20° C., and further preferably not higher than about 15° C. Particularly when the reaction reagent (M1) is a lithium amide, which needs to be prepared from an amine and an alkyllithium, excessively high temperature tends to evaporate the amine or accelerate decomposition of the alkyl amide. Excessively low temperature tends to decrease solubility of dimethylamide in a solvent or increase the viscosity to cause difficulty in stirring.

A lower limit of a reaction time after dropwise addition in preparing the reaction reagent (M1) is preferably not shorter than 0.5 hours (hereinafter, "hour(s)" may be referred to as "h"), more preferably not shorter than 1 h, and further preferably not shorter than 2 h. The upper limit is preferably not longer than 48 h, more preferably not longer than 30 h, and further preferably not longer than 20 h. If the reaction time is excessively short, a reaction reagent (M1) with sufficient purity tends to fail to be generated, or in a case of a slurry, insufficient mixing tends to generate a non-uniform reaction reagent (M1). If the reaction time is excessively long, byproducts tend to be generated or the number of equivalent tends to decrease due to decomposition of the reaction reagent (M1).

It is preferable that the reaction reagent (M1) be continuously stirred after preparing the reaction reagent (M1) and that the reaction reagent (M1) be used for this reaction between 3 to 48 hours after the preparation in terms of retaining the purity of the reaction reagent (M1) and controlling moisture in the reaction reagent (M1).

(Method for Preparing Reaction Reagent (M2))

The reaction reagent (M2) refers to a compound selected from the reaction reagent (M1) and a compound corresponding to the chemical formula HX. The method for preparing the reaction reagent (M1) is as noted above, and a method about the compound represented by the chemical formula HX will be described. As the compound with chemical formula HX, a commercial compound may be used as is, but a compound subjected to purification operation such as distillation, adsorption, and column is preferably used in order to prevent contamination with impurity, contamination with moisture, and contamination with metal. Alternatively, products that have been subjected to a purification operation, such as semiconductor grade (EL grade) and dehydration grade, may be commercially available. Specifically, the purity is preferably not less than 95%, more preferably not less than 98%, further preferably not less than 99%, particularly preferably not less than 99.9%, and especially preferably not less than 990.99% based on mass. The upper limit is 100%. A preferable organic solvent for the preparation is as shown in the following organic solvent (S1). A specific contamination amount of metal is, as each metal element, preferably not greater than 100 ppm, more preferably not greater than 10 ppm, further preferably not greater than 1 ppm, particularly preferably not greater than 100 ppb, and especially preferably not greater than 10 ppb based on mass. The lower limit is 0 ppb.

Organic Solvent (S1)

In the present producing method, the raw material tin compound (E1), the reaction reagent ((M1) or (M2)), and the organic solvent (S1) are used. The organic solvent (S1) is not particularly limited, and preferably an organic solvent such as, for example, hydrocarbons (such as hexane, cyclohexane, heptane, decane, and decalin), aromatics (such as benzene, toluene, xylene, and anisole), ethers (such as tetrahydrofuran (THF), diethyl ether, t-butyl methyl ether (TBME), dibutyl ether, 3 -methylTHF, tetrahydropyran (THP), and 3-methylTHP), ketones (such as acetone, methyl ethyl ketone (MEK), and methyl isobutyl ketone (MIBK)), amides (such as N,N-dimethylformamide (DMF) and N,N-dimethylacetamide (DMAC)), esters (such as ethyl acetate and butyl acetate), and alcohols (such as methanol, ethanol, isopropanol, butanol, and 4-methyl-2-pentanol). The organic solvent (S1) is preferably an aromatic, hydrocarbon, or ether solvent that hardly reacts with the reaction reagent. These solvents may be used singly or in combination of two or more thereof.

The solvent is preferably one that does not contribute to a metal contamination substance.

The organic solvent (S1) is particularly preferably a hydrocarbon or aromatic solvent that has low solubility for inorganic salts etc. to easily remove byproducts such as inorganic salts etc. after the reaction by filtration, centrifugation, etc. Among these, toluene and hexane are most preferable solvents at present because the product is easily removed at low temperature in vacuo after the reaction. Meanwhile, ethers are preferable solvents for smoothly providing the reaction because of high solubility of an organometal reaction reagent such as lithium dimethylamide. That is, combining a plurality of the solvents such as hydrocarbon, aromatic, and ether solvents may combine the advantages of these solvents. In addition, when HOR' (such as methanol, ethanol, t-butanol, and 4-methyl-2-pentanol) and $HNR'_2$ (such as dimethylamine, diethylamine, and morpholine) are used as the reaction reagent (M2), the reaction reagent (M2) may also play a role as the solvent.

(Producing Method 2)

As an example, the tin compound is synthesized with $SnX_4$, a raw material tin compound, and a reaction reagent RM or RMZ, which has R.

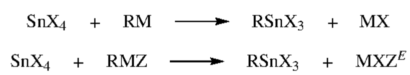

In the reaction formulas, M represents a metal atom of group 1, group 2, group 12, or group 13, or a hydrogen atom. When M is group 1 or a hydrogen atom, the reaction reagent may be represented by "RM." When M is group 2 or group 12, the reaction reagent may be represented by "$RMZ^E$." When M is group 13, the reaction reagent may be represented by

"$RMZ^{E}{}_{2}$."

The plurality of X in the molecule may be different. $Z^E$ represents a halogen atom or R. The plurality of $Z^E$ in the molecule may be different. X is as described in the above section. Specifically, when X is OR', examples thereof include ROH, RLi, RNa, RK, $RMgZ^E$, and $RZnZ^E$. RLi is preferable from the viewpoint of high reactivity, and $RMgZ^E$ and $RZnZ^E$ are preferable from the viewpoint of prevention of decomposition of the target product due to reaction selectivity of monoalkylation and low basicity. Among these, RMgZ is most preferable. From the viewpoint of no contamination with metal, ROH is preferable.

This technique has a problem of contamination with a byproduct having a plurality of organic groups R due to the reaction form. As for this point, a structure of $RSnX_3$ (A1) for which this technique is effective is a structure in which the organic group R is a tertiary alkyl group (for example, t-butyl, t-amyl, 1-methyl-cyclopentyl, or 1-methyl-cyclohexyl). In this case, for a bulky tertiary alkyl group, the target product in which one alkyl group is selectively added tends to be obtained with good yield in terms of ease of controlling reactivity of the reaction reagent RM and difficulty in introducing a plurality of the bulky tertiary alkyl groups on the Sn atom. In addition, ease of separation by distillation, such as a boiling point of byproducts having a plurality of organic groups R far from that of the target product, also becomes a factor for this technique to effectively work.

(Producing Method 3)

An example is a method including: a step α of producing $MSnX_3$ from $SnX_2$, which is a monoalkyltin compound to be a raw material, and a reaction reagent containing MX; and a step β of reacting the obtained $MSnX_3$ and an alkylating agent $RZ^F$.

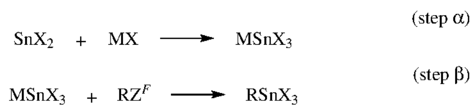

In the reaction formulas, M represents a metal atom of group 1, group 2, group 12, or group 13. When M is group 1, the reaction reagent may be represented by "MX." When M is group 2 or group 12, the reaction reagent may be represented by "MX2." When M is group 13, the reaction reagent may be represented by "MX3." The plurality of X in the molecule may be different. X is as described in the above section. Specifically, when X is OR', examples thereof include LiOR', NaOR', KOR', $MgOR'_2$, and $ZnOR'_2$. LiOR', NaOR', and KOR' are preferable from the viewpoint of high reactivity. When X is $NR'_2$, examples thereof include $LiNR'_2$, $NaNR'_2$, $KNR'_2$, $Mg(NR'_2)_2$, and $Zn(NR'_2)_2$. $LiNR'_2$, $NaNR'_2$, and $KNR'_2$ are preferable from the viewpoint of high reactivity. Among these, $LiNR'_2$ is most preferable in terms of ease of preparing a highly pure reagent. In the alkylating agent $RZ^F$, $Z^F$ represents a halogen atom (F, Cl, Br, or I), and among these, Br or I is preferable from the viewpoint of reactivity.

This technique has an advantage that the organic group R can be introduced from $RZ^F$, which is an alkyl halide easily synthesized or available, due to the reaction form. In this point, this technique is effective in a case of an unstable organic group R that causes decomposition or side reactions when applied for the producing method 1 or 2. Specifically, when the organic group R has a heteroatom, an unsaturated bond, or an aromatic ring, this technique may be effective.

(Distillation Purification)

The synthesized tin compound (A1) (crude product) may be further purified by distillation. A product purified by distilling the crude product is referred to as "purified tin compound."

The higher the proportion of the tin compound (A1) in the purified tin compound, the higher the performance of the resist. Therefore, the purity of the tin compound (A1) is preferably 96 mol %, more preferably 97 mol %, further preferably not less than 98 mol %, particularly preferably not less than 99 mol %, especially preferably not less than 99.2 mol %, further especially preferably not less than 99.5 mol %, furthermore preferably not less than 99.8 mol %, and most preferably not less than 99.9 mol %. Meanwhile, a triaminotin compound having excessively high purity may be decomposed or may be unstable during storage or use due to a disproportionation reaction of the organic group R in the tin compound (A1). In this case, the purity is preferably not greater than 100.0 mol %, and more preferably not greater than 99.9 mol %.

The content of an inorganic impurity in the purified tin compound is preferably lower for use as a resist material. Specifically, a content of each inorganic impurity element is preferably not greater than 10 ppm, more preferably not greater than 1 ppm, further preferably not greater than 0.1 ppm, and particularly preferably not greater than 0.01 ppm.

Note that, if the purified tin compound does not have sufficient quality, another purification process (such as purification by filtration or column and addition of an adsorbent or a reaction reagent) may be performed before and after the distillation.

<Method for Producing Tin Compound (B1)>

A method for producing tin compound (B1) is not particularly limited, and the tin compound (B1) may be produced by a conventionally known method. Examples of a preferable producing method include the following producing method similar to "the method 1 for producing the tin compound (A1)."

As a first producing method (B1-producing method 1), the tin compound (B1) is obtained by reacting a monoalkyltin compound $RSnX_3$ (A1) and a reaction reagent (M1Y or M2Y) having Y corresponding to one-equivalent in an organic solvent (S1) (no-solvent may be acceptable as necessary) under a specific condition. The reaction reagents M1Y and M2Y are, as described below, reaction reagents in which the substituent X in the reaction reagents M1 and M2 described in the method for producing the above monoalkyltin compound $RSnX_3$ (A1) is changed to Y.

A typical reaction formula of the B1-producing method 1 is as follows.

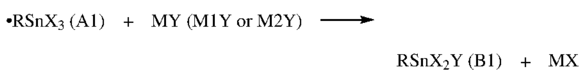

(X is selected from OR', $NR'_2$, and C≡CR', and Y is selected from OR', $NR'^{Y}_2$, and $C≡CR'^{Y}$.)

As a second producing method (B1-producing method 2), the tin compound (B1) is obtained by reacting a monoalkyltin compound $RSnY_3$ and a reaction reagent (M1 or M2) having X corresponding to two equivalents in the organic solvent (S1) (no-solvent may be acceptable as necessary) under a specific condition.

A typical reaction formula of the B1-producing method 2 is as follows.

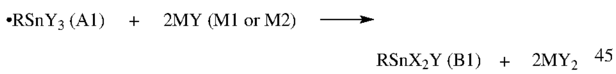

The structure of the monoalkyltin compound $RSnX_3$ (A1) used as the raw material in the reaction formula of the B1-producing method 1 is not particularly limited, but X is preferably $NR'_2$ in terms of high reactivity for the above reaction. The high reactivity allows selective reaction of the reaction reagent MY and only one equivalent of MY, as noted above, which may yield $RSnX_2Y$ (B1) with high purity.

The structure of the monoalkyltin compound $RSnY_3$ used as the raw material of the B1-producing method 2 is not particularly limited, but Y is preferably

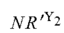

in terms of high reactivity for the above reaction. The high reactivity allows selective reaction of only two equivalents of MX2, as noted above, which may yield $RSnX_2Y$ (B1) with high purity.

The purity of the tin compounds $RSnX_3$ (A1) and $RSnY_3$, the raw materials of each of the producing methods, can be increased by purification, and use of $RSnX_3$ (A1) and $RSnY_3$ with high purity as the raw materials is preferable in terms of a small amount of remained impurity and increase in the highly pure tin compound (B1). Specifically, the purity is typically not less than 95 mol %, preferably not less than 97 mol %, more preferably not less than 99 mol %, further preferably not less than 99.5 mol %, and particularly preferably not less than 99.9 mol % in terms of tin atom. The upper limit is 100 mol %.

Meanwhile, a tin compound as an impurity or moisture may contribute to stabilization, such as prevention of crystallizing the target product, or may affect the reaction of synthesizing the tin compound (B1). The tin compound to be the impurity may be preferably contained at not less than 0.1 mol %, more preferably not less than 0.2 mol %, and further preferably not less than 0.3 mol %.

Specifically, each of the contents of $R_2SnX_2$, $R_3SnX$, and $R_4Sn$ is preferably not greater than 3 mol %, more preferably not greater than 2 mol %, further preferably not greater than 1 mol %, and particularly preferably not greater than 0.1 mol % in terms of tin atom. Meanwhile, from the viewpoint of contribution to stabilization, such as prevention of crystallizing the target product, each of $R_2SnX_2$, $R_3SnX$, and $R_4Sn$ may be contained at preferably not less than 0.01 mol %, and more preferably not less than 0.1 mol %.

Reaction Reagent (M1Y)

The reaction reagent (M1Y) is one that can provide a substitution reaction with the organic group X of the tin compound $RSnX_3$ (A1) being the raw material and that can generate the tin compound (B1) ($RSnX_2Y$) being the target product. Specifically, preferable is a reaction reagent having appropriate reactivity that can selectively react only one-equivalent. Examples of preferable structures of the reaction reagent (M1Y) include MY, MXY, and $MY_3$.

In the reaction formula, M represents a metal atom of group 1, group 2, group 12, or group 13. When M is group 1, the reaction reagent may be represented by "MY" When M is group 2 or group 12, the reaction reagent may be represented by "$MY_2$." When M is group 13, the reaction reagent may be represented by "$MY_3$." The plurality of Y in the molecule may be different. Y is as described in the above section. Specifically, when Y is OR', examples thereof include LiOR', $NaOR'^{Y}$, $KOR'^{Y}$,

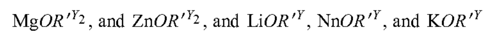

$LiOR'^{Y}$, $NaOR'^{Y}$, and $KOR'^{Y}$ are preferable from the viewpoint of high reactivity. When

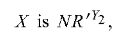

examples thereof include

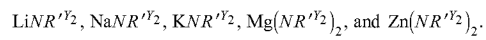

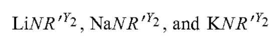

are preferable from the viewpoint of high reactivity, and $Mg(NR'_2)_2$ and $Zn(NR'_2)_2$ are preferable from the viewpoint of stability. Among these, $LiNR'^{Y}_2$ (lithium amides: such as lithium dimethylamide and lithium diethylamide) is most preferable in terms of ease of preparing a highly pure reagent.

Reaction Reagent (M2Y)

The reaction reagent (M2Y) refers to a compound selected from a reaction reagent (MY1) and a compound represented by chemical formula HY H represents a hydrogen atom, and Y is same as that contained in the tin compound (B1). Examples of compounds corresponding to HY include $HOR'^{Y}$ (such as methanol, ethanol, t-butanol, and 4-methyl-2-pentanol) and

(such as dimethylamine, diethylamine, and morpholine). Among the reaction reagent (M2Y), a compound selected from the reaction reagent (M1Y) is preferable because of high reactivity. From the viewpoint of no contamination with metal after the reaction, a compound corresponding to HY, namely, $HOR'^{Y}$ (such as methanol, ethanol, t-butanol, and 4-methyl-2-pentanol) and

(such as dimethylamine, diethylamine, and morpholine) are preferable.

<Reaction Condition of B1-Producing Method 1>

As the B1-producing method 1, a tin compound (B1) is obtained by reacting a monoalkyltin compound $RSnX_3$ (A1) and a reaction reagent (M1Y or M2Y) having Y corresponding to one-equivalent in an organic solvent (S1) (no-solvent may be acceptable as necessary) under a specific condition. As to the reaction conditions, the conditions described in "method 1 for producing the tin compound (A1)" can be used as reference.

As the X group in the raw material tin compound $RSnX_3$, use of an OR' group or a $NR'_2$ group is preferable from the viewpoint of selectivity and reactivity of the one-equivalent addition, and $NR'_2$ is preferable from the viewpoint of reactivity. Meanwhile, an OR' group may be preferable from the viewpoint of combination with the reaction reagent and selectivity. As the reaction reagent, a reaction reagent having an HY structure is preferable because a highly pure product may be yielded without contamination with metal, and in particular, effective is a case when the X group in the raw material tin compound $RSnX_3$ is an OR' group or a $NR'_2$ group, which has high reactivity. Specifically, among the reaction reagents having an HY structure, secondary and tertiary alcohols (such as isopropanol, t-butanol, and 4-methyl-2-pentanol) are preferable because of selectively high reaction with one-equivalent due to steric hindrance. Similarly, when $RSnX_3$ is stored in a mixture with a reaction reagent having an HY structure, this reaction may occur, and, as a result, the B1-producing method 1 may be carried out.

A lower limit of an amount of the reaction reagent is preferably not less than 0.80 eq, more preferably not less than 0.90 eq, and most preferably not less than 0.95 eq in terms of mole equivalents. The upper limit is preferably not greater than 2.00 eq, more preferably not greater than 1.50 eq, and further preferably not greater than 1.10 eq. This producing method controls the selectivity reaction with one-equivalent, and affects the purity of the obtained tin compound (B1). Controlling the equivalents and reaction condition may yield a monoalkyltin composition (precursor mixture) containing $RSnX_3$ (A1), $RSnX_3$, $RSnX_2Y$ (B1), $RSnXY_2$, $RSnY_3$, etc. with a specific composition.

<Reaction Condition of B1-Producing Method 2>

As the B1-producing method 2, tin compound (B1) is obtained by reacting a monoalkyltin compound $RSnY_3$ and a reaction reagent (M1 or M2) having X corresponding to two equivalents in an organic solvent (S1) (no-solvent may be acceptable as necessary) under a specific condition. As to the reaction conditions, the conditions described in "method 1 for producing the tin compound (A1)" can be used as reference.

As the Y group in the raw material tin compound $RSnY_3$, use of an $OR'^{Y}$ group or a $NR'^{Y}_2$ group is preferable from the viewpoints of selectivity and reactivity of the two-equivalent addition, and $NR^{Y'}_2$ is preferable from the viewpoint of reactivity. Meanwhile, an $OR'^{Y}$ group may be preferable from the viewpoints of combination with the reaction reagent and selectivity. As the reaction reagent, a reaction reagent having an HX structure is preferable because a highly pure product may be yielded without contamination with metal, and in particular, effective is a case when the Y group in the raw material tin compound $RSnY_3$ is an $OR'^{Y}$ group or a

group, which has high reactivity. Specifically, among the reaction reagents having an HX structure, secondary and tertiary alcohols (such as isopropanol, t-butanol, and 4-methyl-2-pentanol) are preferable because of selectively high reaction with two-equivalent due to steric hindrance. Similarly, when $RSnY_3$ is stored in a mixture with a reaction reagent having an HX structure, this reaction may occur, and, as a result, the B1-producing method 2 may be carried out. A lower limit of an amount of the reaction reagent is preferably not less than 1.80 eq, more preferably not less than 1.90 eq, and most preferably not less than 1.95 eq in terms of mole equivalents. The upper limit is preferably not greater than 4.00 eq, more preferably not greater than 2.50 eq, and further preferably not greater than 2.10 eq. This producing method controls the selectivity reaction with two-equivalent, and affects the purity of the obtained tin compound (B1). Controlling the equivalents and reaction condition may yield a monoalkyltin composition (precursor mixture) containing $RSnX_3$ (A1), $RSnX_3$, $RSnX_2Y$ (B1), $RSnXY_2$, $RSnY_3$, etc. with a specific composition.

<<Application as Resist Material>>

The present tin hydrolysate (P1) of the present embodiment is obtained by hydrolysis using a tin composition containing the tin compounds (A1) and (B1) at a specific blending ratio.

<Method for Producing The Present Tin Hydrolysate>

A method for producing the present tin hydrolysate is preferably hydrolysis including the following steps.

<Step 1> Using a tin composition containing the tin compounds (A1) and (B1) at a specific blending ratio as a raw material.

<Step 2> Contacting the raw material with water and/or water vapor.

In the step 1, a monoalkyltin composition (A1B1) in which the tin compounds (A1) and (B1) are mixed at a specific blending ratio is prepared. In this step, this precursor mixture is not hydrolyzed, and the chemical structure does not change. Therefore, the step 1 is preferably performed under an inert gas atmosphere. Then, this monoalkyltin composition needs to be used in step 2. As the preparing method, two types or more of the precursor may be mixed for preparation, or a monoalkyltin composition in which (A1) and (B1) are already blended in steps such as synthesis, purification, and storage may be used. In steps 1 and 2, other additives such as a solvent may not be used, but when uniform preparation and mixing are performed as a raw material (precursor) in a liquid state (step 1) and a uniform contacting reaction (mixing) of water or water vapor (step 2), not less than 100 parts by mass of an organic solvent relative to 100 parts by mass of the raw material is preferably mixed for use in each step.

Specifically, it is preferable that the tin composition containing the tin compounds (A1) and (B1) at a specific blending ratio be prepared under an inert gas atmosphere (step 1), and this composition or a blend with the organic solvent as necessary be formed in a gas and/or liquid state and contacted with water and/or water vapor to hydrolyze the precursor (step 2). In this case, the organic solvent used in step 2 is preferably a solvent that does not hydrolyze the precursor, specifically preferably an aprotic solvent, and further preferably a dehydrated aprotic solvent. The water used in step 2 is preferably liquid water.

Organic Solvent in Hydrolysis

In the present producing method, the organic solvent is not particularly limited, and preferably an organic solvent such as, for example, hydrocarbons (such as hexane, cyclohexane, heptane, decane, and decalin), aromatics (such as benzene, toluene, xylene, and anisole), ethers (such as tetrahydrofuran (THF), diethyl ether, t-butyl methyl ether (TBME), dibutyl ether, 3-methylTHF, tetrahydropyran (THP), and 3-methylTHP), ketones (such as acetone, methyl ethyl ketone (MEK), and methyl isobutyl ketone (MIBK)), amides (such as N,N-dimethylformamide (DMF) and N,N-dimethylacetamide (DMAC)), esters (such as ethyl acetate and butyl acetate), halogen solvents (dichloromethane and chloroform), and alcohols (such as methanol, ethanol, isopropanol, butanol, and 4-methyl-2-pentanol). A combination of solvents that do not react with the used precursor is preferable. Specifically, in a system in which the precursor structure has high reactivity, such as a structure having an $NR_2$ group etc., an aprotic solvent is preferable. The aprotic solvent is specifically an aromatic, hydrocarbon, ether, or halogen solvent. These solvents may be used singly or in combination of two or more thereof. The solvent is preferably a solvent itself that does not contribute to a metal contamination substance. The solvent used for hydrolysis may affect the crystallinity of the obtained tin hydrolysate, and use of a low polar aprotic solvent with low solubility of the tin hydrolysate (specifically, hydrocarbon solvents such as hexane) is preferable because the crystallinity may be reduced to obtain a tin hydrolysate with high solubility. When the hydrolysis is performed in the coating solvent and then the thin film is formed after coating, the solvent used for the hydrolysis may need aptitude as a coating solvent. In this case, ketone solvents, ester solvents, alcohol solvents, etc., which are suitable as a coating solvent in the semiconductor process, may be preferable.

Conditions for Hydrolysis

The temperature for the hydrolysis is not particularly limited as long as the reaction with water proceeds and the hydrolysis proceeds at a target rate, and in the process of using the above organic solvent and liquid water, the temperature is preferably between −10° C. and −150° C. Since the rate of hydrolysis is derived from the structure of the hydrolysable groups X and Y, the appropriate temperature for the hydrolysis depends on the structure of the substituents X and Y When the substituents X and Y are OR', the lower limit of the temperature for the hydrolysis is preferably not lower than 0° C., preferably not lower than 30° C., and particularly preferably not lower than 40° C. The upper limit is preferably not higher than 150° C., and preferably not higher than 140° C. When the substituents X and Y are $NR'_2$, the temperature is preferably not lower than −10° C., preferably not lower than 0° C., and the upper limit is preferably not higher than 150° C., and particularly preferably not higher than 140° C.

When the tin hydrolysate does not precipitate after the hydrolysis using the organic solvent, it is preferable that the organic solvent be evaporated to precipitate the tin hydrolysate. As a condition for evaporating the organic solvent, the organic solvent may be evaporated by heating at a normal pressure, or the organic solvent may be evaporated by heating under a pressure-reducing condition. This process of evaporating the organic solvent may be performed in forming the thin film containing the tin hydrolysate, described later.

<Method for Forming Thin Film Containing The Present Tin Hydrolysate>

The present tin hydrolysate (P1) described above may be used as a resist material. As for usage as a resist material, a method disclosed in JP-A-2021-21953 may be used, for example. For use as a resist material, examples of a method for forming the thin film (a coating film such as a coating layer and a film) containing the present tin hydrolysate include the following dry method and wet method.

In the dry method, a monoalkyltin compound (precursor) being the raw material of the tin hydrolysate is evaporated by heating or under a reduced pressure for use as vapor. For vapor of the precursor or the precursor deposited on the substrate, water vapor, another gas, etc. is reacted to synthesize the tin hydrolysate. This method is performed on the substrate to form the thin film (coating film) containing the tin hydrolysate on the substrate. As necessary, formation of the tin hydrolysate may be enhanced by combining steps such as a reaction, heating, and washing before or after this step.

One of the wet methods is a method in which a raw material containing a monoalkyltin compound (precursor) being the raw material of the tin hydrolysate is reacted with water etc. in a solution state or a solid state for the hydrolysis to obtain the tin hydrolysate. Thereafter, the tin hydrolysate may be dissolved in an organic solvent etc. to be used as a coating solution. Alternatively, the solution containing the precursor may first be applied onto the substrate, and then a part or entirety of the above hydrolysis steps may be carried out, and then the tin hydrolysate may be generated.

In the applying step, the applying may be performed on the substrate by any coating or printing technique, and the thin film (coating film) containing the tin hydrolysate may be formed on the substrate.

<Thin Film Patterning>

The thin film obtained by the above any method may be stabilized or partially condensed before light irradiation via drying, heating, etc. The thin film (coating film) is typically thin, and has an average thickness of less than 10 microns, for example. To pattern an extremely small feature, an extremely thin sub-micron thin film with, for example, not greater than about 100 nm, further not greater than 50 nm, and particularly not greater than 30 nm may be desired, for example. The obtained thin film (coating film) is treated so that a part of the composition has resistance against development or etching by exposure, and thereby the thin film can be referred to as "resist."

The thin film (coating film) is exposed to appropriate radiation, for example, extreme ultraviolet ray, electron beam, or ultraviolet ray by using a selected pattern or a patterned negative portion to form a latent image having a developer-resistant region and a developer-soluble region. After exposure to the appropriate radiation and before development, the latent image may be differentiated from the non-irradiated region by reaction with heating or another method of the thin film. The latent image is contacted with the developer to form a physical image, namely a patterned thin film. The patterned thin film may be further heated to stabilize the patterned residual thin film on the surface. The patterned thin film may be used as a physical mask for further processing according to the pattern, for example, for etching the substrate and/or performing adhesion of an additional material. The patterned thin film is used as a resist as desired, and then the remaining patterned thin film may be removed at an appropriate time in processing, but the patterned thin film may be incorporated in a final structure.

Hereinafter, a condition of each process will be described in further detail.

<Preparation and Filtration of Resist Solution>

A resist solution used for a wet method is typically mixed sufficiently and prepared by using a mixing apparatus appropriate for a volume of the material to be formed. In addition, a given contaminant or another insoluble component may be removed by using appropriate filtration. In some embodiments, the prepared resist solution may be mixed for use. Into the resist solution, various additive may be added in addition to the tin compound, which is the main component.

<Coating on Substrate>

The precursor in a dry method and a resist solution in a wet method are appropriately selected according to adhesiveness to the substrate and subsequent processability. The precursor in a dry method and a resist solution in a wet method typically adhere to the substrate surface. The substrate may have a plurality of layers on the surface. In some embodiments, the substrate surface may be treated in order to adhere to the precursor in the dry method and the resist solution in the wet method. The substrate surface may be cleaned and/or smoothened as necessary. The appropriate substrate surface may contain any reasonable material. Some particularly interesting substrates (for example, a silicon wafer and a silica substrate) have another inorganic material such as a ceramic material, a polymer substrate, for example, an organic polymer, a composite thereof, and a combination thereof on the substrate surface and/or in the substrate surface layer. As the substrate, a relatively thin wafer with circular structure etc. may be convenient, but any structure with any reasonable shape may be used.

A polymer substrate or a substrate having a polymer layer on a non-polymer structure may be desirable for specific use due to its low cost and flexibility. Such a polymer may be selected based on a relatively low processing temperature that can be used for processing the patterning material described herein. As such a polymer, for example, polycarbonate, polyimide, polyester, polyalkene, a copolymer thereof and a mixture thereof are preferably contained.

In typical, the substrate desirably has a plain surface, particularly for high-resolution use. In a specific embodiment, however, the substrate may have substantial topography, and the resist coating is intended to fill or planarize the feature for specific patterning use. Such a function of the resist material is described in US-A-2015/0253667 (Bristol et al.), titled "Pre-Patterned Hard Mask for Ultrafast Lithographic Imaging", which is incorporated herein by reference.

To coat a substrate with a precursor in a dry method and a resist solution in a wet method, any appropriate coating process may be typically used. Examples of the coating methods in the case of a wet method preferably include spin-coating, spray coating, dip coating, knife-edge coating, and printing means (for example, ink-jet printing and screening printing). Examples thereof in the case of a dry method include vapor deposition such as physical vapor deposition and chemical vapor deposition. Some of these coating means form a pattern in the coating process, but resolution obtained by printing etc. at present is at a considerably lower level than resolution obtained by radiation-based patterning described herein. To provide larger control relative to the coating process, the coating material may be applied by many coating steps. For example, spin-coating is performed a plurality of times in a wet method, and vapor deposition is performed a plurality of times in a dry method to yield a desired final coating thickness. A thermal treatment described below may be applied after each of the coating steps or after a plurality of the coating steps.

When the patterning is performed by using radiation, spin-coating may be a desired means for coating a substrate with relative uniformity, but there can be an edge effect. The wafer may be rotated at a speed of about 500 to about 10000 rpm in some embodiments, about 1000 to about 7500 rpm in further embodiments, and about 2000 to about 6000 rpm in additional embodiments. The rotation speed may be regulated so as to obtain a desired coating thickness.

The spin-coating may be performed for a time of about 5 seconds to about 5 minutes, and about 15 seconds to about 2 minutes in further embodiments. By using initial low-speed rotation (for example, 50 to 250 rpm), initial bulk coating with the composition may be performed on the entire substrate. To remove given edge beat, back-surface rinsing, edge-beat removing step, etc. may be performed by using water or another appropriate solvent. A person skilled in the art would consider an additional range of the spin-coating parameter within the above clear range to recognize the parameter being included within the scope of the present disclosure.

The thickness of the coating film typically tends to depend on the concentration and viscosity of the resist solution and the rotation speed for the spin-coating in the wet method, and on vapor deposition pressure in the dry method. In a case of another coating process, the thickness may be typically regulated by selecting the coating parameter. In some embodiments, to facilitate formation of a small and highly customized feature in a subsequent patterning process, a thin coating may be desirably used. For example, the coating film after drying may have an average thickness of not greater than about 10 μm, not greater than about 1 μm in other embodiments, not greater than about 250 nm in further embodiments, about 1 to about 50 nm in additional embodiments, about 2 to about 40 nm in other embodiments, and about 3 to about 25 nm in some embodiments. A person skilled in the art would consider an additional range of thickness within the above clear range to recognize the thickness being included within the scope of the present disclosure. The thickness may be evaluated by using a contactless method with X-ray reflectance and/or polarization analysis based on optical properties of the film. In typical, the coating film is relatively uniform for facilitating the processing. Variation of the thickness of the coating film differs from not greater than only ±50% from the average coating thickness in some embodiments, not greater than only ±40% in further embodiments, and not greater than only about ±25% relative to the average coating thickness in additional embodiments. In some embodiments, such as highly uniform coating on a larger substrate, the uniformity of the coating may be evaluated by removing the edge with 1 cm. That is, the uniformity of the coating is not evaluated on the portion within 1 cm from the edge of the coating. A person skilled in the art would consider an additional range within the above clear range to recognize being included within the scope of the present disclosure.

Multiple coating processes can lead to partial evaporation of the solvent during the coating process itself, as the surface area of the droplets forming the coating material is increased and that stimulates evaporation. The volatilization of the solvent tends to increase the viscosity of the coating material by increasing the concentration of a species of the material. A goal during the coating process is to remove a sufficient amount of the solvent, to react a precursor for a dry method, or to react active molecules in the resist solution for a wet method in order to stabilize them for further processing. That is, during the coating step or the subsequent heating step, the solvent can be removed and the hydrolysate of the tin compound may be formed or condensed. In typical, the precursor in the dry method and the resist solution in the wet method may be heated before the radiation exposure in order to enhance densification. In the dried coating film, the precursor in the dry method and the resist solution in the wet method typically forms a polymer-metal oxo/hydroxo network based on the oxo-hydroxo ligand to the metal. Here, the metal also has some hydrocarbon groups or a polymer solid constituted with a polynuclear oxo/hydroxo species.

In the case of a wet method, the solvent-removing process may not be quantitatively controlled to a specific amount of the solvent remained in the coating material, and the properties of the obtained resist solution may be empirically evaluated for selecting process conditions effective for the patterning process.

Heating is not needed for success of the process, but the coated substrate may be desirably heated in order to accelerate the process and/or increase reproducibility of the process.

In an embodiment of applying heating to remove the solvent, the coated substrate having the coating film may be heated at about 45 to about 250° C., or may be heated at about 55 to about 225° C. in further embodiments. The heating to remove the solvent may be performed typically for at least about 0.1 minute, about 0.5 to about 30 minutes in further embodiments, or about 0.75 to about 10 minutes in additional embodiments. A person skilled in the art would consider an additional range of the heating temperature and time within the above clear range to recognize being included within the scope of the present disclosure. As a result of the heating treatment and densification, the coating film may exhibit an increase in refractive index and radiation absorption without considerably impairing the contrast.

<Patterning by Exposure and Patterned Coating Film>

The coating film may be finely patterned by using radiation. As noted above, the composition of the coating film corresponding to the composition of the resist solution may be designed so as to sufficiently absorb radiation with a desired form. The absorption of radiation generates energy to break a bond between the metal and the hydrocarbon group, and at least a part of the hydrocarbon group is consequently no longer usable for stabilizing the material. A radiation-decomposed product having a hydrocarbon group or its fragment may not be dispersed from the film according to process parameters and the identity of such a product. The absorption of a sufficient dose of radiation condenses the exposed coating film, that is, forms a reinforced metal-oxo/hydroxo network, which can contain water absorbed from surrounding atmosphere. The radiation may be typically transmitted according to a selected pattern. Such a radiation pattern is transferred to the coating film as a latent image having a corresponding irradiated region and non-irradiated region. In the irradiated region, the components forming the coating film tend to chemically change. As described below, a pattern having an extremely sharp edge may be formed by selectively removing the non-irradiated portion or selectively removing the irradiated portion in the coating film in development.

The radiation may be typically directed to the coated substrate through a mask, or a radiation beam may be controllably scanned in the entire substrate. The radiation may typically include electromagnetic radiation, electron beam (beta-radiation), or another appropriate radiation. The electromagnetic radiation may typically have a desired wavelength or wavelength range, such as visible light, ultraviolet ray, and X-ray.

The resolution that may be achieved relative to the radiation pattern typically depends on the wavelength of the radiation, and a pattern with higher resolution may be typically achieved with radiation having a shorter wavelength. Therefore, to achieve a pattern with particularly high resolution, ultraviolet ray, X-ray, or electron beam may be desirably used.

According to the international standard ISO 21348 (2007) recited herein by reference, ultraviolet ray spreads between wavelengths of not shorter than 100 nm and shorter than 400 nm. Krypton fluoride laser may be used as an ultraviolet ray source at 248 nm. Under the admitted standard, the ultraviolet ray region may be classified by some methods into extreme ultraviolet ray (EUV) with not shorter than 10 nm and shorter than 121 nm and far ultraviolet ray (FUV) with not shorter than 122 nm and shorter than 200 nm. The 193-nm line from argon fluoride laser may be used as a radiation source for FUV. The EUV light is used for lithography at 13.5 nm, and this light is generated from a Xe or Sn plasma source excited by using high-energy laser or discharge pulse. Soft X-ray can be defined to be with not shorter than 0.1 nm and shorter than 10 nm.

A dose of the electromagnetic radiation may be featured by fluence or radiation dose obtained by integrated radiation flux relative to an exposure time. An appropriate radiation fluence may be about 1 to about 150 $mJ/cm^2$, about 2 to about 100 $mJ/cm^2$ in further embodiments, or about 3 to about 50 $mJ/cm^2$ in further embodiments. A person skilled in the art would consider an additional range of the radiation fluence within the above clear range to recognize being included within the scope of the present disclosure.

In electron beam lithography, electron beam typically induces secondary electrons, which typically change the irradiated material. The resolution may be at least partially a function within a range of the secondary electrons in the material. Here, higher resolution is typically considered to be obtained from secondary electrons within a shorter range. Based on high resolution that may be achieved by electron lithography using the inorganic coating material described herein, the range of the secondary electrons in the inorganic material is restricted.

The electron beam may be featured by energy of the beam, and appropriate energy may be within a range of about 5 V to about 200 kV, or within a range of about 7.5 V to about 100 kV in further embodiments. A proximity-corrected beam radiation dose at 30 kV can be within a range of about 0.1 $\mu C/cm^2$ to about 5 $mC/cm^2$, within a range of about 0.5 $\mu C/cm^2$ to about 1 $mC/cm^2$ in further embodiments, or within a range of about 1 $\mu C/cm^2$ to about 100 $\mu C/cm^2$ in other embodiments. A person skilled in the art may calculate corresponding radiation dose of another beam energy based on suggestion herein, and would consider an additional range of the electron beam properties within the above clear range to recognize being included within the scope of the present disclosure.

Based on the design of the precursor in the dry method and the resist solution in the wet method, there is a large contrast of the material properties between the irradiated region and the non-irradiated region having a substantially unchanged hydrocarbon group in the coating film. The contrast with the dose may be improved by a thermal treatment after the irradiation, but satisfactory results may be obtained without thermal treatment after the irradiation in some embodiments. It is considered that the thermal treatment after exposure is annealing of the irradiated region to increase the condensation therein based on thermal breakage of the hydrocarbon group—metal bond without significant condensation in the non-irradiated region of the coating film. In a case of an embodiment using thermal treatment after the irradiation, the thermal treatment after the irradiation may be performed at a temperature of about 45 to about 250° C., about 50 to about 190° C. in additional embodiments, or about 60 to about 175° C. in further embodiments. The post-exposure heating may be performed for at least about 0.1 minute in typical, about 0.5 to about 30 minutes in further embodiments, or about 0.75 to about 10 minutes in additional embodiments.

A person skilled in the art would consider an additional range of the temperature and time of the heating after the irradiation within the above clear range to recognize being included within the scope of the present disclosure. This high contrast of the material properties further facilitates formation of a sharp line in the pattern after development, described in the following section. As a result, the coating film after the exposure to radiation is patterned with the irradiated region and the non-irradiated region.

<Development and Patterned Structure>

Development of the image includes contacting the coating film having the latent image with a developer composition, and includes any one of: removing the non-irradiated portion to form a negative-type image; or removing the irradiated portion to form a positive-type image. When the precursor in the dry method and the resist solution in the wet method described herein is used, effective negative patterning or positive patterning having desired resolution may be performed by using an appropriate developer liquid based on the typically same coating. Particularly, the irradiated region is at least partially condensed to increase the properties of the components constituting the coating film, and the irradiated region consequently has resistance against dissolution with an organic solvent. The non-irradiated region tends to be still soluble in the organic solvent. In the irradiated region, the hydrocarbon group—tin bond is cleaved to release the hydrocarbon group, and thereby the irradiated region is further condensed to tend to increase metal-oxide-like properties of the components constituting the coating film. Meanwhile, the non-irradiated material does not release the hydrocarbon group and is hydrophobic, and thereby hardly dissolved in a weak base or acid aqueous solution. Therefore, the base aqueous solution may be used for the positive patterning to remove the irradiated material while retaining the non-irradiated material.

The precursor in the dry method and the resist solution in the wet method that has a hydrocarbon group generates an inherently relatively hydrophobic material. By irradiation for breaking at least a part of the organometallic bond, the material is converted into a lower hydrophilic, namely more hydrophilic material. This change in properties provides remarkable contrast between the irradiated region and the non-irradiated region of the coating film, which can perform both positive-type patterning and negative-type patterning with the same coating film. Specifically, the irradiated region of the coating film is condensed to a certain extent to be a composition containing a larger amount of the metal oxide, but the condensation extent is typically middle even without significant heating, and therefore the irradiated material becomes relatively insoluble against development with a conventional developer.

In the case of negative-type image formation, the developer may be an organic solvent such as a solvent used for forming the resist solution. The selection of the developer is typically affected by a dissolution parameter about the components of the coating film (chemical components in each of the irradiated region and the non-irradiated region), and volatility, flammability, toxicity, viscosity, and latent chemical interaction with other process materials of the developer. Specifically, examples of appropriate developers include aromatic compounds (for example, benzene, xylene, and toluene), esters (for example, propylene glycol monomethyl ether acetate, ethyl acetate, ethyl lactate, n-butyl acetate, and butyrolactone), alcohols (for example, 4-methyl-2-pentanol, 1-butanol, isopropanol, 1-propanol, and methanol), ketones (for example, methyl ethyl ketone, acetone, cyclohexanone, 2-heptanone, and 2-octanone), and ethers (for example, tetrahydrofuran, dioxane, and anisole). The development may be performed for about 5 seconds to about 30 minutes, about 8 seconds to about 15 minutes in further embodiments, or about 10 seconds to about 10 minutes in additional embodiments. A person skilled in the art would consider an additional range within the above clear range to recognize being included within the scope of the present disclosure.

In the case of positive-type image formation, the developer may be typically an acid or base aqueous solution. In some embodiments, the base aqueous solution may be used for obtaining a sharper image. To reduce contamination from the developer, a developer containing no metal element may be desirably used. Therefore, desired as the developer is a quaternary ammonium hydroxide composition, for example, tetraethylammonium hydroxide, tetrapropylammonium hydroxide, tetrabutylammonium hydroxide, or a combination thereof. Typically, particularly interesting quaternary ammonium hydroxides may be represented by a formula $R^4NOH$, wherein R=a methyl group, an ethyl group, a propyl group, a butyl group, or a combination thereof. The coating material described herein is typically a polymer resist, and may be developed with a developer the same as a commonly used developer at present, specifically tetramethylammonium hydroxide (TMAH). Commercial TMAH is available at 2.38 mass %, and this concentration may be used for the treatment described herein. Further, mixed tetraalkylammonium hydroxide may be used. The developer may contain the tetraalkylammonium hydroxide or a similar quaternary ammonium hydroxide at typically about 0.5 to about 30 mass %, about 1 to about 25 mass % in further embodiments, or about 1.25 to about 20 mass % in other embodiments. A person skilled in the art would consider an additional range of the developer concentration within the above clear range to recognize being included within the scope of the present disclosure.

In addition to the main developer composition, the developer may contain an additional composition to facilitate the development process. Examples of the appropriate additive include dissolved salts having: a cation selected from the group consisting of ammonium, d-block metal cation (such as hafnium, zirconium, and lanthanum), f-block metal cation (such as cerium and lutecium), p-block metal cation (such as aluminum and tin), alkali metal (such as lithium, sodium, and potassium), and a combination thereof; and an anion selected from the group consisting of fluorine, chlorine, bromine, iodine, nitrate, sulfate, phosphate, silicate, borate, peroxide, butoxide, formate, oxalate, ethylenediamine tetraacetate (EDTA), tungstate, molybdate, etc., and a combination thereof. Other examples of potentially useful additives include a molecular chelating agent, for example, a polyamine, an alcoholamine, an amino acid, a carboxylic acid, or a combination thereof. When the optionally selected additive is present, the developer may contain the additive at not greater than about 10 mass %, or the additive at not greater than about 5 mass % in further embodiments. A person skilled in the art would consider an additional range of the additive concentration within the above clear range to recognize being included within the scope of the present disclosure. The additive may be selected so as to improve the contrast, sensitivity, and line width roughness. The additive in the developer may inhibit formation and precipitation of the metal oxide particles.

In a case of a weaker developer, for example, an aqueous developer at a lower concentration or a diluted organic developer or composition (the coating having a lower development rate), development process at higher temperature may be used to increase the rate of the process. In a case of a stronger developing liquid, the temperature in the development process may be lowered in order to reduce the rate of the development and/or control dynamics of the development. The temperature for the development may be typically regulated among appropriate values corresponding to the volatility of the solvent. Further, a developer containing the dissolved coating film component near the developer-coating interface may be dispersed by an ultrasonic wave treatment during the development.

The developer may be applied to the coating film having the latent image by using any reasonable means. For example, the developer may be sprayed on the patterned coating material. In addition, spin-coating may be used. In the case of an automatic treatment, a puddle method including statically pouring the developer onto the coating material may be used. If desired, spin rinsing and/or drying may be used to complete the development process. Examples of an appropriate rinsing solution include ultrapure water, methyl alcohol, ethyl alcohol, propyl alcohol, and a combination thereof for the negative patterning, and include ultrapure water for the positive patterning. After the image is developed, the coating film is mounted on a substrate as the patterned coating film.

When the development step has been completed, the patterned coating film may be subjected to a thermal treatment in order to further condense the material, further dehydrate the material, increase the density, or remove the remained developer from the material. This thermal treatment may be particularly desirable for an embodiment of incorporating the oxide coating material into a final device, but when the coating film is desirably stabilized to facilitate further patterning, the thermal treatment may be desirably performed in some embodiments in which the coating film is used as the resist and finally removed. Particularly, baking of the patterned coating film may be performed under a condition such that the patterned coating film exhibits etching selectivity at a desired level. The patterned coating film may be heated to a temperature of about 100 to about 600° C. in some embodiments, about 175 to about 500° C. in further embodiments, or about 200 to about 400° C. in additional embodiments. The heating may be performed for at least about 1 minute, about 2 minutes to about 1 hour in other embodiments, or about 2.5 minutes to about 25 minutes in further embodiments. The heating may be performed in the air, in vacuo, or in an inert gas atmosphere such as Ar or $N_2$. A person skilled in the art would consider an additional range of the temperature and time for the thermal treatment within the above clear range to recognize being included within the scope of the present disclosure. Similarly, a non-thermal treatment including blanket UV exposure or exposure to oxidative plasma such as $O_2$ may be used for a similar purpose.

With a conventional organic resist, an excessively large aspect ratio (value of height divided by width) of the structure tends to collapse the pattern. The pattern collapse may be involved with mechanical instability of the structure with a high aspect ratio in which a force involved with the processing step, for example, a surface tension, changes a structural element. A structure with a low aspect ratio is more stable against a latent deformation force. When a precursor in a dry method and a resist solution in a wet method described herein is used, a structure having a thinner coating film may be effectively processed, and thereby improved patterning may be achieved without a patterned coating film with a high aspect ratio. Therefore, a feature with extremely high resolution has been formed without depending on a feature with a high aspect ratio in the patterned coating film.

The obtained structure may have a sharp edge and extremely low line width roughness. Particularly, the obtained structure enables ability to reduce line width roughness, and in addition, form high contrast, a small feature, and a space between features, and form a two-dimensional pattern (for example, a sharp corner) with extremely sufficiently resolved. Therefore, in some embodiments, adjacent linear portions of adjacent structure may have an average pitch (half pitch) of not greater than about 60 nm (30-nm half pitch), not greater than about 50 nm (25-nm half pitch) in some embodiments, or not greater than about 34 nm (17-nm half pitch) in further embodiments.

The pitch may be evaluated by design, and may be confirmed by scanning electron microscopy (SEM), for example, a top-down image. When used herein, the pitch refers to a spatial period of the repetitive structural element, namely a center distance, and the half-pitch is a half of the pitch, as commonly used in this technical field. The feature size of the pattern may also be represented by an average width of the feature typically evaluated at a place far from the corner, etc. The feature may refer to a gap between the material elements and/or the material element. The average width may be not greater than about 25 nm in some embodiments, not greater than about 20 nm in further embodiments, and not greater than about 15 nm in additional embodiments. The average line width roughness may be not greater than about 5 nm, not greater than about 4.5 nm in some embodiments, or about 2.5 to about 4 nm in further embodiments. The line width roughness is evaluated by analyzing the top-down SEM image to derive a 3σ-deviation from the average line width. The average includes roughness with both high frequency and low frequency, that is, each of a short correlation length and a long correlation length. The line width roughness of the organic resist is mainly featured by the long correlation length, but the organometal coating material of the present embodiment exhibits a remarkably short correlation length. In the pattern-transferring process, the short correlation length is smoothened during the etching process, which may generate extremely highly precise pattern. A person skilled in the art would consider an additional range of the pitch, the average width, and the line width roughness within the above clear range to recognize being included within the scope of the present disclosure.

<Further Processing of Patterned Coating Film>

After the patterned coating film is formed on the substrate, the substrate may be further processed to facilitate formation of a selected device. In addition, further adhesion, etching, and/or patterning of a material may be typically performed to complete the structure.

The patterned coating film may not be removed finally. The quality of the patterned coating film is desirably improved for forming an improved device (for example, a device having a smaller mounting area, etc.) in any cases.

Alternatively or additionally, adhesion of a further material according to the mask pattern may change properties of the structure on the lower side and/or provide contact with the structure on the lower side. The further coating material may be selected based on desired material properties. In addition, the density of the patterned inorganic coating material may provide high injection resistance, and thereby ions can be selectively injected into the structure on the lower side through an opening of the mask. In some embodiments, the material to further adhere may be a dielectric, a semiconductor, a conductor, or another appropriate material. The material to further adhere may adhere by using an appropriate means, for example, a solution-based procedure, chemical vapor deposition (CVD), sputtering, physical vapor deposition (PVD), or another appropriate means.

A plurality of additional layers may typically adhere. As for the adhesion of the plurality of the layers, additional patterning may be performed. If desired, any additional patterning may be performed by using the coating material described herein at an additional amount, a polymer-based resist, another patterning means, and a combination thereof.

As noted above, the patterned coating film may not be removed.

When the patterned coating film is not removed, the patterned coating film is incorporated into the structure. When an embodiment in which the patterned coating film is incorporated into the structure, the properties of the patterned coating film may be selected so as to provide not only the desired patterning properties but also the properties of the material in the structure.

When the patterned coating film is desirably removed, the patterned coating film functions as the conventional resist. The patterned coating film is used for patterning a material to adhere later before removal and/or for selectively etching the substrate via a space in the condensed coating material. The condensed coating material may be removed by using an appropriate etching process. Specifically, to remove the condensed coating material, dry etching is performed by using, for example, $BCl_3$ plasma, $Cl_2$ plasma, HBr plasma, Ar plasma, or plasma with another appropriate process gas. Alternatively or additionally, to remove the patterned coating material, wet etching using, for example, an acid or base aqueous solution, HF (aq), buffered HF (aq)/$NH_4F$, oxalic acid, etc. can be used.

The present resist material may be utilized for performing a multi-patterning. That is, this process may be applied for steps of multi-coating and the multi-patterning. As for the multi-patterning, a remarkable difference between the inorganic coating material described herein and the conventional organic resist is that the organic resist is still soluble in a conventional resist-casting solvent even after the heating baking. The resist material described herein may be cured by heating baking, and consequently becomes insoluble in an organic solvent. Thus, a coating layer etc. may be formed thereafter on the resist material.

EXAMPLES

Hereinafter, the present disclosure will be further specifically described with Examples, but the present disclosure is not limited to the following Examples unless departing from the sprit. Note that "parts" and "%" in the Examples mean mass basis unless otherwise mentioned.

As used raw materials, the following materials were used unless otherwise described.

Organic Solvent

Dehydrated hexane: n-hexane (dehydrated) (produced by KANTO CHEMICAL CO., INC.)

Monoalkyltin Compound (Precursor)

Each of tin compounds may be referred to as follows.

Tin compound corresponding to $RSnX_3$ (A1)

$iPrSn(NMe_2)_3$: isopropyltris(diethylamide)tin, $^{119}$Sn-NMR: −64 ppm . . . Compound (1)

Tin compound corresponding to $RSnX_2Y$ (B1)

$iPrSn(NMe_2)_2(NMeCH_2NMe_2)$: $^{119}$Sn-NMR: −82 ppm . . . Compound (4)

Tin Compounds (A2 and A3) being Impurities

Tin compound (A2): $iPr_2Sn(NMe_2)_2$: diisopropyl form, $^{119}$Sn-NMR: −18 ppm . . . Compound (2)

Tin compound (A3): $Sn(NMe_2)_4$: tetrakisamide form, $^{119}$Sn-NMR: −120 ppm . . . Compound (3)

Tin compounds other than Compounds (1) to (4): other impurities

<<Preparation and Analysis of Monoalkyltin Compound (Precursor)>>

The provided precursors were prepared to have compositions in the following Examples and Comparative Examples. The following Tables 1 and 2 each show detailed compositions such as functional groups in the obtained precursor.

Note that abbreviations of the functional group in Table 2 are as follows.

iPr: isopropyl group, molecular formula $C_3H_7$

OtAm: tertiary-amyloxy group

OiPr: isopropoxy group $NMe_2$: dimethylamino group

OMePen: 4-methyl-2-pentanoxy group

Precursor Containing Isopropyltris(Dimethylamide)Tin

Precursors L1A to L1E containing the monoalkyltin compound (A1) and/or (B1) were prepared according to a method described below, and the following Table 1 shows the analysis values.

Example 1-2

(Method for Producing Precursor L1B)

Prepared and used were a light-shielded 200-L reaction vessel made of glass (jacket with circulating water), a cooling condenser equipped with an internal coil, a stirring apparatus (stirring blade: twinstar, diameter: 350 mm, width: 110 mm, made of SUS coated with TEFLON®), and a 50-L dropping apparatus made of glass.

The pressure in the reaction apparatus was reduced to 3 kPa and then substituted with nitrogen, and this procedure was repeated three times. Hexane (36.6 kg, moisture: 21 ppm) and n-butyllithium [41.0 kg, 96.8 mol (3.09 eq), 15% hexane solution (containing hexane corresponding to 34.9 kg)] were added, and while stirring the mixture at 150 rpm [speed of blade tip (m/s): 3.14×0.35×150/60=2.74 (m/s)], dimethylamine (8.69 kg, 193.6 mol, 6.18 eq) was added dropwise over 1 h with keeping the temperature between −5 to 10° C. The obtained slurry of lithium dimethylamide was stirred at 23 to 27° C. for 1 h.

The temperature of the obtained slurry of lithium dimethylamide was regulated to −10° C., and a hexane solution containing isopropyltrichlorotin (8.40 kg, 31.3 mol, 1.00 eq) (4.20 kg as hexane amount) was added dropwise through the dropping apparatus made of glass over 2 h while keeping a temperature range (internal temperature: −10° C. to 0° C.). Thereafter, the dropping apparatus was rinsed with hexane (0.61 kg) to be added dropwise.

After the dropwise addition, the temperature was raised to 25° C. over 3 h, and then the mixture was stirred for 16 h. The obtained reaction liquid was filtered with a pressurized filtering apparatus to remove a white solid (LiCl), and a clear filtrate was obtained. The white solid was further washed with dehydrated hexane (7.3 kg×3) to be combined with the filtrate. The obtained reaction liquid was condensed under a reduced pressure. The obtained condensate liquid (10.3 kg) was fed into a light-shielded single-distillation apparatus made of glass under the nitrogen atmosphere. The condensed liquid was introduced into the distillation apparatus under a nitrogen-inert gas atmosphere, and single distillation was performed under a reduced pressure with heating to obtain a corresponding tin compound (1). The monoalkyltin composition obtained by this distillation was specified as the precursor LIB.

(Distillation Condition)

Distillation apparatus: single-distillation apparatus made of glass and wrapped with cloth for shielding light Distillation condition: internal temperature: 70 to 80° C., degree of pressure reduction: 0.3 kPa

Example 1-1

Precursor L1A: A monoalkyltin composition in which a monoalkyltin composition similar to the precursor L1B was fed into a flask equipped with a cooling condenser, and subjected to a reflux heating treatment under a nitrogen atmosphere at 100° C. for 18 h.

Example 1-2

Precursor L1B: A monoalkyltin composition described as "precursor L1B" above.

Comparative Example 1-1

Precursor L1C: A monoalkyltin composition in which a monoalkyltin composition similar to the precursor L1B was subjected to precise distillation purification with a distillation tower having 30 theoretical steps under a condition with a reflux ratio of 10. The compound (4), namely the tin compound corresponding to $RSnX_2Y$ (B1) was not detected.

Example 1-3

Precursor L1D: A monoalkyltin composition obtained by mixing the precursors L1A and L1C at a mass ratio of 50:50 under a nitrogen atmosphere.

Example 1-4

Precursor L1E: A monoalkyltin composition obtained by mixing the precursor L1B and $iPr_2Sn(NMe_2)_2$ (tin compound (2)) at a mass ratio of 90:10 under a nitrogen atmosphere.

TABLE 1

| | | Precursor composition | | | |
|---|---|---|---|---|---|
| | Precursor | −64 ppm $RSnX_3$(A1) Compound (1) | −18 ppm $R_2SnX_2$ Compound (2) | −120 ppm $SnX_4$ Compound (3) | −82 ppm $RSnX_2Y$(B1) Compound (4) |
| Example 1-1 | L1A | 79.06 | 1.82 | 0.70 | 13.05 |
| Example 1-2 | L1B | 99.24 | 0.24 | 0.00 | 0.49 |
| Comparative Example 1-1 | L1C | 99.00 | 0.00 | 0.80 | 0.00 |
| Example 1-3 | L1D | 89.03 | 0.91 | 0.75 | 6.53 |
| Example 1-4 | L1E | Described in text | | | |

According to the following method, precursors L2A to L2F containing the monoalkyltin compound (A1) and/or (B1) were prepared, and the following Table 2 shows the analysis values.

Comparative Example 2-1: Preparation of Precursor L2C (Precursor Containing Isopropyltris(t-Amyloxy)Tin: $iPrSn(OtAm)_3$)

A used apparatus was a two-necked 100-mL flask (light-shielded) equipped with a highly sealed magnetic stirring apparatus (stirring: bar-shaped stirrer tip, diameter: 15 mm, material: PTFE) and a cooling condenser (cooling water: 10° C.). The pressure was reduced to 3 kPa and then substituted with nitrogen, and this procedure was repeated three times. Hexane (5.0 mL, moisture: 10 ppm) and isopropyltris(dimethylamide)tin (5.0 g, 16.8 mmol, the precursor L1B) were added, the mixture was stirred at 1000 rpm, and the internal temperature was regulated to 20° C. with a temperature-regulated water bath. Thereafter, while stirring the mixture at 1000 rpm [speed of blade tip (m/s): 3.14×0.015×1000/60=0.785 (m/s)], t-amyl alcohol (produced by Merck KGaA, moisture: 15 ppm) (4.60 g, 52.1 mmol, 3.1 eq) at 22° C. was added with keeping the temperature within a range of 20 to 30° C. Thereafter, the mixture was heated to 50° C. and stirred for 3 h, and then the obtained reaction liquid was filtered with a filtering apparatus made of glass [filter: produced by Kiriyama Glass Works Co., filter paper 5B for Kiriyama funnel, diameter: 60 mm, the filtering apparatus was entirely light-shielded]over 5 minutes under nitrogen to obtain a clear filtrate. The obtained reaction liquid was subjected to solvent condensation under a reduced pressure (10 hPa, 40° C.) while stirring and light-shielding for condensation until no distillation was detected to obtain a condensate liquid of a synthesized tin compound containing isopropyltris(t-amyloxy)tin. The obtained condensate liquid was fed into a light-shielded glass container (brown glass container) under the nitrogen atmosphere. The obtained isopropyltris(t-amyloxy)tin after the reaction was identified by NMR. The purity measured by $^{119}$Sn-NMR was 99.3 mol %, and the compound corresponding to $RSnX_2Y$ (B1) was not detected. This was specified as "precursor L2C."

NMR Analysis Result of $iPrSn(OtAm)_3$ $^{119}$Sn-NMR (223.8 MHz; C6D6): δ−218 ppm.

$^{1}$H-NMR (400 MHz; C6D6):δ 1.5-1,6 (m, 7H, (iPr: 1H, tAm3: 6H)), 1.28 (s, 18H, tAm3), 1.22 (d, 6H, iPr), 0.94 (t, 9H, tAm3).

Example 2-1: Preparation of Precursor L2A (Precursor Containing $iPrSn(NMe_2)_2(OiPr)$)

A used apparatus was a two-necked 30-mL flask (light-shielded) equipped with a highly sealed magnetic stirring apparatus (stirring: bar-shaped stirrer tip, diameter: 10 mm, material: PTFE) and a cooling condenser (cooling water: 10° C.). The pressure was reduced to 3 kPa and then substituted with nitrogen, and this procedure was repeated three times. Hexane (1.5 mL, moisture: 10 ppm) and isopropyltris(dimethylamide)tin (1.75 g, 5.96 mmol, the precursor L1B) were added, the mixture was stirred at 1000 rpm, and the temperature was regulated to 0° C. Thereafter, while stirring the mixture at 1000 rpm, isopropyl alcohol (produced by KANTO CHEMICAL CO., INC., dehydrated grate) (17.9 mg, 0.30 mmol, 0.05 eq) at 22° C. was added with keeping the temperature within a range of 0 to 10° C. Thereafter, the mixture was stirred at 0° C. for 1 h, and then the obtained reaction liquid was filtered with a filtering apparatus made of glass [filter: produced by Kiriyama Glass Works Co., filter paper 5B for Kiriyama funnel, diameter: 60 mm, the filtering apparatus was entirely light-shielded]over 5 minutes under nitrogen to obtain a clear filtrate. The obtained reaction liquid was subjected to solvent condensation under a reduced pressure (10 hPa, 40° C.) while stirring and light-shielding for condensation until no distillation was detected to obtain a tin composition containing isopropylbis(dimethylamino)(isopropoxy)tin, ($iPrSn(NMe_2)_2(OiPr)$).

The obtained tin composition was fed into a light-shielded glass container (brown glass container) under the nitrogen atmosphere. The obtained tin composition was used to be identified by NMR. As a measurement result by $^{119}$Sn-NMR, a precursor containing 5 mol % of ($iPrSn(NMe_2)_2(OiPr)$) and 93 mol % of ($iPrSn(NMe_2)_3$) as monoalkyltin compounds was obtained. This was specified as "precursor L2A."

NMR Analysis Result of $iPrSn(NMe_2)_2(OiPr)$ $^{119}$Sn-NMR (223.8 MHz; C6D6): δ−105 ppm $^{1}$H-NMR (400 MHz; C6D6): δ 4.1 (m, 1H OiPr), 2.7 (s, 12H $NMe_2$), 1.6 (m, 1H iPr), 1.2 (m, 12H (OiPr: 6H iPr: 6H)).

Example 2-2: Preparation of Precursor L2B (Precursor Containing $iPrSn(OtAm)_2(NMe_2)$)

A used apparatus was a two-necked 30-mL flask (light-shielded) equipped with a highly sealed magnetic stirring apparatus (stirring: bar-shaped stirrer tip, diameter: 10 mm, material: PTFE) and a cooling condenser (cooling water: 10° C.). The pressure was reduced to 3 kPa and then substituted with nitrogen, and this procedure was repeated three times. Hexane (1.5 mL, moisture: 10 ppm) and isopropyltris(dimethylamide)tin (1.75 g, 5.96 mmol, the precursor L1B) were added, the mixture was stirred at 1000 rpm, and the temperature was regulated to 0° C. Thereafter, while stirring the mixture at 1000 rpm, t-amyl alcohol (produced by Merck KGaA, moisture: 15 ppm) (1.05 g, 11.9 mmol, 2.0 eq) at 22° C. was added with keeping the temperature within a range of 0 to 10° C. Thereafter, the mixture was heated to 20° C. and stirred for 1 h, and then the obtained reaction liquid was filtered with a filtering apparatus made of glass [filter: produced by Kiriyama Glass Works Co., filter paper 5B for Kiriyama funnel, diameter: 60 mm, the filtering apparatus was entirely light-shielded]over 5 minutes under nitrogen to obtain a clear filtrate. The obtained reaction liquid was subjected to solvent condensation under a reduced pressure (10 hPa, 40° C.) while stirring and light-shielding for condensation until no distillation was detected to obtain a tin composition containing isopropylbis(t-amyloxy)(dimethylamino)tin ($iPrSn(OtAm)_2(NMe_2)$). The obtained composition was fed into a light-shielded glass container (brown glass container) under the nitrogen atmosphere. The obtained tin composition was used for identification by NMR. As a measurement result by $^{119}$Sn-NMR, a precursor containing 77 mol % of $iPrSn(OtAm)_2(NMe_2)$, 12 mol % of $iPrSn(OtAm)_3$, and 9 mol % of $iPrSn(OtAm)(NMe_2)_2$ as monoalkyltin compounds was obtained. This was specified as "precursor L2B."

NMR Analysis Result of $iPrSn(OtAm)_2(NMe_2)$ $^{119}$Sn-NMR (223.8 MHz; C6D6):δ−165 ppm $^{1}$H-NMR (400 MHz; C6D6):δ 2.7(s, 6H $NMe_2$), 1.4-1,6 (m, 5H (iPr: 1H, tAm2: 4H)), 1.3 (d, 6H, iPr), 1.2 (s, 12H tAm2)), 0.9 (t, 6H tAm2))

NMR Analysis Result of $iPrSn(OtAm)(NMe_2)$ 2

$^{119}$Sn-NMR (223.8 MHz; C6D6):δ−111 ppm $^{1}$H-NMR (400 MHz; C6D6):δ 2.7 (s, 12H $NMe_2$), 1.4-1.6 (m, 3H (iPr: 1H, tAm: 2H)), 1.3 (d, 6H, iPr), 1.2 (s, 6H tAm)), 0.9 (t, 3H tAm))

Example 2-3: Preparation of Precursor L2D (Precursor Containing Isopropylbis(t-Amyloxy)(4-Methyl-2-Pentanoxy)Tin: $iPrSn(OtAm)_2(OMePen)$)

A used apparatus was a two-necked 30-mL flask (light-shielded) equipped with a highly sealed magnetic stirring apparatus (stirring: bar-shaped stirrer tip, diameter: 10 mm, material: PTFE) and a cooling condenser (cooling water: 10° C.). The pressure was reduced to 3 kPa and then substituted with nitrogen, and this procedure was repeated three times. Hexane (1.5 mL, moisture: 10 ppm) and isopropyltris(dimethylamide)tin (1.75 g, 5.96 mmol, the precursor L1B) were added, the mixture was stirred at 1000 rpm, and the temperature was regulated to 0° C. Thereafter, while stirring the mixture at 1000 rpm, t-amyl alcohol (produced by Merck KGaA, moisture: 15 ppm) (1.05 g, 11.9 mmol, 2.0 eq) at 22° C. was added with keeping the temperature within a range of 0 to 10° C. Thereafter, the mixture was heated to 20° C. and stirred for 1 h, then 4-methyl-2-pentanol (produced by Tokyo Chemical Industry Co., Ltd., referred to as "MePenOH") (0.61 g, 5.96 mmol, 1.0 eq) was added with keeping the temperature within 20 to 25° C., then the mixture was heated to 50° C. and stirred for 2 h, and then the obtained reaction liquid was filtered with a filtering apparatus made of glass [filter: produced by Kiriyama Glass Works Co., filter paper 5B for Kiriyama funnel, diameter: 60 mm, the filtering apparatus was entirely light-shielded]over 5 minutes under nitrogen to obtain a clear filtrate. The obtained reaction liquid was subjected to solvent condensation under a reduced pressure (10 hPa, 40° C.) while stirring and light-shielding for condensation until no distillation was detected to obtain a condensate liquid of a synthesized tin compound containing isopropyltris(t-amyloxy)tin. The obtained condensate liquid was fed into a light-shielded glass container (brown glass container) under the nitrogen atmosphere. The obtained tin composition after the reaction was used for identification by NMR. As a measurement result by $^{119}$Sn-NMR, the composition contained 71 mol % of isopropylbis (t-amyloxy)(4-methyl-2-pentanoxy)tin and 18 mol % of $iPrSn(OtAm)_3$ as the monoalkyltin compounds. This was specified as "precursor L2D."

NMR Analysis Result of $iPrSn(OtAm)_2(OMePen)$ $^{119}$Sn-NMR (223.8 MHz; C6D6): δ−215 ppm $^1$H-NMR (400 MHz; C6D6): δ 4.1 (Br, 1H), 1.7(m, 2H MePen) 1.5-1.6 (m, 6H (iPr: 1H, tAm2: 4H, MePen: 1H)), 1.3 (d, 6H, iPr), 1.2 (m, 15H (3H: MePen 12H: tAm2)), 0.9 (m, 12H (6H: MePen 6H: tAm2))

Example 2-4: Preparation of Precursor L2E

A precursor L2E was obtained by mixing the precursors L2C and L2B at a mass ratio of 90:10 in a liquid state under a nitrogen atmosphere.

Example 2-5: Preparation of Precursor L2F

A precursor L2F was obtained by mixing the precursors L2C and L2D at a mass ratio of 90:10 in a liquid state under a nitrogen atmosphere.

TABLE 2

| | | | | | RSnX3(A1) | | RSnX2Y(B1) | |
|---|---|---|---|---|---|---|---|---|
| | Precursor | Substituent R | Substituent X | Substituent Y | A1 Structure | A1 Purity (mol %) | B1 Structure | B1 Purity (mol %) |
| Example 2-1 | L2A | iPr | NMe2 | OiPr | $iPrSn(NMe_2)_3$ | 93 | $iPrSn(NMe_2)_2$ (OiPr) | 5 |
| Example 2-2 | L2B | iPr | OtAm | NMe2 | $iPrSn(OtAm)_3$ | 12 | $iPrSn(OtAm)_2$ $(NMe_2)$ | 77 |
| Comparative Example 2-1 | L2C | iPr | OtAm | — | $iPrSn(OtAm)_3$ | 99.3 | Not detected | — |
| Example 2-3 | L2D | iPr | OtAm | OMePen | $iPrSn(OtAm)_3$ | 18 | $iPrSn(OtAm)_2$ (OMePen) | 71 |
| Example 2-4 | L2E | iPr | OtAm | NMe2 | $iPrSn(OtAm)_3$ | 86 | $iPrSn(OtAm)_2$ $(NMe_2)$ | 5 |
| Example 2-5 | L2F | iPr | OtAm | OMePen | $iPrSn(OtAm)_3$ | 91 | $iPrSn(OtAm)_2$ (OMePen) | 6 |

<<Preparation of Tin Hydrolysate with Hydrolysis and Analysis>>

Example 3-1: Tin Hydrolysate H1A

Under an inert gas atmosphere and a light-shielded condition, 1.0 g of the precursor L1A (3.4 mmol, calculated value as $iPrSn(NMe_2)_3$) was added into 10 mL of dehydrated hexane by using an air-tight syringe. The obtained liquid was cooled with an ice bath, and while stirring the liquid at 200 rpm, desalted water (18.2 MΩ) (1.0 mL) was added over 3 minutes with keeping the temperature within 0 to 10° C. As a result, a slurry of white solid was formed. This slurry was further stirred for 10 minutes with keeping the temperature within 0 to 10° C. Thereafter, the slurry was filtered with filter paper (filter paper 5B for Kiriyama funnel) to obtain a white solid. The solid was rinsed twice with desalted water (18.2 MΩ) (3.0 mL), and recovered into a 20-mL glass vial. The glass vial was dried in vacuo at 40° C. for 8 h to obtain a white solid tin hydrolysate H1A.

The obtained tin hydrolysate was used, and the composition and crystallinity of the tin hydrolysate were analyzed with the following measurement device under the following condition. In $^{119}$Sn-NMR, a total of peak integration values of pentavalent Sn (−250 to −350 ppm) was specified as k1, a total of peak integration values of hexavalent Sn (−450 to −600 ppm) was specified as k2, and a total value of all peak integration values within a range of 1000 to −1000 ppm detected with $^{119}$Sn-NMR (including k1 and k2) was specified as k3. A ratio relative to k3 [(k1+k2)/(k3)] was calculated.

Analyzers and Methods

- NMR analyzer: produced by Bruker, Avance Neo, 600 MHz, probe: cryo 5 mm BBO
- ESI-MS analyzer: produced by Waters, Xevo G2-XS Qtof, measurement mode: ESI positive, solvent: acetonitrile
- XRD analyzer: produced by PANalytical, X'Pert Pro MPD, X-ray source, CuKα concentration method optics, scanning range: 3 to 50°, half-value width analysis method: profile-fitting method (Pearson-VII function, pseudo-Voigt function). The peaks were separated in the scanning range to calculate a half-value width of each peak. Among these, described were a diffraction angle 2θ (°) of a peak top with the strongest intensity in the scanning range and a half-value width of the peak. A number of peak tops in the range where the diffraction peak 2θ (°) was 5.00 to 15.000 was also described.

Example 3-1 to Example 3-4 and Comparative Example 3-1

Tin hydrolysates H1B to H1E described below were obtained by performing the same manner as of Example 3-1 except that the precursor in Example 3-1 was changed to the precursors L1B to LIE as in the following Table 3 (the precursor amount was unified to 1.0 g, and the other reagent was used at the same amount). The composition and crystallinity of the obtained tin hydrolysates were analyzed, and shown in the following Table 3. As a result of XRD analysis of the tin hydrolysate H1A of Example 3-1, FIG. 1 shows an XRD chart of H1A. As a result of XRD analysis of the hydrolysate H1C of Comparative Example 3-1, FIG. 2 shows an XRD chart of H1C.

TABLE 3

| | | XRD | | | NMR | | | |
|---|---|---|---|---|---|---|---|---|
| | Tin composition (H1) | Diffraction angle 2θ of top of strongest intensity peak (°) | Peak half-value width (°) | Number of peak tops (–) | Total (k1) of peak integration values of pentavalent Sn (iPrSnO4) (−250 to −350 ppm) −337ppm | Total (k2) of peak integration values of a hexavalent Sn (iPrSnO5) (−450 to −600 ppm) −513ppm | Another peak Another peak within −1000 to 1000 ppm | [(k1 + k2)/(k3)] |
| Example 3-1 | H1A | 7.79 | 1.66 | 1 | 0.92 | 1.00 | Undetected | 1.00 |
| Example 3-2 | H1B | 7.81 | 1.37 | 1 | 1.06 | 1.00 | Undetected | 1.00 |
| Comparative Example 3-1 | H1C | 7.87 | 0.83 | 3 | 1.04 | 1.00 | Undetected | 1.00 |
| Example 3-3 | H1D | 7.81 | 1.45 | 1 | 1.02 | 1.00 | Undetected | 1.00 |
| Example 3-4 | H1E | 7.85 | 1.15 | 1 | 1.08 | 1.00 | 0.18 | 0.92 |

Analysis Result of Tin Hydrolysate H1A (R=isopropyl, chemical formula: $C_3H_7$)

As a result of $^{119}$Sn-NMR measurement of the tin hydrolysate H1A, Sn NMR (MeOD): peaks at 1:1 were observed with pentavalent ($RSnO_4$): −337 ppm and hexavalent ($RSnO_5$): −513 ppm as shown in Table 3. This correlates to the NMR results of tin dodecamer cluster $(nBuSn)_{12}O_{14}(OH)_6$ reported in Organometallics 19, 2000, 1940-1949. That is, the compound corresponding to a composition formula $RSnO_{(3/2-x/2)}(OH)_x$ was obtained. In addition, corresponding peaks with detectable intensity other than k1 and k2 were absent, and thereby the value of (k1+k2)/(k3) indicating the purity was not less than 0.99. As an analysis result of the tin hydrolysate H1A, FIG. 3A shows a broad chart of $^{119}$Sn-NMR, FIG. 3B shows a detail chart of $^{119}$Sn-NMR, and FIG. 3C shows a detail chart of $^1$H-NMR.

As a result of analysis by electro-spraying ionization mass spectrometry (ESI-MS) of the tin hydrolysate H1A, FIG. 3D shows a chart of ESI-MS of H1A. In this chart, observed were peaks corresponding to a divalent ion equivalent for the composition formula $RSnO_{(3/2-x/2)}$ (specifically, a chemical formula $[(C_3H_7Sn)_{12}O_{14}(OH)_6]^{+2}$, calculated value m/z=about 1134), monovalent ion (m/z=about 2268), and their adducts of potassium etc. (equivalent for m/z+40).

Analysis Results of Tin Hydrolysates H1B to H1E

As for the tin hydrolysates H1B to H1D, the results similar to the tin hydrolysate H1A were obtained on NMR and ESI-mass measurement, and equivalent chemical formula and purity were obtained. As for the tin hydrolysate H1E, observed was an impurity corresponding to $R_2SnO_2$ (structure of hydrolyzed dialkyl-form impurity) near −200 to −240 ppm of Sn-NMR.

Example 4-1 to Example 4-5 and Comparative Example 4-1

Tin hydrolysates H2A to $H_2F$ were obtained by the following method with changing the precursor to the precursor L2A to L2F, and the obtained tin hydrolysates were analyzed. Table 4 shows the results.

Example 4-1

Under an inert gas atmosphere and a light-shielded condition, 1.0 g of the precursor L2A (3.4 mmol, calculated value as $iPrSn(NMe_2)_3$) was added into 10 mL of dehydrated hexane by using an air-tight syringe. The obtained liquid was cooled with an ice bath, and while stirring the liquid at 200 rpm, desalted water (18.2 MΩ) (1.0 mL) was added over 3 minutes with keeping the temperature within 0 to 10° C. As a result, a slurry of white solid was formed. This slurry was further stirred for 10 minutes with keeping the temperature within 0 to 10° C. Thereafter, the slurry was filtered with filter paper (filter paper 5B for Kiriyama funnel) to obtain a white solid. The solid was rinsed twice with desalted water (18.2 MΩ) (3.0 mL), and recovered into a 20-mL glass vial. The glass vial was dried in vacuo at 40° C. for 8 h to obtain a white solid tin hydrolysate H2A.

Example 4-2

Under an inert gas atmosphere and a light-shielded condition, 2.0 g of the precursor L2B (4.7 mmol, calculated value as $iPrSn(OtAm)_3$) was added into 20 mL of dehydrated hexane by using an air-tight syringe. The obtained liquid was cooled with an ice bath, and while stirring the liquid at 200 rpm, desalted water (18.2 MΩ) (2.0 mL) was added over 3 minutes with keeping the temperature within 0 to 10° C. This mixture was further stirred for 10 minutes with keeping the temperature within 0 to 10° C., then heated to 50° C. over 1 hour, and stirred at 50° C. for 1 hour. The obtained mixed liquid was subjected to pressure reduction to 3 kPa in a warm bath at 50° C. while rotation at 100 rpm with an evaporator to remove the solvent and obtain a white solid. The obtained solid was dispersed in 20 mL of hexane to obtain a slurry, and this slurry was filtered with filter paper (filter paper 5B for Kiriyama funnel) to obtain a white solid. The solid was rinsed twice with desalted water (18.2 MΩ) (3.0 mL), and recovered into a 20-mL glass vial. The glass vial was dried in vacuo at 40° C. for 8 h to obtain a white solid tin hydrolysate H2B.

Comparative Example 4-1

A white solid tin hydrolysate H2C was obtained in the same manner as in Example 4-2 by changing the precursor to the precursor L2C.

Example 4-3 to Example 4-5

White solid tin hydrolysates H2D to F were obtained in the same manner as in Example 4-2 by changing the precursor to the precursors L2D to F.

TABLE 4

| | Tin composition (P1) | NMR Pentavalent ($iPrSnO_4$) −337 ppm | Hexavalent ($iPrSnO_5$) −513 ppm | Another peak |
|---|---|---|---|---|
| Example 4-1 | H2A | 1.01 | 1.00 | Undetected |
| Example 4-2 | H2B | 1.06 | 1.00 | Undetected |
| Comparative Example 4-1 | H2C | 1.02 | 1.00 | Undetected |
| Example 4-3 | H2D | 1.12 | 1.00 | Undetected |
| Example 4-4 | H2E | 1.08 | 1.00 | Undetected |
| Example 4-5 | H2F | 1.06 | 1.00 | Undetected |

Analysis Results of Tin Hydrolysates H2A to H2F (R=isopropyl, chemical formula: $C_3H_7$)

As a result of $^{119}$Sn-NMR measurement of the tin hydrolysates H2A to $H_2F$, SnNMR (MeOD) peaks at 1:1 were observed with pentavalent ($RSnO_4$): −337 ppm and hexavalent ($RSnO_5$): −513 ppm as shown in Table 3. In addition, corresponding peaks other than k1 and k2 were absent, and thereby the value of (k1+k2)/(k3) indicating the purity was not less than 0.99. That is, as for the tin hydrolysates H2A to $H_2F$, the precursors having hydrolysable groups X and Y with various structures were used, but equivalent chemical formula and purity as of the tin hydrolysate H1A were obtained.

<<Solubility, Filterability, and Storage Stability of Resist Solution>>

The obtained tin hydrolysate was used for producing a solution (resist solution) with a resist solvent by the following method. The obtained resist solution was subjected to a dissolution test, a filtration test, and a storage stability test to be evaluated based on the following evaluation criteria.

Example 5-1 to Example 5-4 and Comparative Example 5-1

Specifically, each of the tin hydrolysates H1A to H1E (0.100 g) used in Example 3-1 to Example 3-4 and Comparative Example 3-1, and 4-methyl-2-pentanol (4.90 g) were weighed in a 20-mL transparent vial made of glass to prepare a resist solution. The vial containing this resist solution was put in an ultrasonic wave generator filled with water at room temperature (23° C.), and irradiated with ultrasonic wave for 5 minutes to perform dissolution operation.

(Method for Evaluating Solubility)

The solubility of the tin hydrolysate is evaluated by comparing turbidity (transparency) when the tin hydrolysate is dissolved in the resist solvent at a certain concentration. The specific method, which is disclosed in JP-A-2019-500490, is as follows: preparing 5.0 g of a mixed liquid of the tin hydrolysate in 4-methyl-2-pentanol equivalent to 2.0%, and visually observing turbidity (transparency) of this liquid while comparison with a standard turbidity liquid to evaluate the solubility of the corresponding present tin hydrolysate. As the standard turbidity liquid, a kaoline-turbidity standard liquid described in JIS K0110 (0 degrees (transparent), 50 degrees, 100 degrees, 500 degrees, or 1000 degrees (white turbid)) is used, and a turbidity close to each of the standard turbidity liquids is evaluated based on the following evaluation criteria 1 to 5 as follows.

(Evaluation Criteria)

Turbidity evaluation 1: 0 degrees (transparent)
Turbidity evaluation 2: 50 degrees
Turbidity evaluation 3: 100 degrees
Turbidity evaluation 4: 500 degrees
Turbidity evaluation 5: 1000 degrees (white turbid)

Method for Evaluating Filterability

The filterability of the tin hydrolysate is evaluated by using a liquid in which the tin hydrolysate is dissolved in the resist solvent at a certain concentration, and by comparing degree of clogging of a filter.

The specific method, which is disclosed in JP-A-2019-500490, is as follows: preparing 5.0 g of a mixed liquid of the tin hydrolysate in 4-methyl-2-pentanol equivalent to 2.0%, and evaluating degree of clogging in filtering this liquid based on the following evaluation criteria.

As a specific procedure, 5.0 g of the mixed liquid was filtered with 10-mL syringe and a filter having a pore diameter of 0.2 m while pressurizing (about 300 kPa) for evaluation.

(Used filter: 0.2 μm, made of PTFE, effective filtering area: 4.0 $cm^2$, produced by ADVANTEC CO., LTD, disposable membrane filter unit DISMIC 25HP045AN) (Evaluation Criteria)

Filterable at 5.0 g without clogging: "1"
Filterable at not less than 2.0 g but clogged: "2"
Clogged at not greater than 2.0 g: "3"

Method for Evaluating Storage Stability

The resist liquid after the filtration in the method for filterability test was introduced into a brown glass vial (20 mL) in the air, and a lid of the vial was closed. In this state, the vial was stored at 20° C. under a light-shielded condition for one month. After the storage, the resist liquid was transferred into a transparent vial, and the evaluation was performed in the same manner as the solubility evaluation to determine the storage stability.

TABLE 5

| | Solubility Cloudiness of solution | Filterability | Cloudiness of solution (after storage at 20° C. for one month) |
|---|---|---|---|
| Example 5-1 | 1 | 1 | 1 |
| Example 5-2 | 2 | 2 | 1 |
| Comparative Example 5-1 | 4 | 3 | 1 |
| Example 5-3 | 1 | 1 | 1 |
| Example 5-4 | 2 | 2 | 1 |

That is, from Table 3 and Table 5, it has been understood that the tin hydrolysates, obtained with the precursor containing the appropriate amount of $RSnX_2Y$ (B1) as the raw material, described in Example 5-1 to Example 5-4 exhibit high purity, low crystallinity, high solubility, and high storage stability.

Examples 6-1 to 6-5 and Comparative Example 6-1

By using the same manner as in Example 5-1, 5.0 g of mixed liquids of the tin hydrolysate H2A to $H_2F$ in 4-methyl-2-pentanol equivalent to 2.0% were prepared. By using the obtained mixed liquid, the solubility, the filterability, and the storage stability were evaluated in the same manner as in Example 5-1. Table 6 shows the obtained results.

TABLE 6

| | Solubility 2% solution | | |
|---|---|---|---|
| | Cloudiness of solution | Filterability | Cloudiness of solution (after storage at 20° C. for one month) |
| Example 6-1 | 1 | 1 | 1 |
| Example 6-2 | 1 | 1 | 1 |
| Comparative Example 6-1 | 2 | 3 | 2 |
| Example 6-3 | 1 | 1 | 1 |
| Example 6-4 | 1 | 1 | 1 |
| Example 6-5 | 1 | 1 | 1 |

That is, from Table 4 and Table 6, it has been understood that the tin hydrolysates, obtained with the precursor containing an appropriate amount of $RSnX_2Y$ (B1) as the raw material, described in Example 6-1 to Example 6-5 exhibited high purity, high solubility, and high storage stability.

<<Production of Patterned Thin Film>>

Example 7

The obtained tin hydrolysate H1A of Example 3-1 was dissolved in 4-methyl-2-pentanol (5 mL) so that the concentration was 2.0% while using ultrasonic wave, and the obtained solution was filtered with a 0.2-μm syringe filter to obtain a transparent resist solution containing the tin hydrolysate.

A silicon wafer (S1 substrate, 100 mm in diameter) having an oxide surface was ozone-treated to be used as a substrate for adhering a resist thin film. Before adhesion of the resist, the surface of the S1 substrate was treated with hexamethyldisilazane (HMDS) vapor. The resist solution was applied on the substrate by spin-coating at 2000 rpm, and baked on a hotplate at 90° C. for 2 minutes. The film thickness after the coating and baking was measured to be about 22 nm with an ellipsometer. The coated substrate was exposed to ultraviolet ray (light source: xenon excimer lamp (172 nm, 7.2 eV), produced by Ushio Inc., light source intensity: 0.7 $mW/cm^2$) by using a pattern, and the pattern was projected onto the substrate. Then, the substrate was immersed in 2-heptanone for 15 seconds, and further rinsed with the same developer for 15 seconds to form a negative-type image, namely an image in which the non-exposed portion was removed and only the pattern-exposed portion was remained in the thin film.

The obtained patterned thin film had high sensitivity and low LWR (roughness), and was an excellent resist material.

The specific embodiments of the present disclosure have been described in the above Examples, but the Examples are merely examples, and not limitedly interpreted. It is anticipated that various modifications obvious to a person skilled in the art are within the scope of the present disclosure.

The invention claimed is:

1. A tin compound, comprising:

a tin atom;

at least one organic group R bonded to the tin atom; and at least one of an oxo-ligand and a hydroxo-ligand bonded to the tin atom, wherein the tin compound has a diffraction angle 2θ (*) of a peak with a strongest intensity between 5.00 to 15.00° in an X-ray diffraction measurement, wherein the strongest intensity peak has a half-value width of 1.00 to 4.00°, and wherein the organic group R has 1 to 30 carbon atoms.

2. The tin compound according to claim 1, wherein the tin compound is represented by a formula $RSnO_{(3/2-X/2)}(OH)_X$, wherein $0 \leq x \leq 3$.

3. The tin compound according to claim 1, wherein the tin compound is a compound comprising a cation represented by a formula $(RSn)_{12}O_{14}(OH)_6^{+2}$.

4. The tin compound according to claim 1, wherein the tin compound has a ratio [(k1+k2)/(k3)] of not less than 0.9, wherein the ratio is a total value (k1+k2) in $^{119}$Sn-NMR of a total (k1) of peak integration values of a pentavalent Sn (−250 to −350 ppm) and a total (k2) of peak integration values of a hexavalent Sn (−450 to −600 ppm) relative to a total value (k3) of all peak integration values (including k1 and k2) within a range of 1000 to −1000 ppm detected from the $^{119}$Sn-NMR.

5. The tin compound according to claim 4, wherein the value of [(k1+k2)/(k3)] is not less than 0.95.

6. The tin compound according to claim 1, wherein the tin compound has a ratio (k1/k2) of 0.5 to 2.5, wherein the ratio is a total (k1) of peak integration values of a pentavalent Sn (−250 to −350 ppm) relative to a total (k2) of peak integration values of a hexavalent Sn (−450 to −600 ppm) in $^{119}$Sn-NMR.

7. The tin compound according to claim 1, wherein the half-value width of the strongest intensity peak is 1.43 to 4.00°.

8. The tin compound according to claim 1, wherein the organic group R has 3 to 10 carbon atoms.

9. The tin compound according to claim 1, wherein the organic group R is a hydrocarbon group.

10. The tin compound according to claim 1, wherein the organic group R is a hydrocarbon group, and not less than 50 mol % of substituents constituting the hydrocarbon group is a secondary hydrocarbon group $R^2$.

11. A resist solution, comprising:

the tin compound according to claim 1; and an organic solvent.

12. A patterning method, comprising:

a step of applying the resist solution of claim 11 onto a substrate;

a step of exposing a thin film comprising the tin compound to radiation; and a step of developing the thin film by using a developer liquid.

13. A thin film on a substrate, the thin film comprising the tin compound according to claim 1.

14. A patterned thin film on a substrate, the patterned thin film comprising the tin compound according to claim 1.

15. A method for producing the tin compound according to claim 1, the method comprising step 1 and step 2, <step 1> using a monoalkyl tin composition as a raw material;

wherein the monoalkyltin composition comprises:

a monoalkyltin compound $RSnX_3$ (A1) at 50 mol % to 99.99 mol %; and a monoalkyltin compound $RSnX_2Y$ (B1) at not less than 0.01 mol % and less than 50 mol %, wherein X and Y each represent a hydrolysable group with different chemical formulae, X is selected from OR', $NR'_2$, and C≡CR', Y is selected from $OR'^Y$,

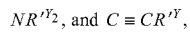

and $C≡CR'^Y$,

R' and $R'^Y$ each represent an organic group having 1 to 10 carbon atoms, in at least one of a case when X is $NR'_2$ and a case when Y is the

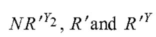

R' and $R'^Y$ may be independently same as or different from each other, and when a plurality of R' and $R'^Y$ are present in a molecule, the plurality of R' and $R'^Y$ may have a structure different from each other and may be bonded to each other to form a cyclic structure, and ≤step 2> contacting the raw material with at least one of water and water vapor.

16. The method for producing a tin compound according to claim 15, wherein, in the step 2, a blend of the raw material and an organic solvent is contacted with liquid water.

17. The method for producing a tin compound according to claim 15, wherein, in the step 2, not less than 100 parts by mass of an organic solvent is blended relative to 100 parts by mass of the raw material to prepare a composition.

18. The method for producing a tin compound according to claim 15, wherein the half-value width of the strongest intensity peak is 1.43 to 4.00°.

19. The tin compound according to claim 1, wherein in the diffraction angle 2θ (°), a number of peak tops detected within a range of 5.00° to 15.00° is not greater than two.

20. The tin compound according to claim 1, wherein in the diffraction angle 2θ (°), a number of peak tops detected within a range of 5.00° to 15.00° is one.

* * * * *